(12) United States Patent
Miyakoshi

(10) Patent No.: US 9,287,393 B2
(45) Date of Patent: Mar. 15, 2016

(54) SEMICONDUCTOR DEVICE

(71) Applicant: SHINDENGEN ELECTRIC MANUFACTURING CO., LTD., Chiyoda-ku, Tokyo (JP)

(72) Inventor: Nobuki Miyakoshi, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 14/647,818

(22) PCT Filed: Mar. 31, 2014

(86) PCT No.: PCT/JP2014/059599
§ 371 (c)(1),
(2) Date: May 27, 2015

(87) PCT Pub. No.: WO2014/163060
PCT Pub. Date: Oct. 9, 2014

(65) Prior Publication Data
US 2015/0349114 A1    Dec. 3, 2015

(30) Foreign Application Priority Data

Mar. 31, 2013   (WO) .................. PCT/JP2013/059785

(51) Int. Cl.
*H01L 29/78* (2006.01)
*H01L 29/06* (2006.01)
(Continued)

(52) U.S. Cl.
CPC ........ *H01L 29/7802* (2013.01); *H01L 29/0619* (2013.01); *H01L 29/0634* (2013.01);
(Continued)

(58) Field of Classification Search
CPC ... H01L 29/06; H01L 29/78; H01L 29/42372; H01L 29/42376; H01L 29/66712; H01L 29/7803; H01L 29/7811; H01L 29/7813; H01L 29/0619; H01L 29/0696; H01L 29/7802; H01L 29/7395; H01L 29/086; H01L 29/408; H01L 29/0634; H01L 29/4238
USPC .................................................. 257/330, 329
See application file for complete search history.

(56) References Cited

U.S. PATENT DOCUMENTS

| | | | |
|---|---|---|---|
| 5,298,770 A | 3/1994 | Im | |
| 2007/0069323 A1* | 3/2007 | Kunori | ................ H01L 29/0634 257/490 |

(Continued)

FOREIGN PATENT DOCUMENTS

| | | | |
|---|---|---|---|
| JP | 5-167070 A | 7/1993 | |
| JP | 5-218438 A | 8/1993 | |

(Continued)

OTHER PUBLICATIONS

International Search Report mailed Jul. 8, 2014 in International Application No. PCT/JP2014/059599.

*Primary Examiner* — Walter H Swanson
(74) *Attorney, Agent, or Firm* — Hauptman Ham, LLP

(57) ABSTRACT

In a semiconductor device provided with a MOSFET part and a gate pad part, the gate pad part includes: a low resistance semiconductor layer; a drift layer; a poly-silicon layer constituting a conductor layer and a gate pad electrode formed above the drift layer over the whole area of the gate pad part with a field insulation layer interposed therebetween; and a gate oscillation suppressing structure, wherein the gate oscillation suppressing structure includes a $p^+$-type diffusion region which is disposed along an outer peripheral portion of the gate pad part and is electrically connected with the a source electrode layer, and a $p^+$-type diffusion region in a floating state and the p-type impurity non-diffusion regions which are alternately formed in the region surrounded by the $p^+$-type diffusion region.

18 Claims, 27 Drawing Sheets

(51) Int. Cl.
*H01L 29/739* (2006.01)
*H01L 29/10* (2006.01)
*H01L 29/08* (2006.01)
*H01L 29/40* (2006.01)
*H01L 29/423* (2006.01)
*H01L 29/66* (2006.01)

(52) U.S. Cl.
CPC .......... *H01L29/0696* (2013.01); *H01L 29/086* (2013.01); *H01L 29/408* (2013.01); *H01L 29/4238* (2013.01); *H01L 29/42372* (2013.01); *H01L 29/42376* (2013.01); *H01L 29/66712* (2013.01); *H01L 29/7395* (2013.01); *H01L 29/7803* (2013.01); *H01L 29/7811* (2013.01); *H01L 29/7813* (2013.01); *H01L 29/0878* (2013.01); *H01L 29/1095* (2013.01); *H01L 29/402* (2013.01); *H01L 29/7397* (2013.01)

(56) References Cited

U.S. PATENT DOCUMENTS

2011/0241068 A1 10/2011 Watanabe et al.
2014/0131792 A1* 5/2014 Siemieniec ......... H01L 29/7802
                                                          257/330

FOREIGN PATENT DOCUMENTS

| JP | 2005-150348 A | 6/2005 |
| JP | 2011-228643 A | 11/2011 |

* cited by examiner

FIG.32A

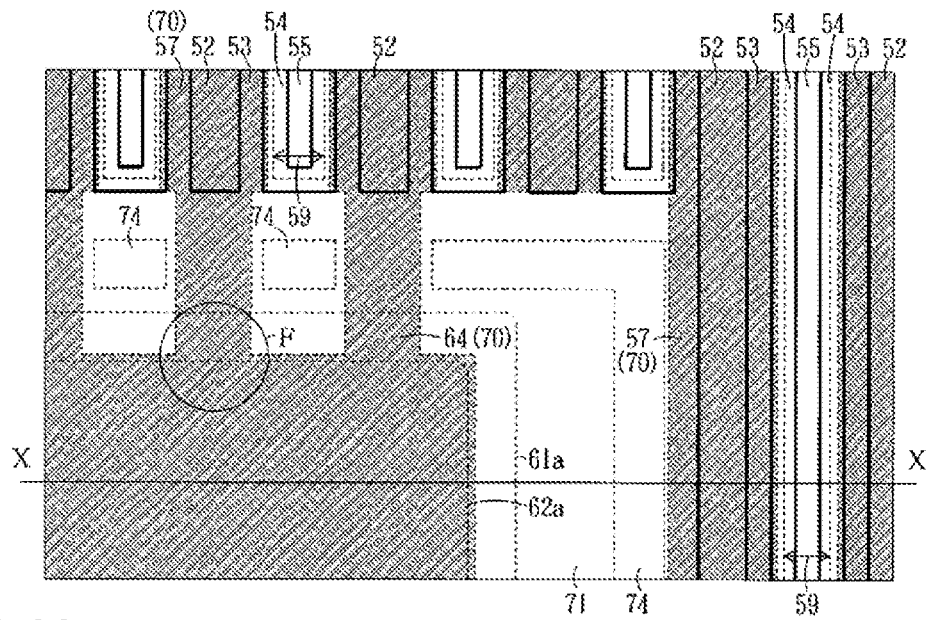

FIG.32B

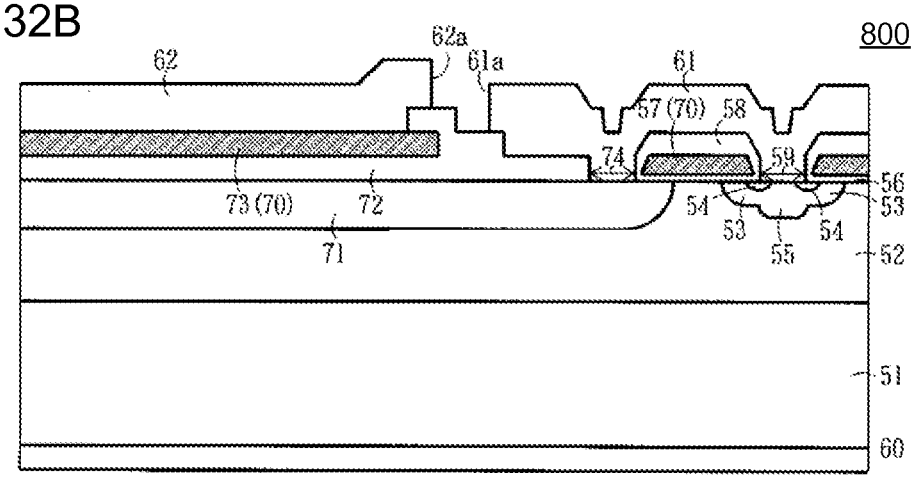

51 · · · n+ drain layer
52 · · · n- drift layer
53 · · · p base region
54 · · · n+ source region
55 · · · p+ well region
56 · · · gate insulation film
57 · · · gate electrode
58 · · · interlayer insulation film
59 · · · source contact hole
60 · · · drain electrode
61 · · · source electrode
61a · · · source electrode end
62 · · · gate pad electrode
62a · · · gate pad electrode end
70 · · · poly-silicon film
71 · · · p region
72 · · · interlayer insulation film
73 · · · conductor
74 · · · p region contact hole

SEMICONDUCTOR DEVICE

RELATED APPLICATIONS

The present application is a National Phase of International Application Number PCT/JP2014/059599, filed Mar. 31, 2014, which claims non-US priority benefit of International Application Number PCT/JP2013/059785, filed Mar. 31, 2013.

BACKGROUND OF THE INVENTION

1. Field of the Invention

The present invention relates to a semiconductor device.

2. Description of the Related Art

Conventionally, there has been known a semiconductor device where an active element part and a gate pad part are defined on a semiconductor substrate formed by laminating a drain layer (low resistance semiconductor layer) and a drift layer to each other (see FIG. 23 of JP-A-2005-150348 (patent literature 1), for example). FIG. 32A and FIG. 32B are views for explaining a conventional semiconductor device 800. FIG. 32A is a plan view showing an essential part of the semiconductor device 800, and FIG. 32B is a cross-sectional view taken along a line X-X in FIG. 32A.

As shown in FIG. 32A and FIG. 32B, the conventional semiconductor device 800 is a semiconductor device provided with an active element part and a gate pad part defined on a semiconductor substrate which is formed by laminating an $n^+$ drain layer 51 and an $n^-$ drift layer 52 to each other. As shown in FIG. 32B, the active element part includes: the $n^+$ drain layer 51; the $n^-$ drift layer 52; p base regions 53 formed on a surface of the $n^-$ drift layer 52; $n^+$ source regions 54 formed on surfaces of the p base regions 53; gate electrodes 57 formed on the p base regions 53 sandwiched between the $n^+$ source regions 54 and the $n^-$ drift layer 52 with gate insulation films 56 interposed therebetween; and source electrodes 61 formed in contact with surfaces of the $n^+$ source regions 54 and the p base regions 53 in a state where the source electrodes 61 are insulated from the gate electrodes 57 with interlayer insulation films 58 interposed therebetween.

On the other hand, as shown in FIG. 32B, the gate pad part includes: the $n^+$ drain layer 51, the $n^-$ drift layer 52; a conductor 73 formed of a poly-silicon film formed above the $n^-$ drift layer 52 over the whole area of the gate pad part with an interlayer insulation film 72 interposed therebetween; a gate pad electrode 62 formed on the conductor 73; and a p region 71 formed on the surface of the $n^-$ drift layer 52 over the whole area of the gate pad part. In FIG. 32A and FIG. 32B, symbol 55 indicates a $p^+$ well region, symbol 59 indicates a source contact hole, symbol 60 indicates a drain electrode, symbol 70 indicates a poly-silicon film, and symbol 74 indicates a p region contact hole.

In the conventional semiconductor device 800, in the gate pad part, the p region 71 is formed on the surface of the $n^-$ drift layer 52 over the whole area of the gate pad part. Accordingly, at the time of applying a reverse bias voltage, a depletion layer in the $n^-$ drift layer 52 extends toward the $n^+$ drain layer 51 over the whole area of the gate pad part thus providing a semiconductor device having a high breakdown strength.

SUMMARY OF THE INVENTION

However, in the conventional semiconductor device 800, due to a demand for a higher switching speed and higher micronizing of cells in recent years, it has become necessary to take into account a gate oscillation phenomenon (see FIG. 30C described later) which occurs at the time of switching off the semiconductor device 800. Conventionally, the gate oscillation phenomenon which occurs at the time of switching off the semiconductor device 800 is suppressed by externally connecting a capacitance and a resistance between the gate and the drain of the semiconductor device 800.

However, the external connecting of the capacitance and the resistance between the gate and the drain of the semiconductor device 800 brings about the increase of externally connected discrete parts and the increase of the number of steps for externally connecting the discrete parts.

The present invention has been made in view of the above-mentioned circumstances, and it is an object of the present invention to provide a semiconductor device which can suppress a gate oscillation phenomenon which occurs at the time of switching off the semiconductor device while obviating the external connecting of a capacitance and a resistance between a gate and a drain of the semiconductor device.

[1] According to a first aspect of the present invention, there is provided a semiconductor device provided with an active element part and a gate pad part defined on a semiconductor substrate which is formed by laminating a low resistance semiconductor layer of a first conductive type or a second conductive type and a drift layer of a first conductive type to each other, wherein the active element part includes: the low resistance semiconductor layer; the drift layer formed on the low resistance semiconductor layer; a base region of a second conductive type formed on a surface of the drift layer; a high concentration impurity diffusion region of a first conductive type formed on a surface of the base region; a gate electrode layer formed on the base region sandwiched between the high concentration impurity diffusion region and the drift layer with a gate insulation layer interposed therebetween; and a first electrode layer formed in contact with a surface of the high concentration impurity diffusion region and a surface of the base region in a state where the first electrode layer is insulated from the gate electrode layer with an interlayer insulation layer interposed therebetween, and the gate pad part includes: the low resistance semiconductor layer; the drift layer formed on the low resistance semiconductor layer; a conductor layer formed above the drift layer over the whole area of the gate pad part with a field insulation layer interposed therebetween; and a gate oscillation suppressing structure formed on a surface of the drift layer, wherein the gate oscillation suppressing structure includes: a first impurity diffusion region of a second conductive type which is disposed along an outer peripheral portion of the gate pad part and is electrically connected with the first electrode layer, and a second impurity diffusion region of a second conductive type in a floating state and an impurity non-diffusion region of a second conductive type which are alternately formed in the region surrounded by the first impurity diffusion region of a second conductive type.

[2] According to a second aspect of the present invention, there is provided a semiconductor device provided with an active element part and a gate pad part defined on a semiconductor substrate which is formed by laminating a low resistance semiconductor layer of a first conductive type or a second conductive type and a drift layer of a first conductive type to each other, wherein the active element part includes: the low resistance semiconductor layer; the drift layer formed on the low resistance semiconductor layer; a base region of a second conductive type formed on a surface of the drift layer; a plurality of trenches formed such that the trenches open at the base region and reach the drift layer; a high concentration impurity diffusion region of a first conductive type arranged within the base region, exposing at least a portion thereof on inner peripheral surfaces of the trenches; a gate insulation layer formed on the inner peripheral surfaces of the trenches; a gate electrode layer embedded into the inside of the trenches with the gate insulation layer interposed therebetween; and a first electrode layer formed in contact with a surface of the high concentration impurity diffusion region and a surface of the base region in a state where the first electrode layer is insulated from the gate electrode layer with an interlayer insulation layer interposed therebetween, and the gate pad part includes: the low resistance semiconductor layer; the drift layer formed on the low resistance semiconductor layer; a conductor layer formed above the drift layer over the whole area of the gate pad part with a field insulation layer interposed therebetween; and a gate oscillation suppressing structure formed on a surface of the drift layer, wherein the gate oscillation suppressing structure includes: a first impurity diffusion region of a second conductive type which is disposed along an outer peripheral portion of the gate pad part and is electrically connected with the first electrode layer and a second impurity diffusion region of a second conductive type in a floating state and an impurity non-diffusion region of a second conductive type which are alternately formed in the region surrounded by the first impurity diffusion region of a second conductive type.

[3] In the semiconductor device according to the present invention, it is preferable that the field insulation layer has a larger thickness than the gate insulation layer.

[4] In the semiconductor device according to the present invention, it is preferable that the conductor layer is formed of a poly-silicon layer formed between the field insulation layer and a gate pad electrode layer formed over the field insulation layer.

[5] In the semiconductor device according to the present invention, it is preferable that the conductor layer is a gate pad electrode layer formed over the field insulation layer.

[6] In the semiconductor device according to the present invention, it is preferable that the conductor layer is electrically connected with the gate electrode layer via a gate finger part which connects the gate pad electrode layer and the gate electrode layer to each other, and no portion of the conductor layer is directly connected with the gate electrode layer without interposing the gate finger part therebetween.

[7] In the semiconductor device according to the present invention, it is preferable that a cell arranged adjacent to the gate pad part has the structure where the high concentration impurity diffusion region on a gate pad part side is eliminated.

[8] In the semiconductor device according to the present invention, it is preferable that a trench arranged adjacent to the gate pad part has the structure where the high concentration impurity diffusion region on a gate pad part side is eliminated.

[9] In the semiconductor device according to the present invention, it is preferable that the active element part further includes a high concentration projecting diffusion region of a second conductive type which is formed in a downwardly projecting manner from the base region, and the first impurity diffusion region of a second conductive type and the second impurity diffusion region of a second conductive type are formed in the same step for forming the high concentration projecting diffusion region, and the first impurity diffusion region of a second conductive type is formed continuously with the high concentration projecting diffusion region.

[10] In the semiconductor device according to the present invention, it is preferable that the first impurity diffusion region of a second conductive type and the second impurity diffusion region of a second conductive type are formed in the same step for forming the base region, and the first impurity diffusion region of a second conductive type is formed continuously with the base region.

[11] In the semiconductor device according to the present invention, it is preferable that the active element part further includes a low concentration projecting diffusion region of a second conductive type which is formed in a downwardly projecting manner from the base region, and the first impurity diffusion region of a second conductive type and the second impurity diffusion region of a second conductive type are formed in the same step for forming the low concentration projecting diffusion region, and the first impurity diffusion region of a second conductive type is formed continuously with the low concentration projecting diffusion region.

[12] In the semiconductor device according to the present invention, it is preferable that the first impurity diffusion region of a second conductive type and the second impurity diffusion region of a second conductive type are formed in the same step for forming a guard ring which is formed around the active element part.

[13] In the semiconductor device according to the present invention, it is preferable that the first impurity diffusion region of a second conductive type and the second impurity diffusion region of a second conductive type are formed in the same step for forming the base region, and the first impurity diffusion region of a second conductive type is formed continuously with the base region.

[14] In the semiconductor device according to the present invention, it is preferable that the active element part further includes a high concentration projecting diffusion region of a second conductive type which is formed in a downwardly projecting manner from the base region, and the first impurity diffusion region of a second conductive type and the second impurity diffusion region of a second conductive type are formed in the same step for forming the high concentration projecting diffusion region, and the first impurity diffusion region of a second conductive type is formed continuously with the high concentration projecting diffusion region.

[15] In the semiconductor device according to the present invention, it is preferable that the second impurity diffusion region of a second conductive type is formed in a region surrounded by the first impurity diffusion region of a second conductive type, and the impurity non-diffusion region of a second conductive type is formed in a stripe shape or an island shape inside the second impurity diffusion region of a second conductive type.

[16] In the semiconductor device according to the present invention, it is preferable that the impurity non-diffusion region of a second conductive type is formed in a region surrounded by the first impurity diffusion region of a second conductive type, and the second impurity diffusion region of a second conductive type is formed in a stripe shape or an island shape inside impurity non-diffusion region of a second conductive type.

[17] In the semiconductor device according to the present invention, it is preferable that the first impurity diffusion region of a second conductive type and the second impurity diffusion region of a second conductive type do not have a semiconductor region of a first conductive type therein.

[18] In the semiconductor device according to the present invention, it is preferable that a gate finger part which connects the gate pad electrode layer and the gate electrode layer also has a gate oscillation suppressing structure where a third impurity diffusion region of a second conductive type electrically connected with the first electrode layer and a second impurity non-diffusion region of a second conductive type are alternately formed on the surface of the drift layer.

In the semiconductor device of the present invention, "one region is continuously formed with another region different from the one region" means that "one region" is formed in a directly connected manner with "another region different from the one region" without interposing other layers therebetween.

Advantage of the Invention

In the conventional semiconductor device 800, a gate-drain capacitance takes a value obtained by adding a capacitance of a capacitor $C_1$ formed in the gate pad part to a capacitance of a capacitor $C_0$ formed in the active element part (see the semiconductor device 100A shown in FIG. 3B described later). The capacitor $C_1$ formed in the gate pad part has the structure where "the conductor layer (a poly-silicon layer 136 in FIG. 3B) which constitutes one electrode", "the field insulation layer 134 which constitutes a dielectric and the p$^+$-type diffusion region 158" and "the drift layer 114 which constitutes another electrode" are laminated to each other.

On the other hand, also in the semiconductor device of the present invention, a gate-drain capacitance takes a value obtained by adding capacitances of capacitors $C_2$, $C_3$ formed in the gate pad part to a capacitance of the capacitor $C_0$ formed in the active element part (see the semiconductor device 100 shown in FIG. 3A described later). In such a constitution, the capacitor $C_2$ is a capacitor formed in a region where the first impurity diffusion region of a second conductive type and the second impurity diffusion region of a second conductive type (the p$^+$-type diffusion region 132a and the p$^+$-type diffusion region 132b in FIG. 3A) are formed on a surface of the drift layer. The capacitor $C_2$ is formed of: "the conductor layer (the poly-silicon layer 136 in FIG. 3A) which constitutes one electrode"; "the field insulation layer (the field insulation layer 134 in FIG. 3A) which constitutes a dielectric and the impurity diffusion region of a second conductive type (the first impurity diffusion region of a second conductive type and the second impurity diffusion region of a second conductive type)(the p$^+$-type diffusion region 132a and p$^+$-type diffusion region 132b in FIG. 3A)"; and "a drift layer (a drift layer 114 in FIG. 3A) which constitutes another electrode". The capacitor $C_3$ is a capacitor formed in the impurity non-diffusion region of a second conductive type (the p-type impurity non-diffusion regions 132c, 132d in FIG. 3A) on a surface of the drift layer. The capacitor $C_3$ is formed of: "a conductor layer (the poly-silicon layer 136 in FIG. 3A) which constitutes one electrode"; "the field insulation layer (the field insulation layer 134 in FIG. 3A) which constitutes a dielectric"; and "a drift layer (the drift layer 114 in FIG. 3A) which constitutes another electrode".

In the semiconductor device of the present invention, usually, the field insulation layer is formed extremely thin compared with the p region 71 (FIG. 32B) and the p$^+$-type diffusion region 158 (see FIG. 3B) in the conventional semiconductor device (field insulation layer: 200 nm to 500 nm, p region 71, p$^+$-type diffusion region 158: 2.4 μm to 8.0 μm).

Among the capacitors $C_1$, $C_2$ and $C_3$, the capacitance of the capacitor $C_3$ is extremely increased. As a result, the gate-drain capacitance Crss of the semiconductor device of the present invention becomes larger than the gate-drain capacitance Crss of the conventional semiconductor device.

In the semiconductor device of the present invention, the narrow region sandwiched by the impurity diffusion regions of a second conductive type which are disposed adjacent to each other on the surface of the drift layer (the region sandwiched between the first impurity non-diffusion region of a second conductive type and the second impurity non-diffusion region of a second conductive type (p$^+$-type non-diffusion region 132c sandwiched between the p$^+$-type diffusion region 132a and the p$^+$-type diffusion region 132b in FIG. 3A) and the narrow region sandwiched by the second impurity diffusion regions of a second conductive type which are disposed adjacent to each other (p$^+$-type non-diffusion region 132d sandwiched between the p$^+$-type diffusion regions 132d which are arranged adjacent to each other in FIG. 3A) forma current path (see FIG. 3A described later). Further, in the current path, at the time of switching off the semiconductor device, a depletion layer spreads toward a drift layer side from the impurity diffusion region of a second conductive type (the first impurity diffusion region of a second conductive type (the p$^+$-type diffusion region 132a) and the second impurity diffusion region of a second conductive type (the p$^+$-type diffusion region 132b)) (see FIG. 4A to FIG. 4E described later) and hence, a resistance having a relatively large resistance value (see a resistance R3 in FIG. 3A described later) is formed in the above-mentioned narrow regions.

As a result, in the semiconductor device of the present invention, a large capacitance and a large resistance can be formed between the gate and the drain and hence, it is possible to suppress a gate oscillation phenomenon which occurs at the time of switching off the semiconductor device without externally connecting the capacitance and the resistance between the gate and the drain.

The second impurity diffusion region of a second conductive type (the p$^+$-type diffusion region 132b in FIG. 3A) is in a floating state and hence, at the time of applying a reverse bias voltage, it is usually considered that a depletion layer does not spread toward a drift layer side from the second impurity diffusion region of a second conductive type (the p$^+$-type diffusion region 132b in FIG. 3A). However, as shown in FIG. 4A to FIG. 4C described later, in the semiconductor device of the present invention, at the time of applying a reverse bias voltage, in the course that a depletion layer "d" spreads toward the drift layer side from the first impurity diffusion region of a second conductive type (the p$^+$-type diffusion region 132a in FIG. 3A) electrically connected with the first electrode layer (the source electrode layer 128 in FIG. 3A), the depletion layer "d" spreading from the first impurity diffusion region of a second conductive type (the p$^+$-type diffusion region 132a in FIG. 3A) is brought into contact with the second impurity diffusion region of a second conductive type (the p$^+$-type diffusion region 132b in FIG. 3A). Accordingly, a potential of the second impurity diffusion region of a second conductive type (the p$^+$-type diffusion region 132b in FIG. 3A) becomes equal to a potential of the first impurity diffusion region of a second conductive type (the p$^+$-type diffusion region 132a in FIG. 3A) and, thereafter, as shown in FIG. 4C to FIG. 4E described later, a depletion layer spreads to the drift layer side also from the second impurity diffusion region of a second conductive type (the p$^+$-type diffusion region 132b in FIG. 3A).

In the semiconductor device of the present invention, the gate pad part is provided with the gate oscillation suppressing structure which includes: the first impurity diffusion region of a second conductive type (the p$^+$-type diffusion region 132a in FIG. 3A) which is disposed along an outer peripheral portion of the gate pad part and electrically connected with the first electrode layer; and the second impurity diffusion region of a second conductive type (the p$^+$-type diffusion region 132b in FIG. 3A) in a floating state and the impurity non-diffusion regions of a second conductive type (the p-type impurity non-diffusion regions 132c, 132d in FIG. 3A) which are alternately formed in a region surrounded by the first impurity diffusion region of a second conductive type. Accordingly, as shown in FIG. 4A to FIG. 4E described later, at the time of applying a reverse bias voltage, the respective depletion layers extend in the lateral direction, and are brought into contact with each other, and extend toward the low resistance semiconductor layer 112 over the whole area of the gate pad part. Accordingly, in the same manner as the conventional semiconductor device 800, the present invention can provide a semiconductor device having a high breakdown strength.

In the conventional semiconductor device 800, the p region 71 is formed over the whole area of the gate pad part and hence, a pn junction area is large and a carrier injection amount at the time of switching off the semiconductor device 800 is also increased. Accordingly, the conventional semiconductor device 800 has a drawback that a reverse recovery period trr extends and also has a drawback that a reverse recovery peak current IPR is increased. To the contrary, in the semiconductor device of the present invention, the gate pad part is provided with the gate oscillation suppressing structure which includes: the first impurity diffusion region of a second conductive type (the $p^+$-type diffusion region 132a in FIG. 3A) which is disposed along an outer peripheral portion of the gate pad part and is electrically connected with the first electrode layer; and the second impurity diffusion region of a second conductive type (the $p^+$-type diffusion region 132b in FIG. 3A) in a floating state and the impurity non-diffusion region of a second conductive type (the p-type impurity non-diffusion regions 132c, 132d in FIG. 3A) which are alternately formed in the region surrounded by the first impurity diffusion region of a second conductive type. Accordingly, a pn junction area is small and a carrier injection amount at the time of switching off the semiconductor device is also decreased. Accordingly, the semiconductor device of the present invention has an advantage that a reverse recovery period trr becomes short and also has an advantage that a reverse recovery peak current IPR is decreased. Further, according to the semiconductor device of the present invention, the second impurity diffusion region of a second conductive type (the $p^+$-type diffusion region 132b in FIG. 3A) of the gate pad part is in a floating state and hence, compared to the case where the second impurity diffusion region of a second conductive type of the gate pad part is not in a floating state, an area of the impurity diffusion region of a second conductive type where the impurity diffusion region functions as a body diode is decreased, and an amount of injecting carrier at the time of switching off the semiconductor device is also decreased. As a result, a reverse recovery period trr becomes shorter and hence, a di/dt resistance can be increased.

Patent literature 1 discloses the semiconductor device in which a cell formed of a MOSFET is incorporated also in the gate pad part (see FIG. 1A and FIG. 1B in patent literature 1). Assume such a semiconductor device as a second conventional semiconductor device. It is considered that the second conventional semiconductor device can also provide a semiconductor device having a large gate-drain capacitance compared with the conventional semiconductor device 800.

However, in the second conventional semiconductor device, usually, a rate of an area of a drift region which faces a gate electrode layer in an opposed manner with a gate insulation layer interposed therebetween is small. Accordingly, a gate-drain capacitance increasing effect which the second conventional semiconductor device possesses is small compared with a gate-drain capacitance increasing effect which the semiconductor device of the present invention possesses. In an actual operation, the second conventional semiconductor device exhibits a small effect of suppressing a gate oscillation phenomenon at the time of switching off the semiconductor device.

Further, in the second conventional semiconductor device, a MOSFET of the gate pad part performs the same operation in parallel as a MOSFET of an active element part and hence, the second conventional semiconductor device cannot acquire an effect of preventing a gate oscillation phenomenon at the time of switching off the semiconductor device.

Further, in the second conventional semiconductor device, when an avalanche breakdown occurs in a region just below the gate pad part, an avalanche current flows a long distance from the region just below the gate pad part to a source electrode layer of the active element part. Accordingly, a parasitic transistor is liable to be operated at a peripheral end of the gate pad part thus giving rise to cause breaking of the MOSFET.

There has been known a semiconductor device where a p well layer is formed in a ring shape in a lower portion of a gate pad part (see JP-A-5-167070, for example). Assume such a semiconductor device as a third conventional semiconductor device 900. FIG. 33 is a cross-sectional view of the third conventional semiconductor device 900.

As shown in FIG. 33, the third conventional semiconductor device 900 is a semiconductor device provided with an active element part and a gate pad part defined on a semiconductor substrate which is formed by laminating an $n^+$ drain layer (not shown in the drawings) and the $n^-$ drift layer 901 to each other. As shown in FIG. 33, the active element part includes: the $n^+$ drain layer (not shown in the drawing); the $n^-$ drift layer 901; p base regions 902 formed on a surface of the $n^-$ drift layer 901; $n^+$ source regions 903 formed on surfaces of the p base regions 902; gate electrodes 905 formed on the p base regions 902 sandwiched between the $n^+$ source regions 903 and the $n^-$ drift layer 901 with gate insulation films 904 interposed therebetween; and source electrodes 908 formed in contact with surfaces of the $n^+$ source regions 903 and the p base regions 902 in a state where the source electrodes 908 are insulated from the gate electrodes 905 with interlayer insulation films 906 interposed therebetween.

On the other hand, as shown in FIG. 33, the gate pad part includes: the $n^+$ drain layer (not shown in the drawing), the $n^-$ drift layer 901; a conductor 911 formed of a poly-silicon film formed above the $n^-$ drift layer 901 over the whole area of the gate pad part with a field insulation layer 910 interposed therebetween; gate pad electrodes 907 formed on the conductor 911; and a p well layer 919 formed in the lower portion of the gate pad part in a ring shape.

However, in the third conventional semiconductor device 900, to possess a larger breakdown strength than the conventional semiconductor devices (the conventional semiconductor device 800, the semiconductor device described in FIG. 3 of JP-A-5-167070) at the time of switching off the semiconductor device, a capacitance of a parasitic diode below the gate pad part is set small. Further, in the third conventional semiconductor device 900, the p well layer 919 is not formed at the center portion of the gate pad part and hence, a value of a resistance R3 formed at the center portion of the gate pad part becomes small. Accordingly, the third conventional semiconductor device 900, unlike the present invention, cannot suppress a gate oscillation which occurs at the time of switching off the semiconductor device.

Further, in the third conventional semiconductor device 900, the p well layer 919 is formed in the lower portion of the gate pad part in a ring shape. That is, the p well layer 919 is not formed at the center portion of the gate pad part (see FIG. 5B described later) and hence, there also arises a drawback that an effect of making the spreading of a depletion layer in the lower portion of the gate pad part at the time of applying a reverse bias voltage stable is decreased.

To the contrary, the semiconductor device of the present invention is provided with the gate oscillation suppressing structure (the gate oscillation suppressing structure 132 shown in FIG. 3A) which includes: the first impurity diffusion region of a second conductive type (the $p^+$-type diffusion region 132a in FIG. 3A) which is disposed along the outer peripheral portion of the gate pad part and is electrically connected with the first electrode layer; and the second impurity diffusion region of a second conductive type (the $p^+$-type diffusion region 132b in FIG. 3A) in a floating state and the impurity non-diffusion region of a second conductive type (the p-type impurity non-diffusion regions 132c, 132d in FIG. 3A) which are alternately formed in the region surrounded by the first impurity diffusion region of a second conductive type. According to the semiconductor device of the present invention, the above-mentioned drawback that the third conventional semiconductor device 900 has does not arise.

Further, in the third conventional semiconductor device 900, the p well layer 919 formed in the lower portion of the gate pad part is not connected to the source electrode and hence, a depletion layer does not extend in a region where the p well layer 919 is not formed at the time of applying a reverse bias voltage and hence, a field intensity is not decreased whereby a breakdown strength is decreased.

To the contrary, the semiconductor device of the present invention is provided with the gate oscillation suppressing structure (the gate oscillation suppressing structure 132 shown in FIG. 3A) which includes: the first impurity diffusion region of a second conductive type (the $p^+$-type diffusion region 132a in FIG. 3A) which is disposed along the outer peripheral portion of the gate pad part and is electrically connected with the first electrode layer; and the second impurity diffusion region of a second conductive type (the p-type impurity diffusion region 132b in FIG. 3A) in a floating state and the impurity non-diffusion regions of a second conductive type (the p-type impurity non-diffusion regions 132c, 132d in FIG. 3A) which are alternately formed in the region surrounded by the first impurity diffusion region of a second conductive type. According to the semiconductor device of the present invention, the above-mentioned drawback that the third conventional semiconductor device 900 has does not arise.

BRIEF DESCRIPTION OF DRAWINGS

FIG. 32A and FIG. 32B are views for explaining a conventional semiconductor device 800.

DESCRIPTION OF PREFERRED EMBODIMENTS

Figure 1A:
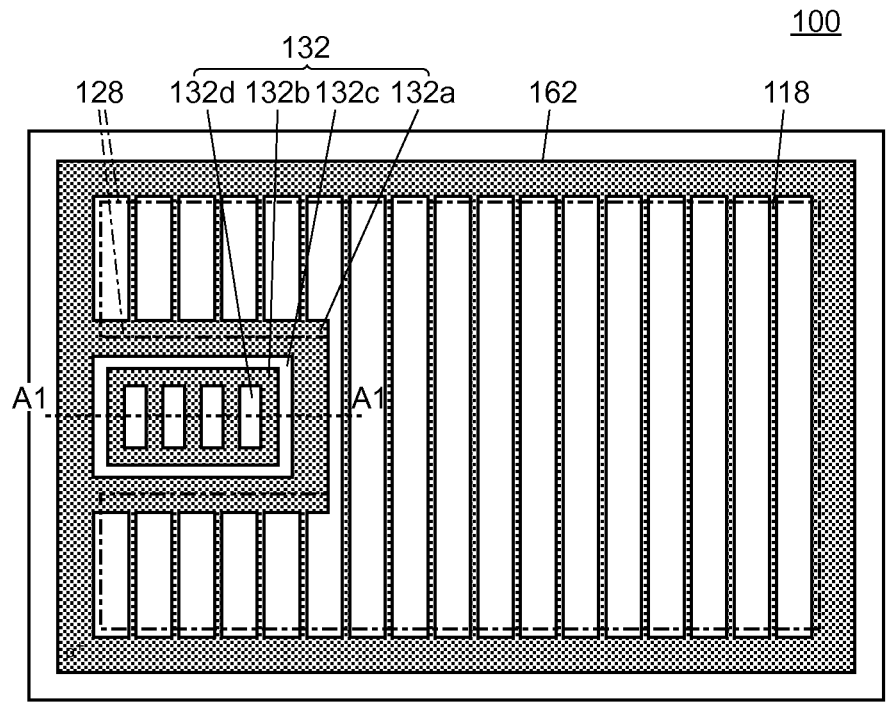
FIG. 1A and FIG. 1B are views for explaining a semiconductor device 100 according to a first embodiment.

Hereinafter, a semiconductor device according to the present invention is explained in conjunction with embodiments shown in the drawings.

Embodiment 1

1. Semiconductor Device 100 According to the Embodiment 1

Figure 1B:
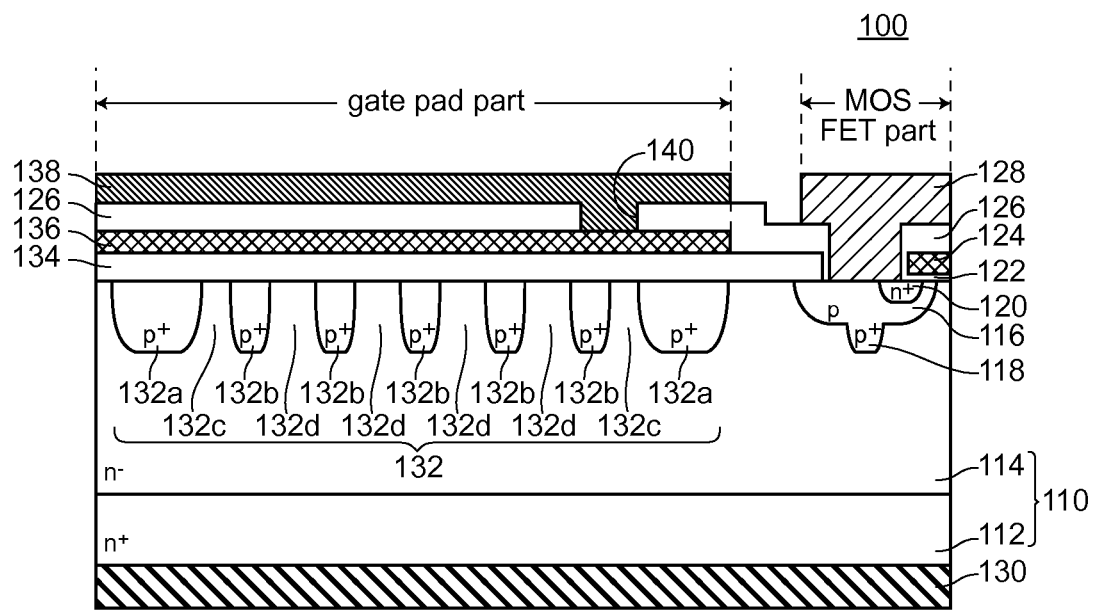
Figure 2A:
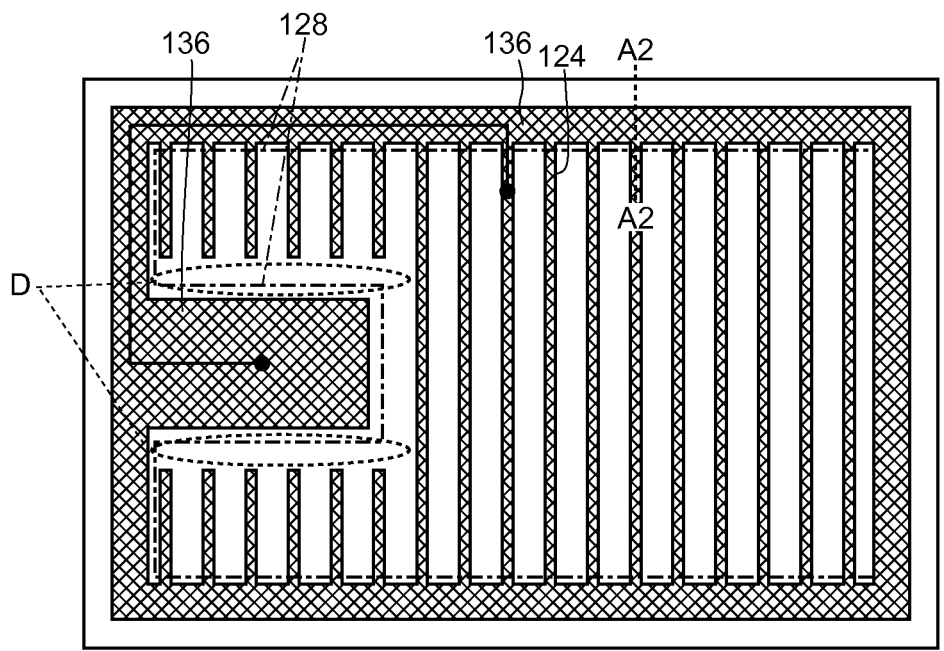
FIG. 2A and FIG. 2B are views for explaining the semiconductor device 100 according to the first embodiment.
Figure 2B:
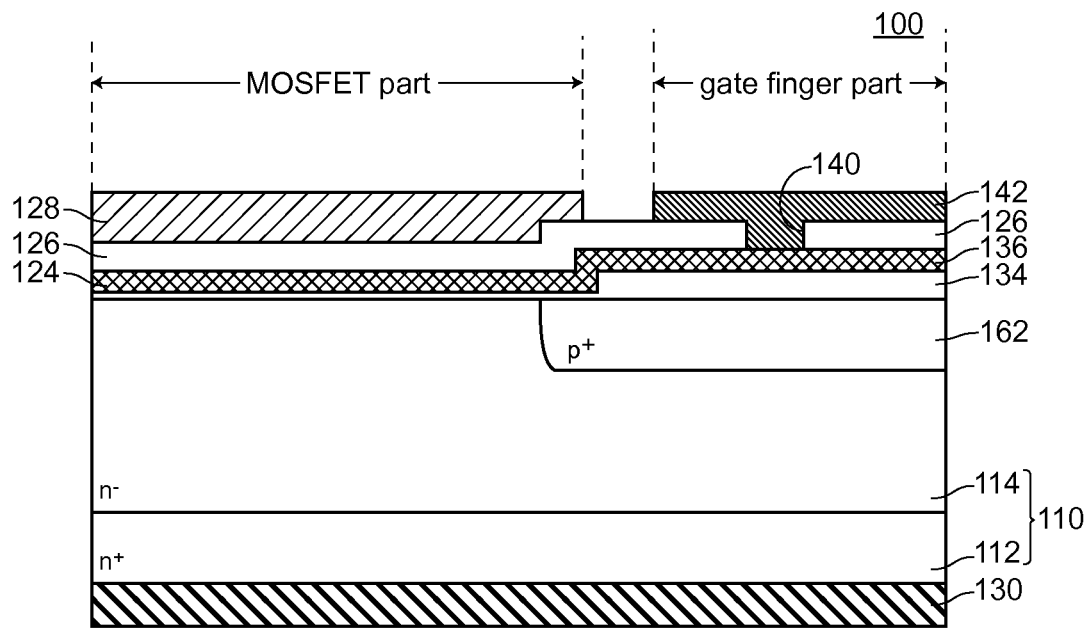

FIG. 1A and FIG. 1B and FIG. 2A and FIG. 2B are views for explaining a semiconductor device 100 according to an embodiment 1. FIG. 1A is a plan view of the semiconductor device 100, and FIG. 1B is a cross-sectional view taken along a line A1-A1 in FIG. 1A. FIG. 2A is a plan view of the semiconductor device 100, and FIG. 2B is a cross-sectional view taken along a line A2-A2 in FIG. 2A. In FIG. 1A, only a profile line (indicated by a chain line) is indicated with respect to $p^+$-type projecting diffusion regions 118, $p^+$-type diffusion regions 132a, 132b, 162, p-type impurity non-diffusion regions 132c, 132d, a gate oscillation suppressing structure 132 and a source electrode layer 128. In FIG. 2A, only a profile line (indicated by a chain line) is indicated with respect to the poly-silicon layer 136 and the source electrode layer 128. In FIG. 1A, the $p^+$-type projecting diffusion regions 118 and the $p^+$-type diffusion regions 132a, 132b, 162 are indicated by a dot pattern. In FIG. 1B, the $p^+$-type projecting diffusion regions 118 and the $p^+$-type diffusion regions 132a, 132b are indicated by an outlined pattern. In FIG. 1B and FIG. 2B, symbol 130 indicates a drain electrode layer.

As shown in FIG. 1A and FIG. 1B, the semiconductor device 100 according to the embodiment 1 is a semiconductor device (a power MOSFET) which is provided with a MOSFET part (corresponding to an active element part of the present invention), a gate pad part and a gate finger part defined on a semiconductor substrate 110 which is formed by laminating an $n^+$-type low resistance semiconductor layer 112 and an $n^-$-type drift layer 114 to each other.

As shown in FIG. 1B, the MOSFET part includes: the low resistance semiconductor layer 112; the drift layer 114 formed on the low resistance semiconductor layer 112; p-type base regions 116 formed on a surface of the drift layer 114; $n^+$-type source regions (high concentration impurity diffusion regions) 120 formed on surfaces of the base regions 116; gate electrode layers 124 formed on the base regions 116 sandwiched between the source regions 120 and the drift layer 114 with a gate insulation layer 122 interposed therebetween; and the source electrode layer 128 (corresponding to a first electrode layer of the present invention) formed in contact with the surfaces of the source regions 120 and the base regions 116 in a state where the source electrode layer 128 is insulated from the gate electrode layers 124 with an interlayer insulation layer 126 interposed therebetween.

As shown in FIG. 1B, the gate pad part includes: the low resistance semiconductor layer 112; the drift layer 114 formed on the low resistance semiconductor layer 112; the poly-silicon layer 136 which constitutes a conductor layer and is formed above the drift layer 114 over the whole area of the gate pad part with a field insulation layer 134 interposed therebetween; and the gate oscillation suppressing structure 132 formed on a surface of the drift layer 114, wherein the gate oscillation suppressing structure 132 includes: the $p^+$-type diffusion region 132a (corresponding to the first impurity diffusion region of a second conductive type of the present invention) which is disposed along an outer peripheral portion of the gate pad part in an annular manner and is electrically connected with the source electrode layer 128; and the $p^+$-type diffusion region 132b (corresponding to the second impurity diffusion region of a second conductive type of the present invention) in a floating state and the p-type impurity non-diffusion regions 132c, 132d (corresponding to the impurity non-diffusion regions of a second conductive type of the present invention) which are alternately formed in the region surrounded by the $p^+$-type diffusion region 132a. The $p^+$-type diffusion regions 132a are electrically connected with the source electrode layer 128 via the $p^+$-type projecting diffusion regions 118.

In the embodiment 1 and embodiments 2 to 17 described later, the $p^+$-type diffusion regions, the p-type diffusion regions and the p-type diffusion regions correspond to the first or the second conductive type impurity diffusion regions of a second conductive type, and the p-type impurity non-diffusion regions correspond to the impurity non-diffusion regions of a second conductive type.

As shown in FIG. 2B, the gate finger part includes: the low resistance semiconductor layer 112; the drift layer 114 formed on the low resistance semiconductor layer 112; the poly-silicon layer 136 formed above the drift layer 114 over the whole area of the gate finger part with the field insulation layer 134 interposed therebetween; and the $p^+$-type diffusion region 162 (corresponding to the third impurity diffusion region of a second conductive type of the present invention) formed on the whole surface of the drift layer 114. The $p^+$-type diffusion region 162 is electrically connected with the source electrode layer 128 via the $p^+$-type projecting diffusion regions 118.

In the semiconductor device 100 according to the embodiment 1, as shown in FIG. 1B, in the gate pad part, the interlayer insulation layer 126 is formed on the poly-silicon layer 136, and a gate pad electrode layer 138 is formed on the interlayer insulation layer 126. The poly-silicon layer 136 and the gate pad electrode layer 138 are electrically connected with each other via a through hole 140 formed in the interlayer insulation layer 126.

In the semiconductor device 100 according to the embodiment 1, as shown in FIG. 2B, in the gate finger part, the interlayer insulation layer 126 is formed on the poly-silicon layer 136, and a gate finger line layer 142 is formed on the interlayer insulation layer 126. The poly-silicon layer 136 and the gate finger line layer 142 are electrically connected with each other via the through hole 140 formed in the interlayer insulation layer 126.

In the semiconductor device 100 according to the embodiment 1, the poly-silicon layer 136 is electrically connected with the gate electrode layer 124 via the gate finger part which connects the gate pad electrode layer 138 and the gate electrode layer 124 to each other, and no portion of the poly-silicon layer 136 is directly connected with the gate electrode layer 124 without interposing the gate finger part therebetween (see a portion indicated by symbol D in FIG. 2A).

In the semiconductor device 100 according to the embodiment 1, the $p^+$-type diffusion region 132b is formed in the region surrounded by the $p^+$-type diffusion region 132a, and the p-type impurity non-diffusion regions 132d are formed in a stripe shape inside the $p^+$-type diffusion region 132b. The $p^+$-type diffusion region 132b is formed in a stripe shape such that both ends of the $p^+$-type diffusion region 132b are connected to each other so as to surround each p-type impurity non-diffusion region 132d.

The semiconductor device 100 according to the embodiment 1 has the structure where the source region 120 (corresponding to the high concentration impurity diffusion region of the first conductive type of the present invention) on a gate pad part side is eliminated in a cell adjacent to the gate pad part (see a portion indicated by symbol B in FIG. 5A and FIG. 5B described later).

In the semiconductor device 100 according to the embodiment 1, the MOSFET part further includes the $p^+$-type projecting diffusion regions 118 formed in a downwardly projecting manner (in the depth direction) from the base regions 116. The p+-type diffusion regions 132a, 132b in the gate pad part are formed in the same step for forming the p+-type projecting diffusion regions 118 in the MOSFET part and the p+-type diffusion regions 162 in the gate finger part, and the p+-type diffusion regions 132a in the gate pad part are also formed continuously with the p+-type projecting diffusion regions 118 in the MOSFET part and the p+-type diffusion region 162 in the gate finger part.

In the semiconductor device 100 according to the embodiment 1, the p+-type diffusion regions 132a, 132b do not include an n-type semiconductor region therein.

In the semiconductor device 100 according to the embodiment 1, a ratio of an area of a portion in the gate pad part where the poly-silicon layer 136 which constitutes the conductor layer faces the drift layer 114 in an opposed manner with the field insulation layer 134 interposed therebetween to an area of the whole gate pad part is set larger than a ratio of an area of a portion in the MOSFET part where the gate electrode layer 124 faces the drift layer 114 in an opposed manner with the gate insulation layer 122 interposed therebetween to an area of the whole MOSFET part.

A thickness of the low resistance semiconductor layer 112 is set to 100 µm to 400 µm, and an impurity concentration in the low resistance semiconductor layer 112 is set to $1 \times 10^{19}$ cm$^{-3}$ to $1 \times 10^{20}$ cm$^{-3}$. A thickness of the drift layer 114 is set to 5 µm to 50 µm, and an impurity concentration in the drift layer 114 is set to $1 \times 10^{14}$ cm$^{-3}$ to $1 \times 10^{16}$ cm$^{-3}$. A depth of the base region 116 is set to 21 µm to 2.5 µm, and an impurity concentration in the base region 116 is set to $5 \times 10^{16}$ cm$^{-3}$ to $1 \times 10^{18}$ cm$^{-3}$. A depth of the source region 120 is set to 0.2 µm to 0.4 µm, and an impurity concentration in the source region 120 is set to $5 \times 10^{19}$ cm$^{-3}$ to $2 \times 10^{20}$ cm$^{-3}$. A depth of the p+-type projecting diffusion region 118 is set to 2.4 µm to 8.0 µm, and an impurity concentration in the p+-type projecting diffusion region 118 is set to $1 \times 10^{17}$ cm$^{-3}$ to $3 \times 10^{18}$ cm$^{-3}$. A depth of the p+-type diffusion regions 132a, 132b is set to 2.4 µm to 8.0 µm, and an impurity concentration in the p+-type diffusion regions 132a, 132b is set to $1 \times 10^{17}$ cm$^{-3}$ to $3 \times 10^{18}$ cm$^{-3}$.

The base regions 116, the p+-type projecting diffusion regions 118, the gate electrode layers 124 and the p+-type diffusion region 132b are formed in a stripe shape. Pitches at which the base regions 116, the p+-type projecting diffusion regions 118 and the gate electrode layers 124 are formed are set to 15 µm, for example, and a pitch at which the p+-type diffusion region 132b is formed is set to 15 µm, for example. A stripe width of the base region 116 is set to 9 µm, for example. A stripe width of the p+-type projecting diffusion region 118 is set to 3.75 µm, for example. A stripe width of the gate electrode layer 124 is set to 6 µm, for example. A stripe width of the p+-type diffusion region 132b is set to 8 µm, for example.

The gate insulation layer 122 is formed of a silicon dioxide film having a thickness of 100 nm, for example, and is formed by a thermal oxidation method. The field insulation film 134 is formed of a silicon dioxide film having a thickness of 450 nm, for example, and is formed by a thermal oxidation method. The interlayer insulation layer 126 is formed of a PSG film having a thickness of 1000 nm and is formed by a CVD method. The gate electrode layer 124 is formed of a low resistance poly-silicon film having a thickness of 500 nm, for example, and is formed by a CVD method and an ion implantation method. The poly-silicon layer 136 is formed of a low resistance poly-silicon film having a thickness of 500 nm, for example, and is formed by a CVD method and an ion implantation method. The gate electrode layer 124 and the poly-silicon layer 136 are formed in the same step.

The source electrode layer 128 is formed of an aluminum film having a thickness of 4 µm, for example, and is formed by a sputtering method. The gate pad electrode layer 138 and the gate finger line layer 142 are formed of an aluminum film having a thickness of 4 µm, for example, and are formed by a sputtering method. The source electrode layer 128, the gate pad electrode layer 138 and the gate finger line layer 142 are formed in the same step. A drain electrode layer 130 is formed of a multi-layered metal film such as a Ti—Ni—Au film and a thickness of the whole multi-layered metal film is set to 0.5 µm, for example.

2. Advantageous Effects Acquired by the Semiconductor Device 100 According to the Embodiment 1

Figure 3A:
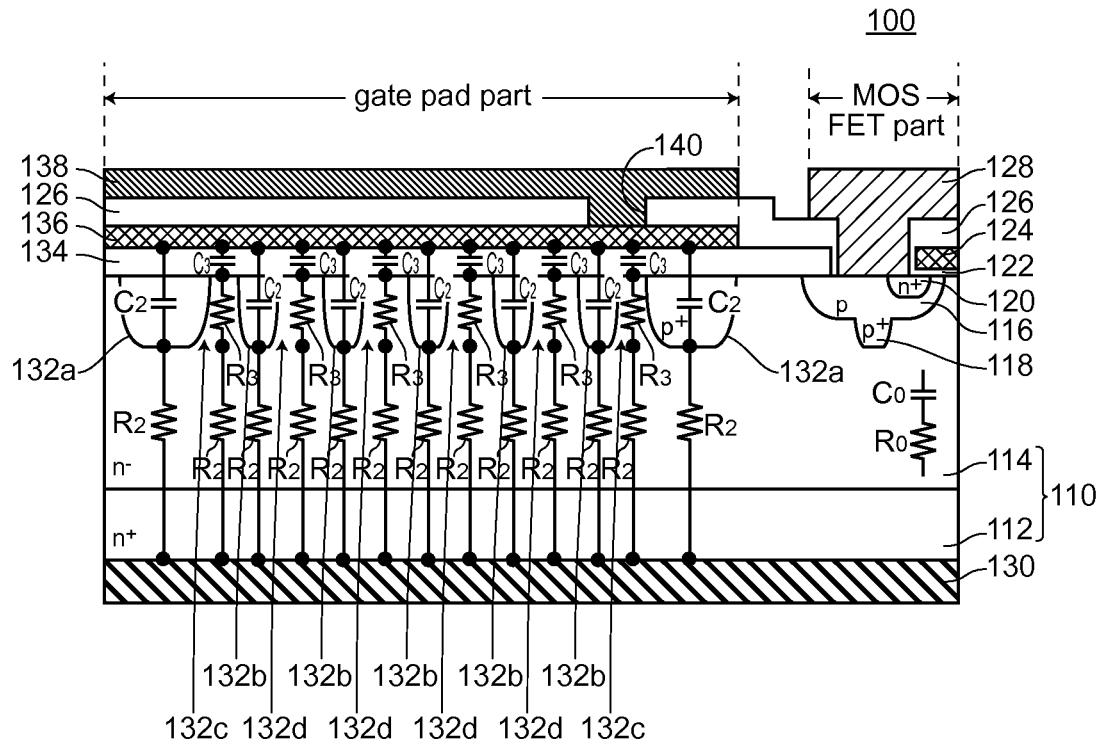
FIG. 3A and FIG. 3B are views for explaining an advantageous effect acquired by the semiconductor device 100 according to the first embodiment.

FIG. 3A to FIG. 5B are views for explaining advantageous effects acquired by the semiconductor device 100 according to the embodiment 1. FIG. 3A is a view where parasitic capacitances and parasitic resistances are additionally described in a cross-sectional view of the semiconductor device 100 according to the embodiment 1. FIG. 3B is a view where parasitic capacitances and parasitic resistances are additionally described in a cross-sectional view of the semiconductor device 100A according to a comparison example 1. The semiconductor device 100A according to the comparison example 1 basically corresponds to the conventional semiconductor device 800.

Figure 4A:
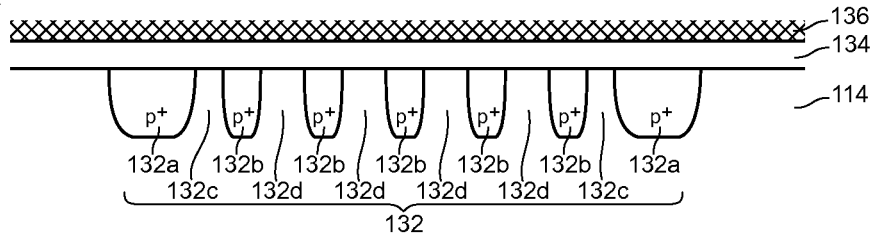
FIG. 4A to FIG. 4E are views for explaining an advantageous effect acquired by the semiconductor device 100 according to the first embodiment.
Figure 4B:
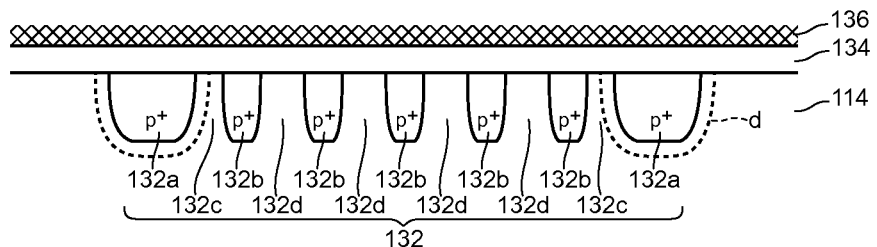
Figure 4C:
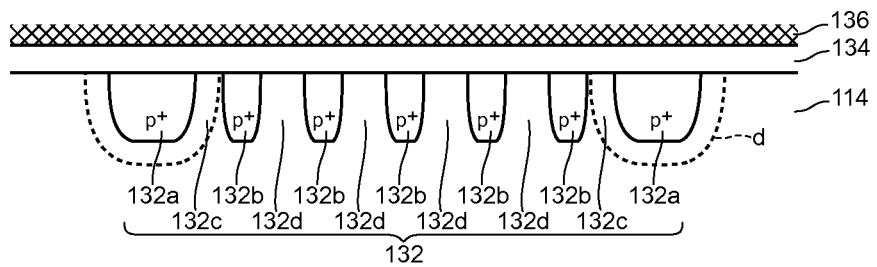
Figure 4D:
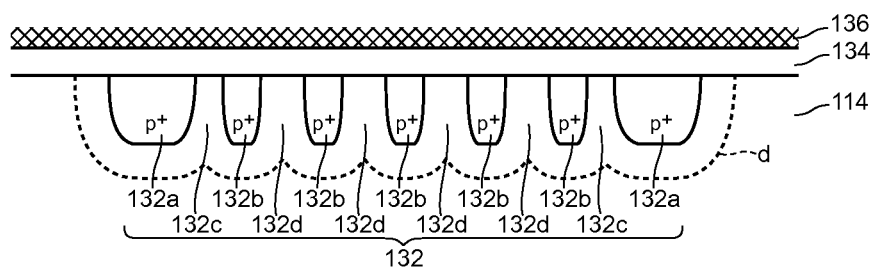
Figure 4E:
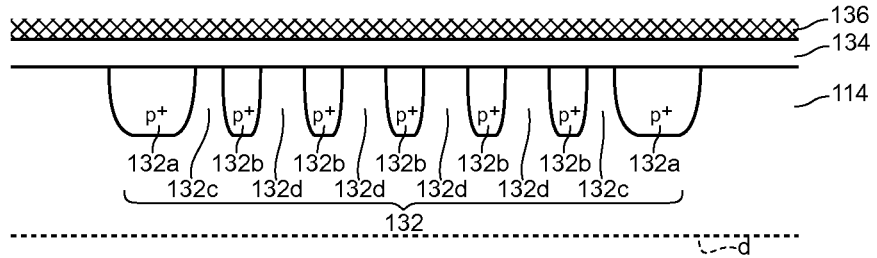

FIG. 4A to FIG. 4E are views showing modes where depletion layers d extend at the time of applying a reverse bias voltage. FIG. 4A is a view showing the mode where the depletion layers d extend when a reverse bias voltage is not applied. FIG. 4B is a view showing the mode where the depletion layers d extend when a low reverse bias voltage is applied. FIG. 4C is a view showing the mode where the depletion layers d extend when an intermediate reverse bias voltage is applied. FIG. 4D is a view showing the mode where the depletion layers d extend when a high reverse bias voltage is applied. FIG. 4E is a view showing the mode where the depletion layers d extend when a reverse bias voltage higher than the reverse voltage in the case shown in FIG. 4D is applied. The low resistance semiconductor layer 112, the drain electrode layer 130, the interlayer insulation layer 126 and the source electrode layer 128 are omitted in FIG. 4A to FIG. 4E.

Figure 5A:
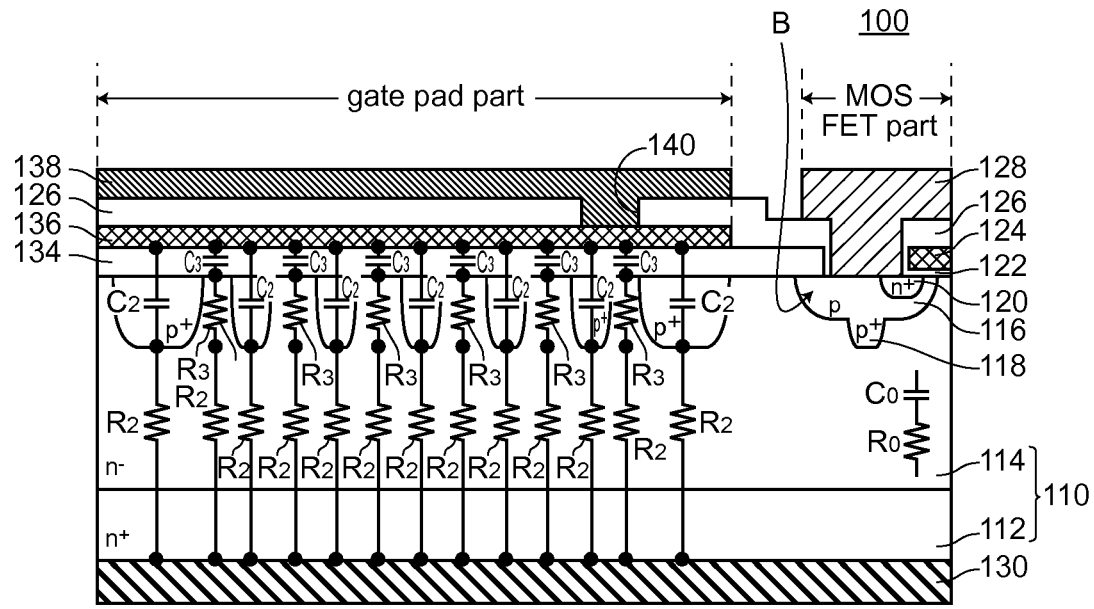
FIG. 5A and FIG. 5B are views for explaining an advantageous effect acquired by the semiconductor device 100 according to the first embodiment.
Figure 5B:
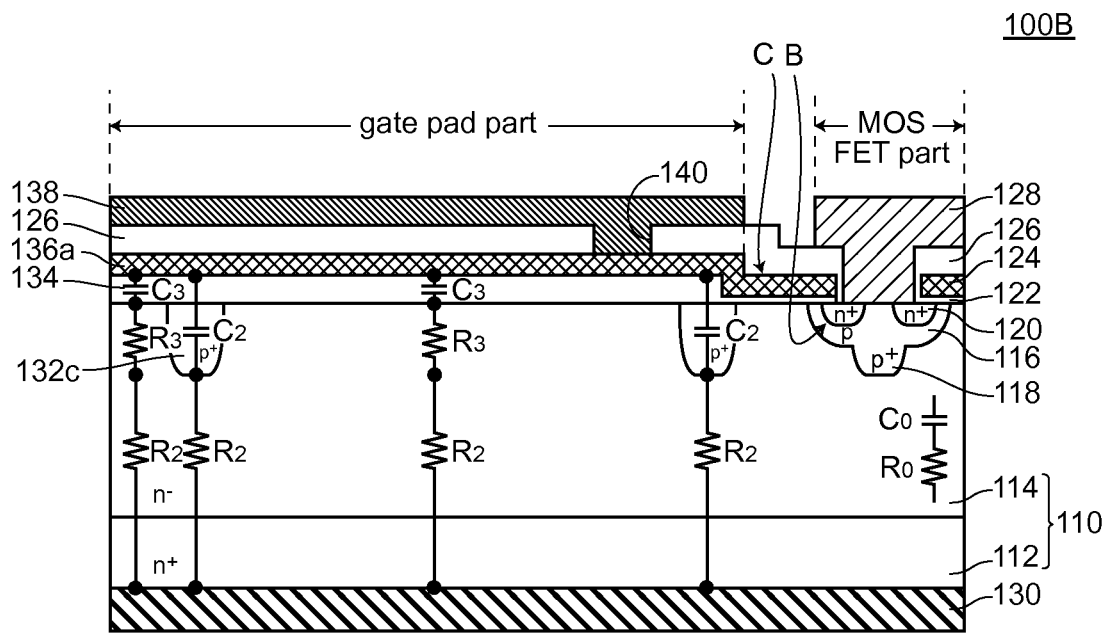

FIG. 5A is a view where parasitic capacitances and parasitic resistances are additionally described in the cross-sectional view of the semiconductor device 100 according to the embodiment 1. FIG. 5B is a view where parasitic capacitances and parasitic resistances are additionally described in a cross-sectional view of a semiconductor device 100B of a comparison example 2. The semiconductor device 100B according to the comparison example 2 basically corresponds to the third conventional semiconductor device 900.

Figure 3B:
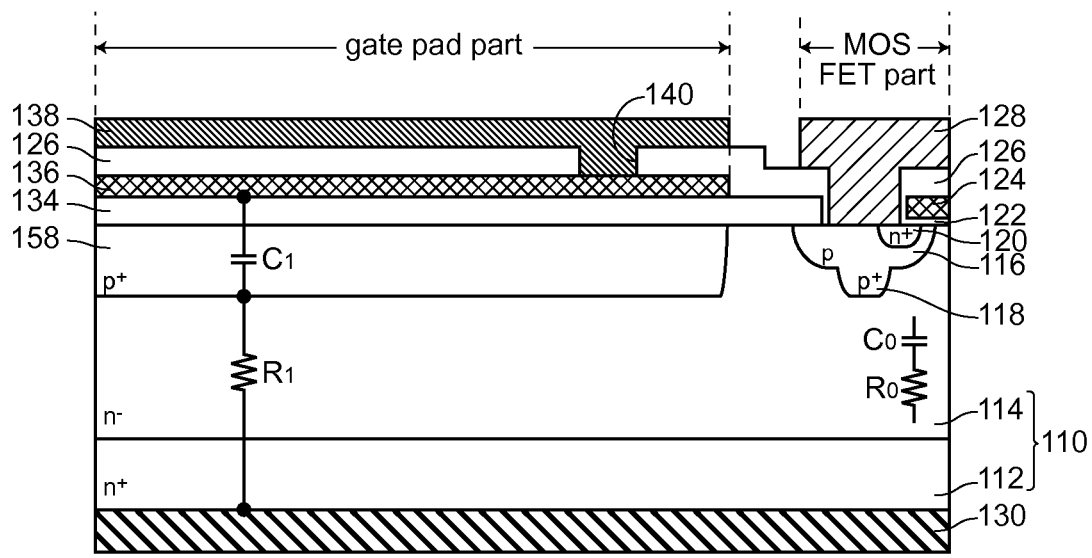

In the conventional semiconductor device 800 (or the semiconductor device 100A according to the comparison example 1), a gate-drain capacitance takes a value obtained by adding a capacitance of a capacitor $C_1$ formed in the gate pad part to a capacitance of a capacitor $C_0$ formed in the MOSFET part (see FIG. 3B). In such a constitution, the capacitor $C_1$ formed in the gate pad part has the structure where "the poly-silicon layer 136 which constitutes one electrode", "a field insulation layer 134 which constitutes a dielectric and a p+-type diffusion region 158", and "an n⁻-type drift layer 114 which constitutes another electrode" are laminated to each other (see FIG. 3B).

On the other hand, as shown in FIG. 3A, in the semiconductor device 100 according to the embodiment 1, a gate-drain capacitance takes a value obtained by adding capacitances of capacitors $C_2$, $C_3$ formed in the gate pad part to a capacitance of a capacitor $C_0$ formed in the MOSFET part. In such a constitution, the capacitor $C_2$ is a capacitor formed in a region where the p⁺-type diffusion region 132a and the p⁺-type diffusion region 132b are formed on a surface of the drift layer 114. The capacitor $C_2$ is formed of: "the poly-silicon layer 136 which constitutes one electrode", "the field insulation layer 134 which constitutes a dielectric and the p⁺-type diffusion regions (the p⁺-type diffusion region 132a and the p⁺-type diffusion region 132b)", and "the drift layer 114 which constitutes another electrode". The capacitor $C_3$ is a capacitor formed in the p-type impurity non-diffusion regions 132c, 132d on a surface of the drift layer 114. The capacitor $C_3$ is formed of "the poly-silicon layer 136 which constitutes one electrode", "the field insulation layer 134 which constitutes a dielectric", and "the drift layer 114 which constitutes another electrode".

In the semiconductor device 100 according to the embodiment 1, usually, the field insulation layer 134 is formed extremely thin compared with the p⁺-type diffusion regions 132a, 132b (field insulation layer 134: 200 nm to 500 nm, p⁺-type diffusion regions 132a, 132b: 2.4 μm to 8.0 μm). Accordingly, among the capacitors $C_1$, $C_2$ and $C_3$, the capacitance of the capacitor $C_3$ is extremely increased. As a result, the gate-drain capacitance Crss of the semiconductor device 100 according to the embodiment 1 becomes larger than the gate-drain capacitance Crss of the conventional semiconductor device 800 (or the semiconductor device 100A according to the comparison example 1).

In the semiconductor device 100 according to the embodiment 1, the narrow regions each of which is sandwiched by the p⁺-type diffusion regions which are disposed adjacent to each other on the surface of the drift layer 114 (the p-type impurity non-diffusion regions 132c each of which is sandwiched by the p⁺-type diffusion region 132a and the p⁺-type diffusion regions 132, and the p-type impurity non-diffusion regions 132d each of which is sandwiched by the p⁺-type diffusion regions 132b which are disposed adjacent to each other) form current paths (see FIG. 3A). Further, in the current paths, at the time of switching off the semiconductor device, a depletion layer spreads toward a drift layer side from the p⁺-type diffusion regions (the p⁺-type diffusion region 132a and the p⁺-type diffusion regions 132b) (see FIG. 4A to FIG. 4E) and hence, a resistance having a relatively large resistance (see a resistance R3 in FIG. 3A) is formed in the above-mentioned narrow regions.

As a result, in the semiconductor device 100 according to the embodiment 1, a large capacitance and a large resistance can be formed between the gate and the drain and hence, it is possible to suppress a gate oscillation phenomenon which occurs at the time of switching off the semiconductor device without externally connecting the capacitance and the resistance between the gate and the drain.

The p⁺-type diffusion region 132b is in a floating state and hence, at the time of applying a reverse bias voltage, it is usually considered that depletion layers do not spread toward a drift layer side from the p⁺-type diffusion region 132b. However, as shown in FIG. 4A to FIG. 4C, in the semiconductor device 100 of the embodiment 1, at the time of applying a reverse bias voltage, in the course that the depletion layers "d" spread toward the drift layer side from the p⁺-type diffusion region 132a electrically connected with the source electrode layer 128, the depletion layers "d" spreading from the p⁺-type diffusion region 132a are brought into contact with the p⁺-type diffusion region 132b. Accordingly, a potential of the p⁺-type diffusion region 132b becomes equal to a potential of the p⁺-type diffusion region 132a and, thereafter, as shown in FIG. 4C to FIG. 4E, the depletion layers spread to the drift layer side also from the p⁺-type diffusion region 132b.

Further, the semiconductor device 100 according to the embodiment 1 is provided with the gate oscillation suppressing structure 132 which includes the p⁺-type diffusion region 132a which is disposed along an outer peripheral portion of the gate pad part in an annular manner and is electrically connected with the source electrode layer 128 and the p⁺-type diffusion region 132b in a floating state and the p-type impurity non-diffusion regions 132c, 132d which are alternately formed in the region surrounded by the p⁺-type diffusion region 132a. Accordingly, as shown in FIG. 4A to FIG. 4E, at the time of applying a reverse bias voltage, the respective depletion layers extend in the lateral direction, are brought into contact with each other, and extend toward the low resistance semiconductor layer 112 over the whole area of the gate pad part. Accordingly, in the same manner as the conventional semiconductor device 800, the present invention can provide a semiconductor device having a high breakdown strength.

In the conventional semiconductor device 800, the p region 71 is formed over the whole area of the gate pad part and hence, a pn junction area is large and hence, a carrier injection amount at the time of switching off the semiconductor device 800 is also increased. Accordingly, the conventional semiconductor device 800 has a drawback that a reverse recovery period trr extends and also have a drawback that a reverse recovery peak current IPR is increased. To the contrary, the semiconductor device 100 of the embodiment 1 is, in the gate pad part, provided with the gate oscillation suppressing structure 132 which includes the p⁺-type diffusion region 132a which is disposed along an outer peripheral portion of the gate pad part and is electrically connected with the first electrode layer and the p⁺-type diffusion region 132b in a floating state and the p-type impurity non-diffusion regions 132c, 132d which are alternately formed in the region surrounded by the p⁺-type diffusion region 132a. Accordingly, a pn junction area is small and a carrier injection amount at the time of switching off the semiconductor device is also decreased. Accordingly, the semiconductor 100 of the embodiment 1 has an advantage that a reverse recovery period trr becomes short and also has an advantage that a reverse recovery peak current IPR is decreased. Further, according to the semiconductor 100 of the embodiment 1, the p⁺-type diffusion region 132b of the gate pad part is in a floating state and hence, compared to the case where the p⁺-type diffusion region 132b of the gate pad part is not in a floating state, an area of the p⁺-type diffusion region 132b where the impurity diffusion regions function as a body diode is decreased, and a carrier injection amount at the time of switching off the semiconductor device is also decreased. As a result, a reverse recovery period trr becomes shorter and hence, a di/dt resistance can be increased.

As described previously, in the third conventional semiconductor device 900 (or the semiconductor device 100B according to the comparison example 2), the p well layer 919 (132c) is formed in a ring shape in the lower portion of the gate pad part.

However, in the third conventional semiconductor device 900 (or the semiconductor device 100B according to the comparison example 2), to possess a larger breakdown strength than the conventional semiconductor device (the conventional semiconductor device 800 or a semiconductor device described in FIG. 3 of JP-A-5-167070) at the time of switching off the semiconductor device, a capacitance of a parasitic diode below the gate pad part is set small. Further, in the third conventional semiconductor device 900 (or the semiconductor device 100B according to the comparison example 2), the p well layer 919 (132c) is not formed at the center portion of the gate pad part and hence, a value of a resistance R3 formed at the center portion of the gate pad part becomes small. Accordingly, the third conventional semiconductor device 900, unlike the semiconductor device 100 according to the embodiment 1, cannot suppress a gate oscillation phenomenon which occurs at the time of switching off the semiconductor device.

Figure 33:
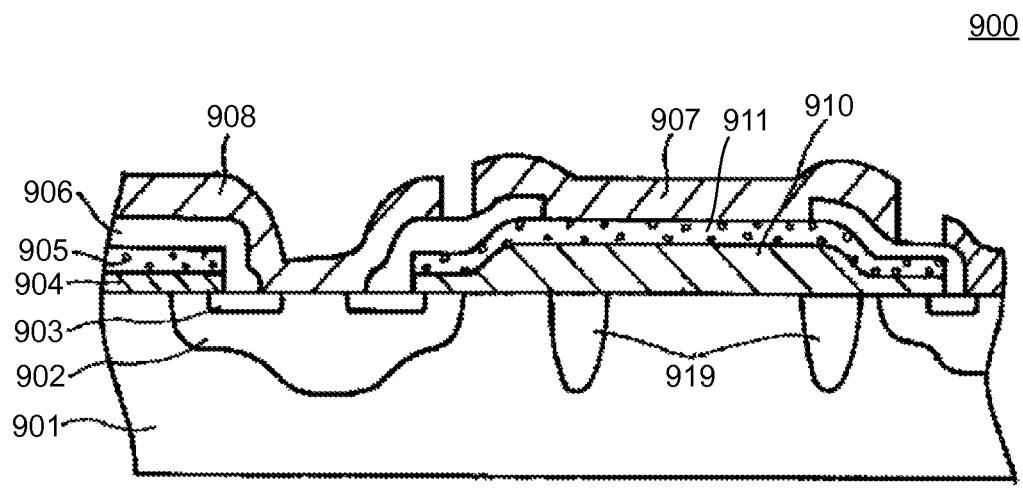
FIG. 33 is a view for explaining a conventional semiconductor device 900.

Further, in the third conventional semiconductor device 900 (or the semiconductor device 100B according to the comparison example 2), the p well layer 919 (132c) is formed in the lower portion of the gate pad part in a ring shape. That is, the p well layer 919 (132c) is not formed at the center portion of the gate pad part (see FIG. 33 and FIG. 5B) and hence, there also arises a drawback that an effect of making the spreading of a depletion layer in the lower portion of the gate pad part at the time of applying a reverse bias voltage stable is decreased.

To the contrary, the semiconductor device 100 according to the embodiment 1 is provided with the gate oscillation suppressing structure 132 which includes the p$^+$-type diffusion region 132a which is disposed along an outer peripheral portion of the gate pad part in an annular manner and is electrically connected with the source electrode layer 128 and the p$^+$-type diffusion region 132b in a floating state and the p-type impurity non-diffusion regions 132c, 132d which are alternately formed in the region surrounded by the p$^+$-type diffusion region 132a. Accordingly, in the semiconductor device 100 according to the embodiment 1, such a drawback that the third conventional semiconductor device 900 (or the semiconductor device 100B according to the comparison example 2) has does not arise.

Further, in the third conventional semiconductor device 900 (or the semiconductor device 100B according to the comparison example 2), the p well layer 919 (132c) formed in the lower portion of the gate pad part is not connected to the source electrode and hence, a depletion layer does not extend in a region where the p well layer 919 (132c) is not formed at the time of applying a reverse bias voltage and hence, a field intensity is not decreased whereby a breakdown strength is decreased.

To the contrary, the semiconductor device 100 according to the embodiment 1 is provided with the gate oscillation suppressing structure 132 which includes the p$^+$-type diffusion region 132a which is disposed along an outer peripheral portion of the gate pad part in an annular manner and is electrically connected with the source electrode layer 128 and the p$^+$-type diffusion region 132b in a floating state and the p-type impurity non-diffusion regions 132c, 132d which are alternately formed in the region surrounded by the p$^+$-type diffusion region 132a. Accordingly, in the semiconductor device 100 according to the embodiment 1, such a drawback that the third conventional semiconductor device 900 (or the semiconductor device 100B according to the comparison example 2) has does not arise.

In the semiconductor device 100 according to the embodiment 1, the interlayer insulation layer 126 is formed on the poly-silicon layer 136 which constitutes a conductor layer, and the gate pad electrode layer 138 is formed on the interlayer insulation layer 126. Accordingly, a multi-layer structure formed of the poly-silicon layer 136, the interlayer insulation layer 126 and the gate pad electrode layer 138 functions as a shock absorber when an external terminal is connected to the gate pad electrode layer 138 and hence, the embodiment can provide a highly reliable semiconductor device.

In the semiconductor device 100 according to the embodiment 1, as shown in FIG. 2A, the poly-silicon layer 136 is electrically connected with the gate electrode layer 124 via the gate finger part which connects the gate pad electrode layer 138 and the gate electrode layer 124 to each other, and no portion of the poly-silicon layer 136 is directly connected with the gate electrode layer 124 without interposing the gate finger part therebetween (see portions indicated by symbol D in FIG. 2A). Accordingly, a distance between the gate pad electrode layer 138 and the gate electrode layer 124 in the semiconductor device 100 according to the embodiment 1 becomes longer than the semiconductor device 100B according to the comparison example 2 where the gate pad electrode layer 138 is directly connected with the gate electrode layer 124 (see a portion indicated by symbol C in FIG. 5B). Due to such constitution also, it is also possible to suppress a gate oscillation phenomenon.

The semiconductor device 100 according to the embodiment 1 has the structure where the source region 120 on a gate pad part side is eliminated in a cell adjacent to the gate pad part (see a portion indicated by symbol B in FIG. 5A). In this manner, the semiconductor device 100 according to the embodiment 1 has the structure where the source region 120 which is the closest region to the gate pad part and where a gate oscillation phenomenon is most likely to occur is eliminated. Also due to such constitution, it is possible to suppress a gate oscillation phenomenon.

In the semiconductor device 100 according to the embodiment 1, the p$^+$-type diffusion regions 132a, 132b in the gate pad part are formed in the same step for forming the p$^+$-type projecting diffusion regions 118 in the MOSFET part and hence, it is unnecessary to perform an extra step for forming the p$^+$-type diffusion regions 132a, 132b in the gate pad part. Further, the p$^+$-type diffusion region 132a in the gate pad part is formed continuously with the p$^+$-type projecting diffusion region 118 in the MOSFET part and hence, a potential equal to a potential of the p$^+$-type projecting diffusion region 118 in the MOSFET part is applied to the p$^+$-type diffusion region 132a (and the p$^+$-type diffusion region 132b) in the gate pad part. As a result, the depletion layers in the drift layer 114 extend toward the drain layer at the time of applying a reverse bias voltage and hence, the embodiment 1 can provide a semiconductor device having a high breakdown strength.

In the semiconductor device 100 according to the embodiment 1, the p-type impurity non-diffusion regions 132d are formed in a stripe shape inside the p$^+$-type diffusion region 132b and hence, the p-type impurity non-diffusion regions 132d are easily depleted at the time of applying a reverse bias voltage. Due to such a constitution also, the embodiment 1 can provide a semiconductor device having a high breakdown strength.

In the semiconductor device 100 according to the embodiment 1, the p$^+$-type diffusion regions 132a, 132b do not include an n-type semiconductor region therein and hence, a reach through phenomenon does not occur whereby the embodiment 1 can also acquire an advantageous effect that a high breakdown strength can be assured.

In the semiconductor device 100 according to the embodiment 1, the field insulation layer 134 which is required to possess a high insulation property because of having a large area has a larger thickness than the thickness of the gate insulation layer 122 and hence, the embodiment 1 can provide a highly reliable semiconductor device having an excellent insulation property.

In the semiconductor device 100 according to the embodiment 1, a ratio of an area of a portion in the gate pad part where the poly-silicon layer 136 which constitutes the conductor layer faces the drift layer 114 in an opposed manner with the field insulation layer 134 interposed therebetween to the whole area of the gate pad part is set larger than a ratio of an area of a portion in the MOSFET part where the gate electrode layer 124 faces the drift layer 114 in an opposed manner with the gate insulation layer 122 interposed therebetween to the whole area of the MOSFET part and hence, it is possible to effectively increase a gate-drain capacitance Crss.

3. Method of Manufacturing a Semiconductor Device According to Embodiment 1

The semiconductor device 100 according to the embodiment 1 can be manufactured by a manufacturing method having the following manufacturing steps (method of manufacturing a semiconductor device according to the embodiment 1). FIG. 6A to FIG. 10C are views for explaining the method of manufacturing the semiconductor device according to the embodiment 1. FIG. 6A to FIG. 10C show the respective steps.

(1) Preparation of Semiconductor Substrate

A semiconductor substrate 110 is prepared by forming a silicon layer which constitutes the drift layer 114 on a silicon substrate which constitutes the low resistance semiconductor layer 112 by an epitaxial growth method. A thickness of the low resistance semiconductor layer 112 is set to 100 µm to 400 µm, for example, and an impurity concentration in the low resistance semiconductor layer 112 is set to $1 \times 10^{19}$ cm$^{-3}$ to $1 \times 10^{20}$ cm$^{-3}$. A thickness of the drift layer 114 is set to 5 µm to 50 µm, and an impurity concentration in the drift layer 114 is set to $1 \times 10^{14}$ cm$^{-3}$ to $1 \times 10^{16}$ cm$^{-3}$.

Figure 6A:
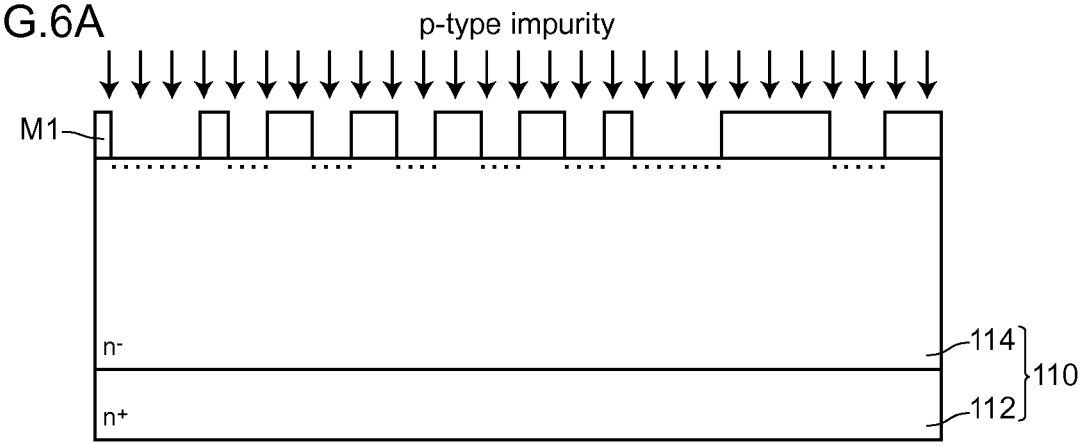
FIG. 6A to FIG. 6C are views for explaining a method of manufacturing the semiconductor device according to the first embodiment.

(2) Formation of p$^+$-Type Projecting Diffusion Region, p$^+$-Type Diffusion Region and Field Insulation Layer Then, a p-type impurity is introduced into the regions on a surface of the drift layer 114 corresponding to the p$^+$-type projecting diffusion regions 118 and regions corresponding to the p$^+$-type diffusion regions 132a, 132b in such a manner that a silicon dioxide thin film M1 which has openings in regions corresponding to the p$^+$-type projecting diffusion regions 118 and regions corresponding to the p$^+$-type diffusion regions 132a, 132b is formed, and a p-type impurity (boron ion, for example) is injected into the surface of the drift layer 114 through the silicon dioxide thin film M1 by an ion implantation method (see FIG. 6A).

Figure 6B:
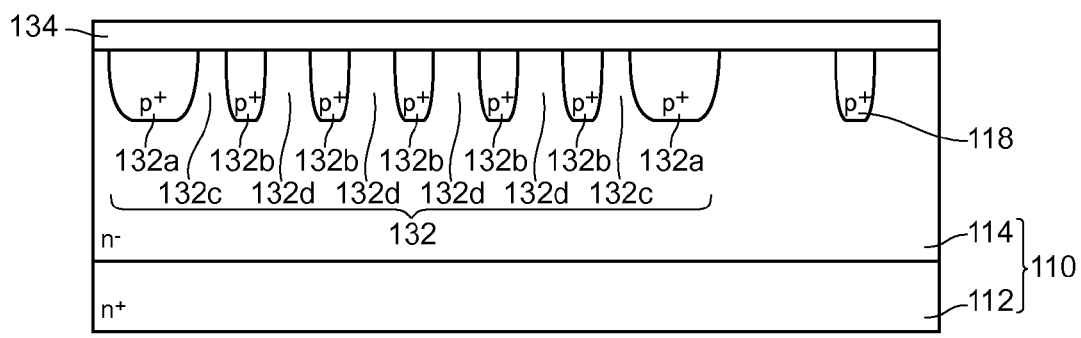

Then, a heat treatment is applied to the semiconductor substrate 110 in an oxygen gas containing atmosphere thus forming the p$^+$-type projecting diffusion region 118 and the p$^+$-type diffusion regions 132a, 132b (see FIG. 6B). A forming depth of the p$^+$-type projecting diffusion region 118 and a forming depth of the p$^+$-type diffusion regions 132a, 132b are set to 2.4 µm to 8.0 µm, and an impurity concentration in the p$^+$-type projecting diffusion region 118 and an impurity concentration in the p$^+$-type diffusion regions 132a, 132b are set to $1 \times 10^{17}$ cm$^{-3}$ to $3 \times 10^{18}$ cm$^{-3}$. Here, in the gate pad part, the p-type impurity non-diffusion regions 132c, 132d are formed on portions of a surface of the drift layer 114 where the p-type impurity is not diffused. A surface of the drift layer 114 is thermally oxidized so that the field insulation layer 134 is formed. A thickness of the field insulation layer 134 is set to 450 nm, for example.

(3) Formation of Gate Insulation Layer and Gate Electrode Layer

Figure 6C:
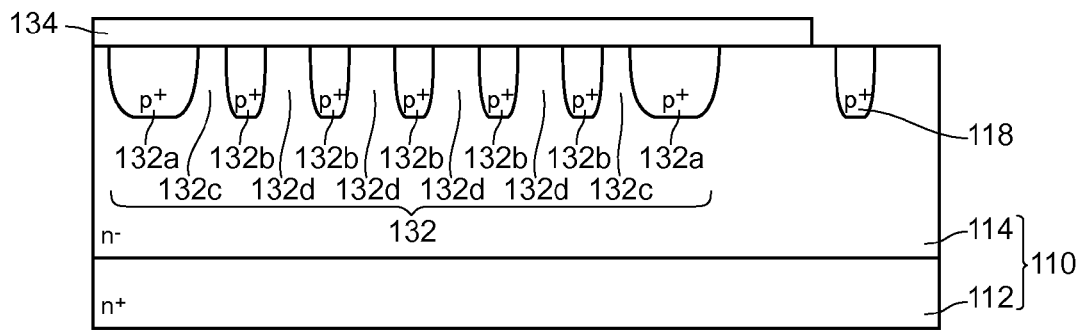

Then, after a mask (not shown in the drawing) having openings is formed in the MOSFET part, and the field insulation layer 134 is etched so as to expose the drift layer 114 in the MOSFET part (see FIG. 6C). Then, a heat treatment is applied to the semiconductor substrate 110 in an oxygen gas containing atmosphere so that a surface of the drift layer 114 is thermally oxidized whereby a gate insulation layer 122 is formed in the MOSFET part (see FIG. 7A). A thickness of the gate insulation layer 122 is set to 100 nm, for example.

Figure 7A:
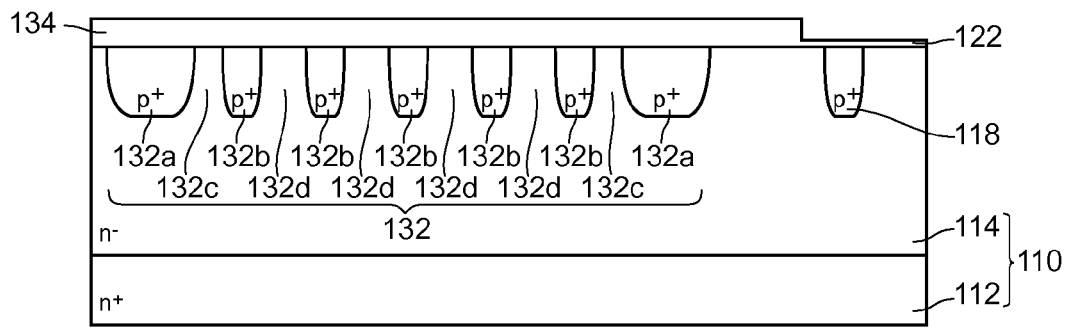
FIG. 7A to FIG. 7C are views for explaining the method of manufacturing the semiconductor device according to the first embodiment.
Figure 7B:
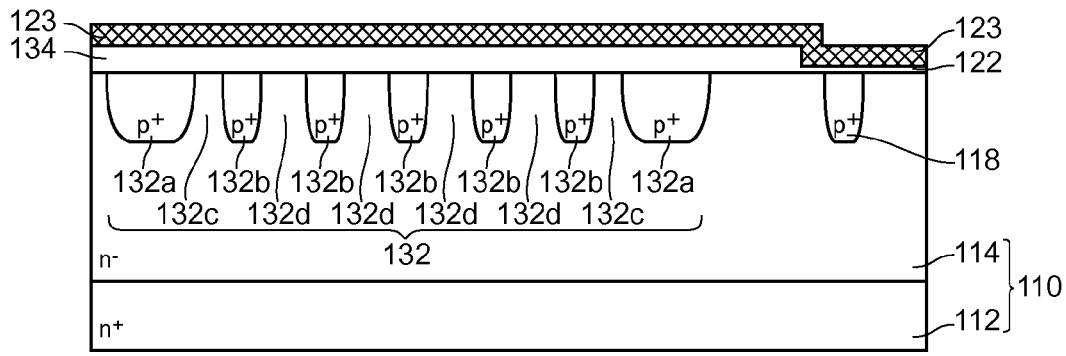
Figure 7C:
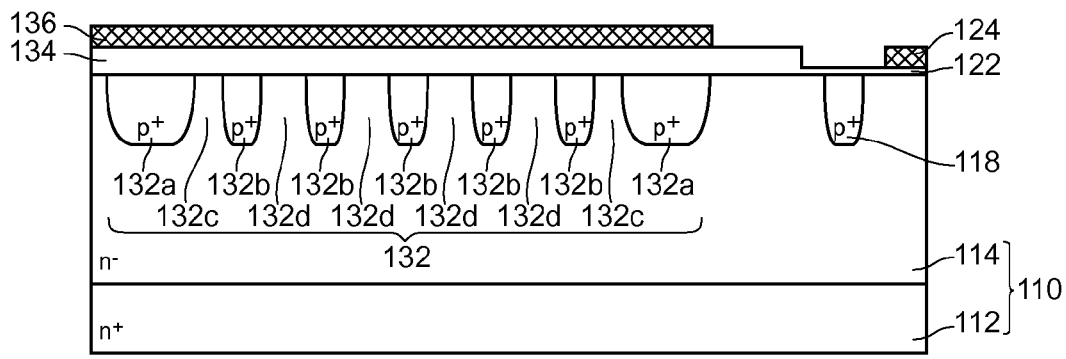

Then, a low resistance poly-silicon layer 123 is formed by a CVD method on a surface of the field insulation layer 134 and a surface of the gate insulation layer 122 (see FIG. 7B). A thickness of the poly-silicon layer 123 is set to 500 nm, for example. Then, a mask (not shown in the drawing) is formed on regions corresponding to the poly-silicon layer 136 and regions corresponding to the gate electrode layers 124 to be formed and, thereafter, the poly-silicon layer 123 is etched thus forming the gate electrode layers 124 in the MOSFET part and the poly-silicon layer 136 in the gate pad part (see FIG. 7C).

(4) Formation of Base Region

Figure 8A:
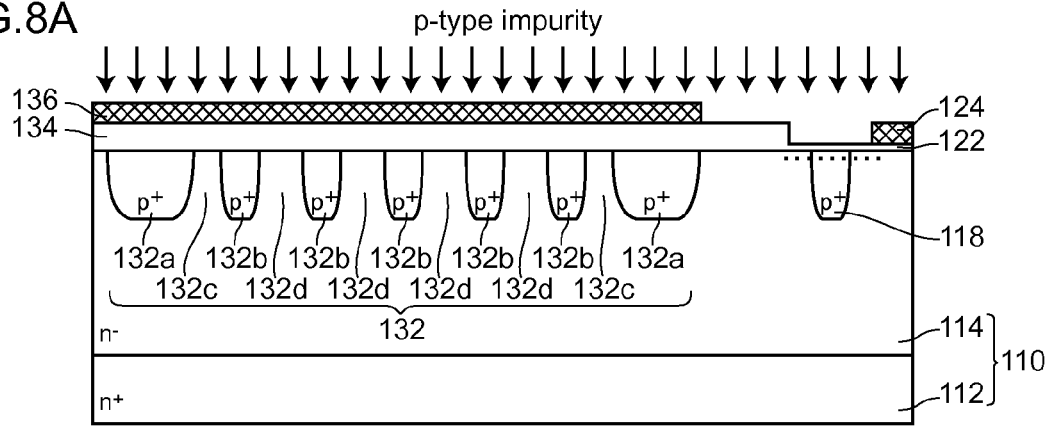
FIG. 8A to FIG. 8C are views for explaining the method of manufacturing the semiconductor device according to the first embodiment.

Then, a p-type impurity is introduced into the regions on a surface of the drift layer 114 corresponding to the base regions 116 to be formed by injecting a p-type impurity (boron ion, for example) into the surface of the drift layer 114 with the gate insulation layer 122 interposed therebetween by an ion implantation method using the field insulation layer 134 and the gate electrode layers 124 as masks (see FIG. 8A).

Figure 8B:
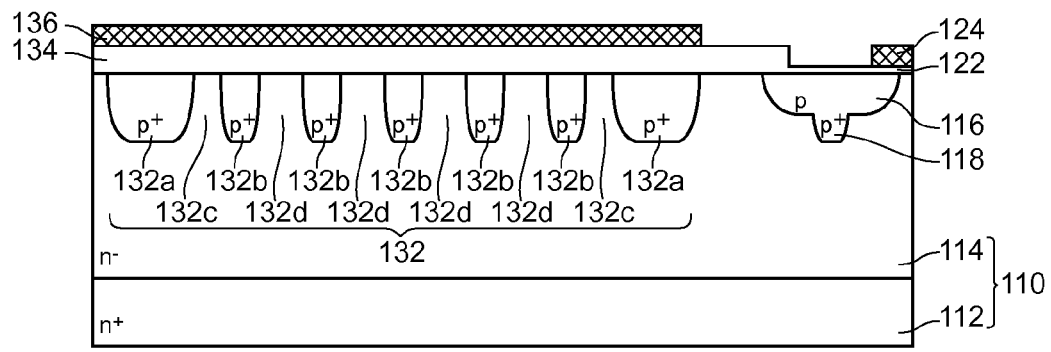
Figure 8C:
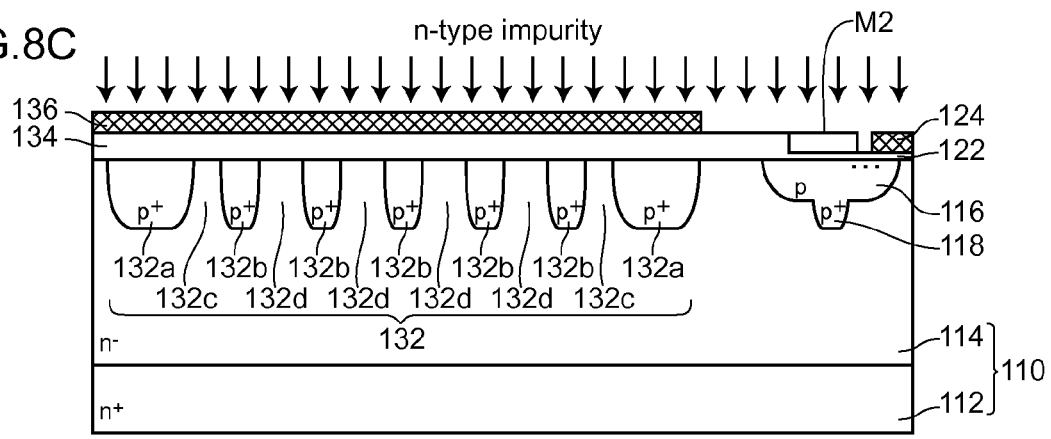

Then, an annealing treatment for activating a p-type impurity is performed by applying a heat treatment to the semiconductor substrate 110 thus forming the base regions 116 (see FIG. 8B). A depth of the base region 116 is set to 2 µm to 2.5 µm, and an impurity concentration in the base region 116 is set to $5 \times 10^{16}$ cm$^{-3}$ to $1 \times 10^{18}$ cm$^{-3}$.

(5) Formation of Source Regions

Then, a mask M2 is formed on regions on the gate insulation layers 122 except for regions where the source regions 120 are to be formed. An n-type impurity is introduced into the regions on a surface of the drift layer 114 corresponding to the source regions 120 by injecting an n-type impurity (phosphorous ion, for example) into the surface of the drift layer 114 with the gate insulation layer 122 interposed therebetween by an ion implantation method using the mask M2, the gate electrode layer 124 and the field insulation layer 134 as masks (see FIG. 8C).

Figure 9A:
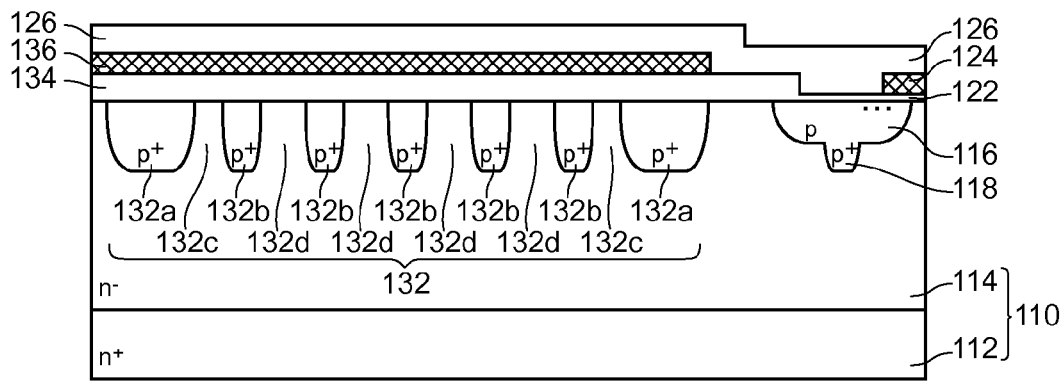
FIG. 9A to FIG. 9C are views for explaining the method of manufacturing the semiconductor device according to the first embodiment.
Figure 9B:
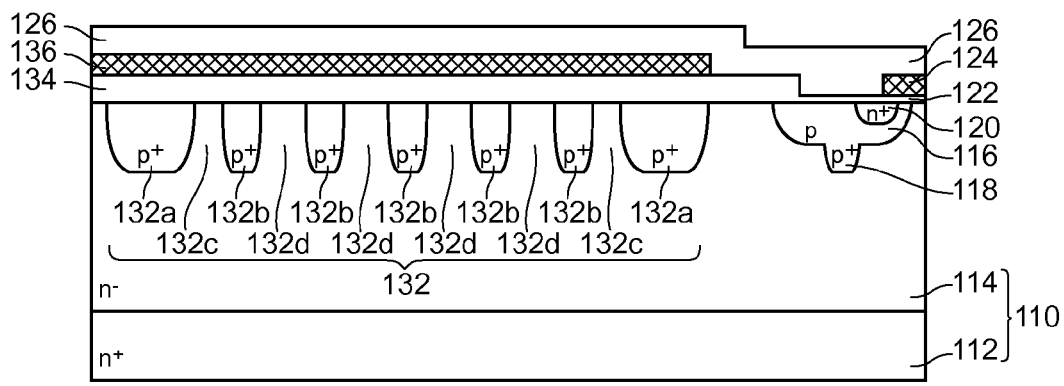
Figure 9C:
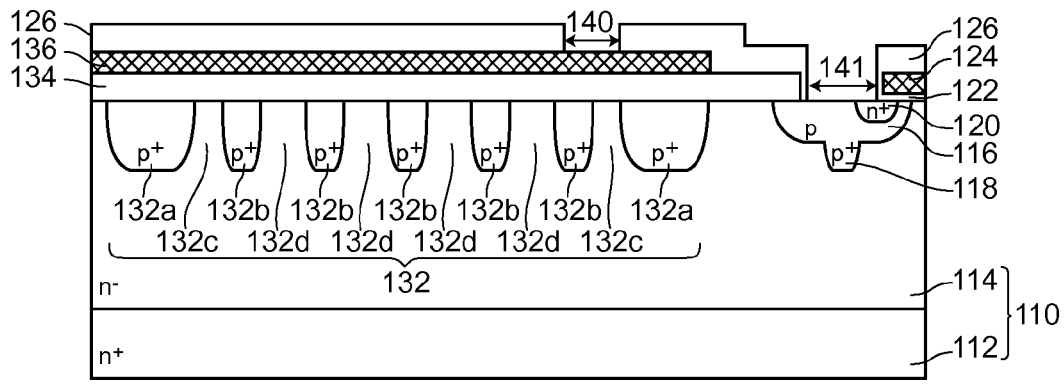

Then, the mask M2 is removed and, thereafter, the interlayer insulation layer 126 formed of PSG and having a thickness of 1000 nm, for example, is formed over the whole area of the semiconductor substrate 110 on a first main surface side by a CVD method (see FIG. 9A). Then, an annealing treatment for activating the n-type impurity is performed by applying a heat treatment to the semiconductor substrate 110 thus forming the source regions 120 (see FIG. 9B). A depth of the source region 120 is set to 0.2 µm to 0.4 µm, and an impurity concentration in the source region 120 is set to $5 \times 10^{19}$ cm$^{-3}$ to $2 \times 10^{20}$ cm$^{-3}$.

Figure 10A:
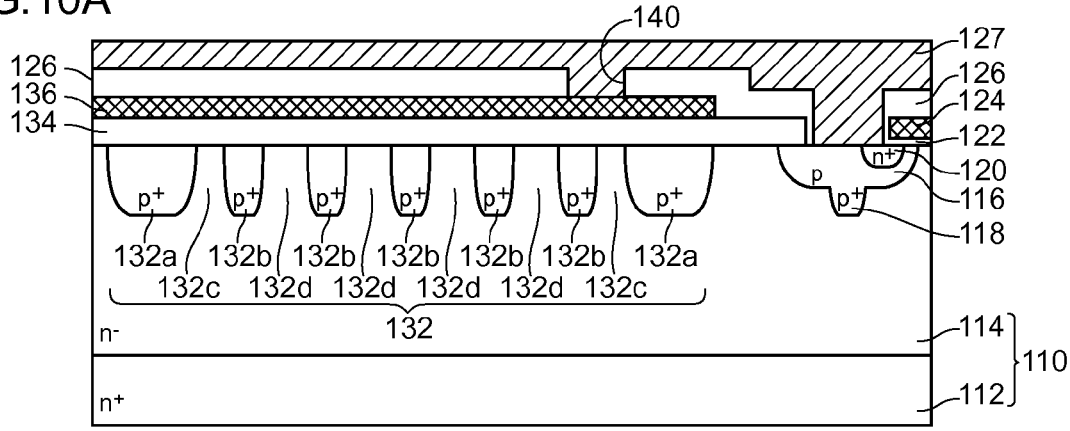
FIG. 10A to FIG. 10C are views for explaining the method of manufacturing the semiconductor device according to the first embodiment.
Figure 10B:
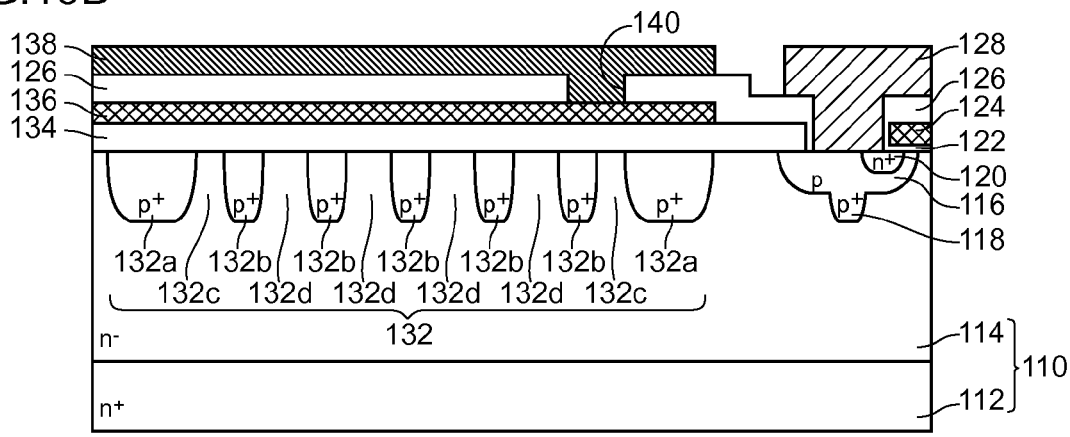

(6) Formation of Source Electrode Layer, Gate Pad Electrode Layer and Drain Electrode Layer Then, the interlayer insulation layer 126 formed on a portion (through holes 140) where the gate pad electrode layer 138 to be formed is brought into contact with the poly-silicon layer 136 and portions (contact holes 141) where the source electrode layer 128 is brought into contact with the source regions 120 and the base regions 116 is selectively removed respectively (see FIG. 9C) and, thereafter, a metal layer 127 made of aluminum is formed from above the interlayer insulation layer 126 by a sputtering method (see FIG. 10A). Then, the metal layer 127 is divided into the source electrode layer 128 and the gate pad electrode layer 138 by removing predetermined regions of the metal layer 127 by etching thus forming the source electrode layer 128 and the gate pad electrode layer 138 (see FIG. 10B). A thickness of the source electrode layer 128 and a thickness of the gate pad electrode layer 138 are set to 4 µm, for example.

Figure 10C:
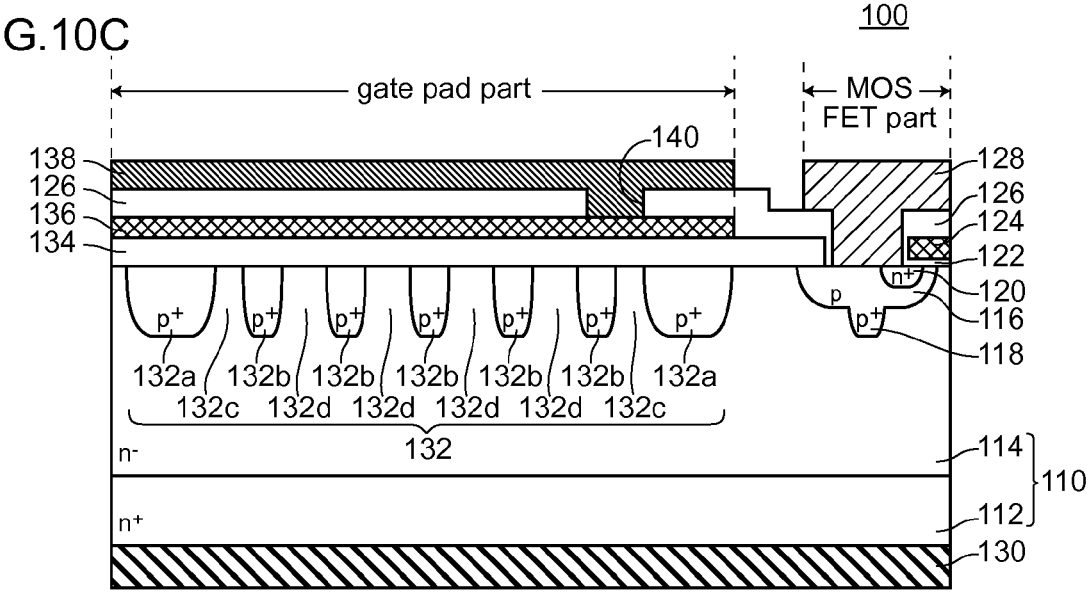

Then, a metal film formed of a multi-layered metal film such as a Ti—Ni—Au film is formed on a surface of the semiconductor substrate 110 on a second main surface side (surface of the low resistance semiconductor layer 112) thus forming the drain electrode layer 130 (see FIG. 10C). A thickness of the drain electrode layer 130 is set to 0.5 µm, for example, over the whole multi-layered metal film.

The semiconductor device 100 according to the embodiment 1 can be manufactured through the above-mentioned steps.

Embodiments 2 to 5

Figure 11:
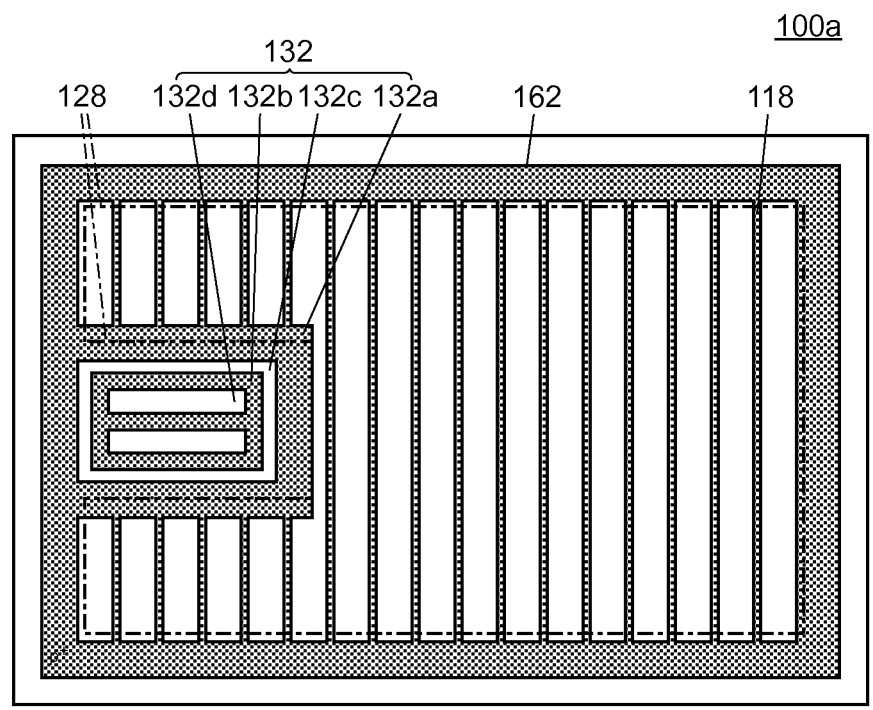
FIG. 11 is a view for explaining a semiconductor device 100a according to a second embodiment.
Figure 12:
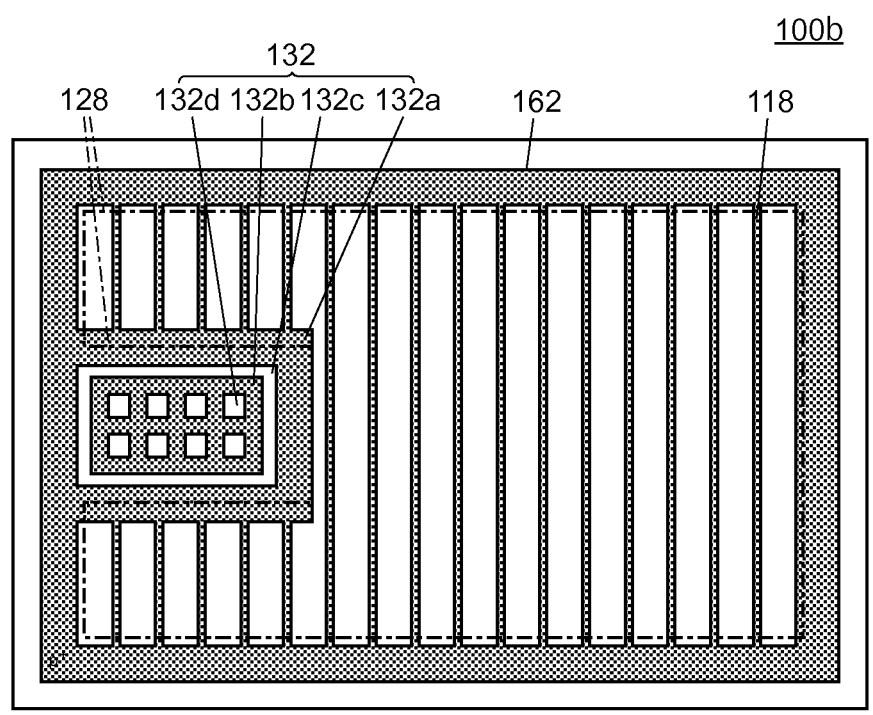
FIG. 12 is a view for explaining a semiconductor device 100b according to a third embodiment.
Figure 13:
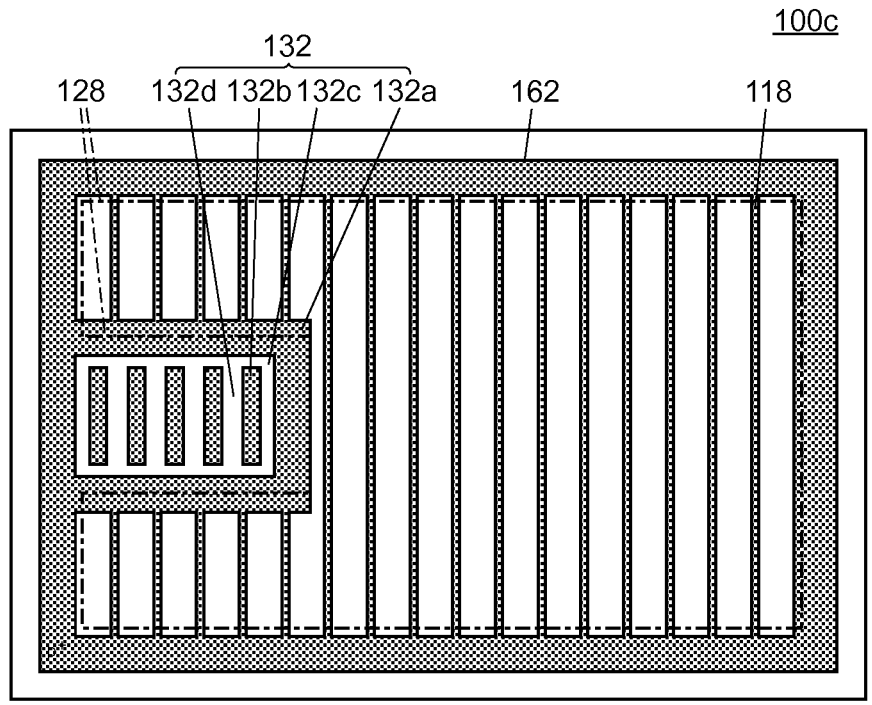
FIG. 13 is a view for explaining a semiconductor device 100c according to a fourth embodiment.
Figure 14:
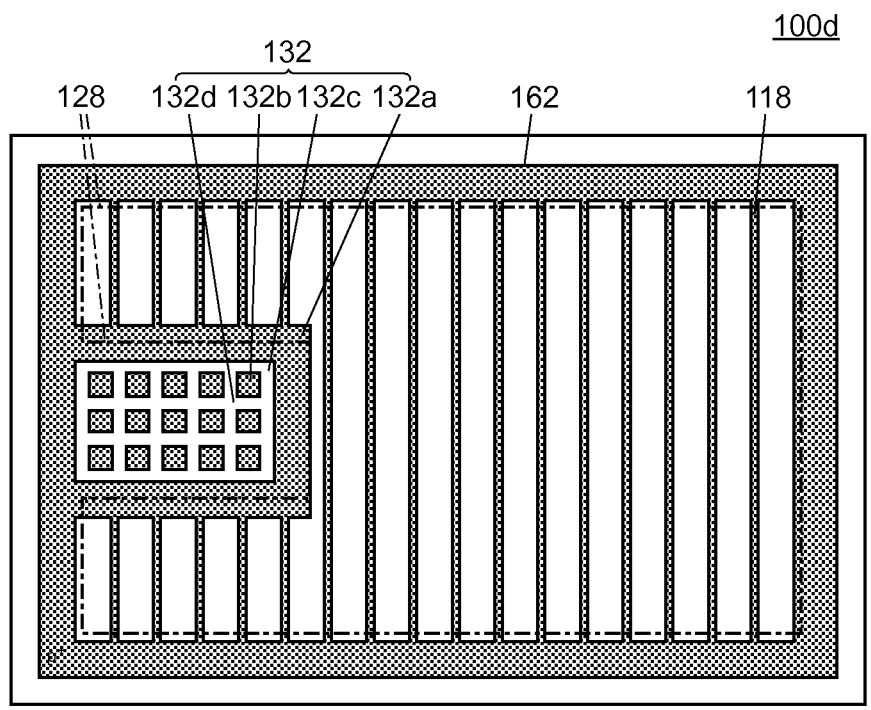
FIG. 14 is a view for explaining a semiconductor device 100d according to a fifth embodiment.

FIG. 11 is a plan view of a semiconductor device 100a of an embodiment 2. FIG. 12 is a plan view of a semiconductor device 100b of an embodiment 3. FIG. 13 is a plan view of a semiconductor device 100c of an embodiment 4. FIG. 14 is a plan view of a semiconductor device 100d of an embodiment 5. In FIG. 11, FIG. 12, FIG. 13 and FIG. 14, only a profile line (indicated by a chain line) is indicated with respect to p$^+$-type projecting diffusion regions 118, p$^+$-type diffusion regions 132a, 132b, 162, p-type impurity non-diffusion regions 132c, 132d, a gate oscillation suppressing structure 132 and a source electrode layer 128.

Although the semiconductor devices 100a to 100d according to the embodiments 2 to 5 basically have the substantially same constitution as the semiconductor device 100 according to the embodiment 1, the semiconductor devices 100a to 100d according to the embodiments 2 to 5 differ from the semiconductor device 100 according to the embodiment 1 in the planar structure of the gate oscillation suppressing structure 132. That is, as shown in FIG. 11, in the semiconductor device 100a according to the embodiment 2, unlike the case of the semiconductor device 100 according to the embodiment 1, the direction of the stripe of p$^+$-type diffusion region 132a and the direction of the stripe of the p-type impurity non-diffusion regions 132d are orthogonal to the direction of the stripe of the p$^+$-type projecting diffusion regions 118. As shown in FIG. 12, in the semiconductor device 100b according to the embodiment 3, p-type impurity non-diffusion regions 132d are formed in an island-like shape inside the p$^+$-type diffusion region 132b. As shown in FIG. 13, in the semiconductor device 100c according to the embodiment 4, a p-type impurity non-diffusion region 132c is formed in a region surrounded by the p$^+$-type diffusion region 132a, and the p$^+$-type diffusion regions 132b and the p-type impurity non-diffusion regions 132d are formed in a stripe shape inside the p-type impurity non-diffusion region 132c. As shown in FIG. 14, in the semiconductor device 100d according to the embodiment 5, a p-type impurity non-diffusion region 132c is formed in a region surrounded by the p$^+$-type diffusion region 132a, p$^+$-type diffusion regions 132b are formed in an island shape inside the p-type impurity non-diffusion region 132c, and a p-type impurity non-diffusion region 132d is formed in a grid shape inside the p-type impurity non-diffusion region 132c.

Embodiments 6 and 7

Figure 15:
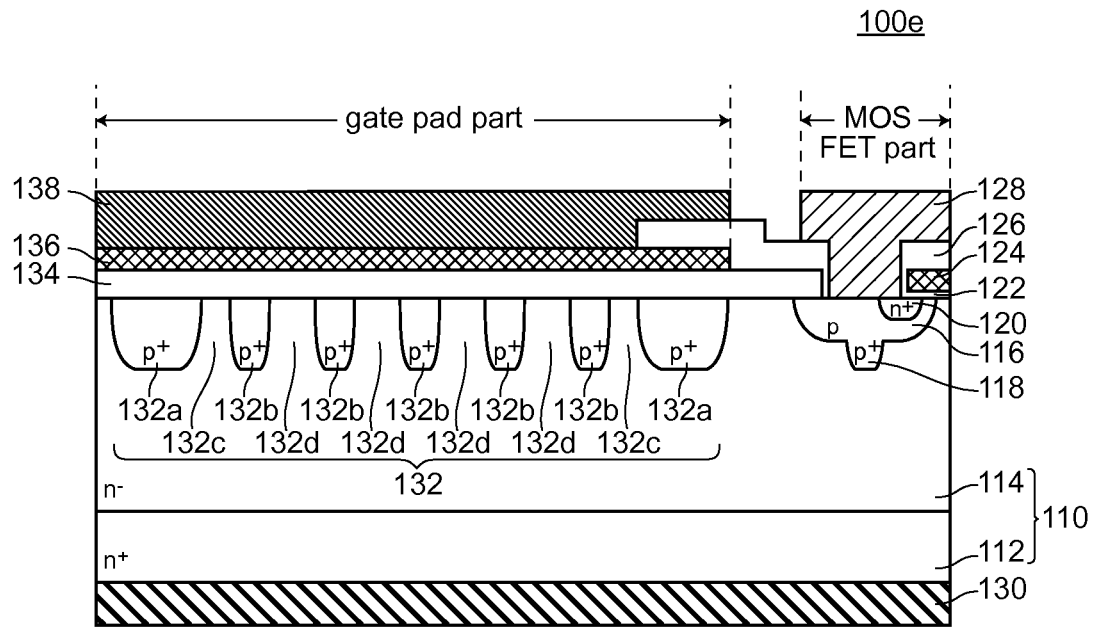
FIG. 15 is a cross-sectional view of a semiconductor device 100e according to a sixth embodiment.
Figure 16:
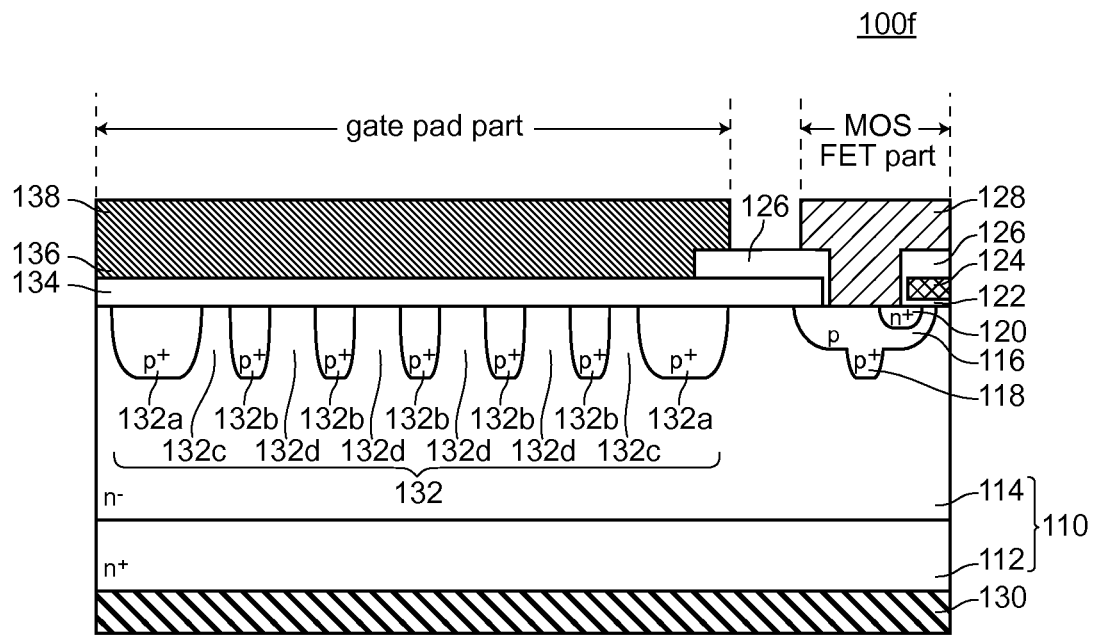
FIG. 16 is a cross-sectional view of a semiconductor device 100f according to a seventh embodiment.

FIG. 15 is a cross-sectional view of a semiconductor device 100e according to an embodiment 6. FIG. 16 is a cross-sectional view of a semiconductor device 100f according to an embodiment 7.

Although the semiconductor devices 100e, 100f according to the embodiments 6 and 7 basically have the substantially same constitution as the semiconductor device 100 according to the embodiment 1, the semiconductor devices 100e, 100f according to the embodiments 6 and 7 differ from the semiconductor device 100 according to the embodiment 1 in the electrode lamination structure in a gate pad part. That is, as shown in FIG. 15, in the semiconductor device 100e according to the embodiment 6, a gate pad electrode layer 138 is directly formed over the substantially whole surface of a poly-silicon layer 136 which constitutes a conductor layer without interposing an interlayer insulation layer 126 therebetween. On the other hand, as shown in FIG. 16, in the semiconductor device 100f according to the embodiment 7, a gate pad electrode layer 138 which constitutes a conductor layer is directly formed over the substantially whole surface of a field insulation layer 134 without interposing a poly-silicon layer therebetween.

Embodiment 8

Figure 17A:
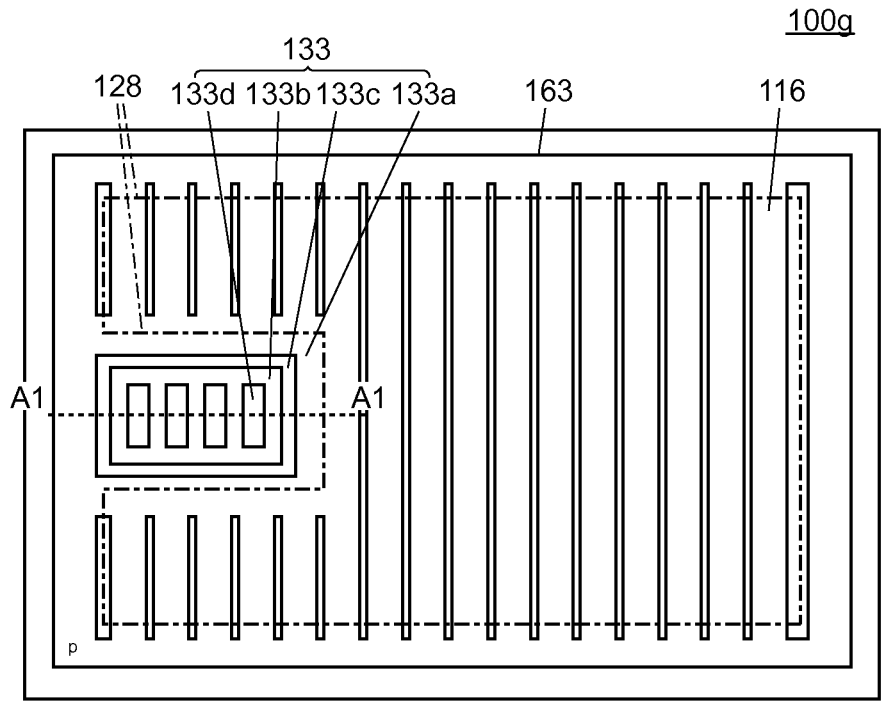
FIG. 17A and FIG. 17B are views for explaining a semiconductor device 100g according to an eighth embodiment.
Figure 17B:
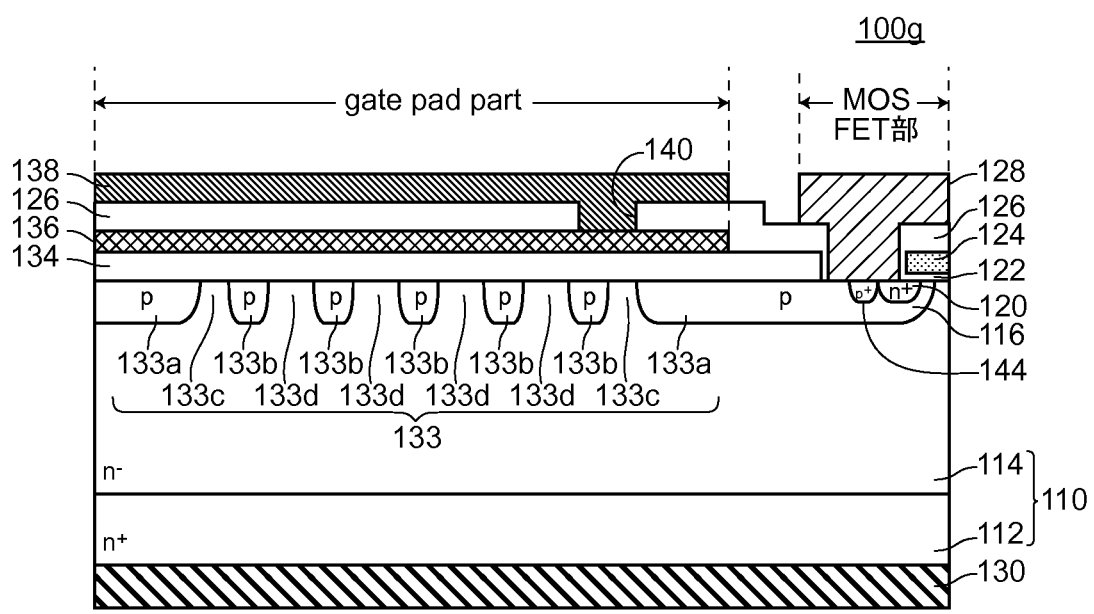

FIG. 17A and FIG. 17B are views for explaining a semiconductor device 100g according to an embodiment 8. FIG. 17A is a plan view of the semiconductor device 100g, and FIG. 17B is a cross-sectional view taken along a line A1-A1 in FIG. 17A. In FIG. 17B, symbol 130 indicates a drain electrode layer. In FIG. 17A, only a profile line (indicated by a chain line) is indicated with respect to base regions 116, p-type diffusion regions (corresponding to the second conductive type impurity diffusion regions of the present invention) 133a, 163, a p-type impurity non-diffusion region (corresponding to the impurity non-diffusion region of a second conductive type of the present invention) 133b, a gate oscillation suppressing structure 133 and a source electrode layer 128.

Although the semiconductor device 100g according to the embodiment 8 basically has the substantially same constitution as the semiconductor device 100 according to the embodiment 1, the semiconductor device 100g according to the embodiment 8 differs from the semiconductor device 100 according to the embodiment 1 in a step of forming the second conductive type impurity diffusion region. That is, as shown in FIG. 17A and FIG. 17B, in the semiconductor device 100g according to the embodiment 8, p$^+$-type contact regions 144 are formed in place of the p$^+$-type projecting diffusion regions in a MOSFET part, and the p-type diffusion region 133a which constitutes the second conductive type impurity diffusion region is formed in the same step for forming the base regions 116 in place of being formed in the same step for forming p$^+$-type projecting diffusion regions.

Embodiments 9 to 11

Figure 18:
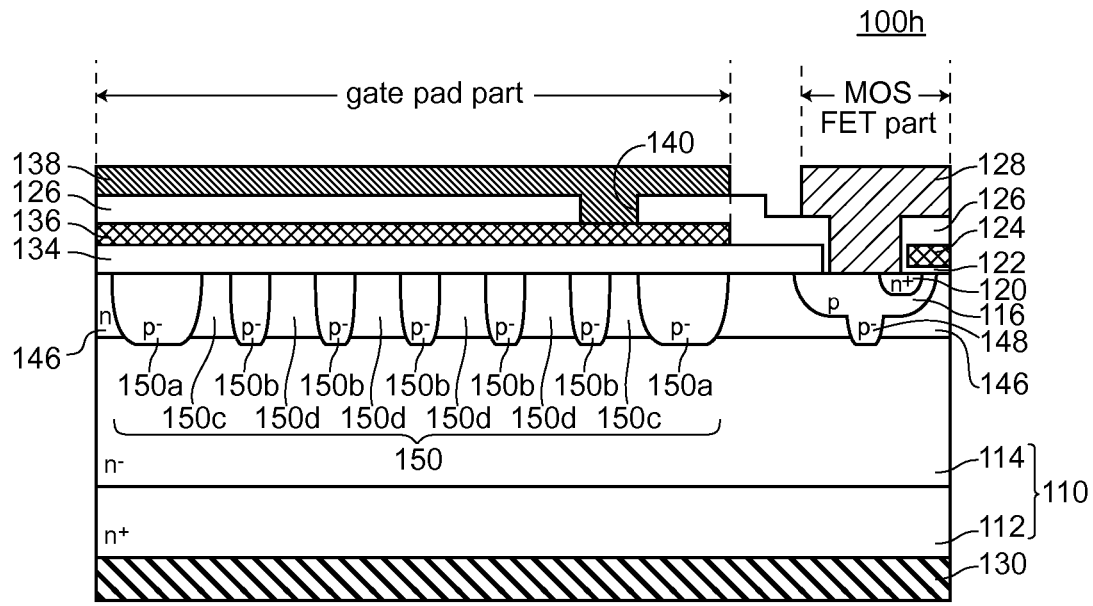
FIG. 18 is a cross-sectional view of a semiconductor device 100h according to a ninth embodiment.
Figure 19:
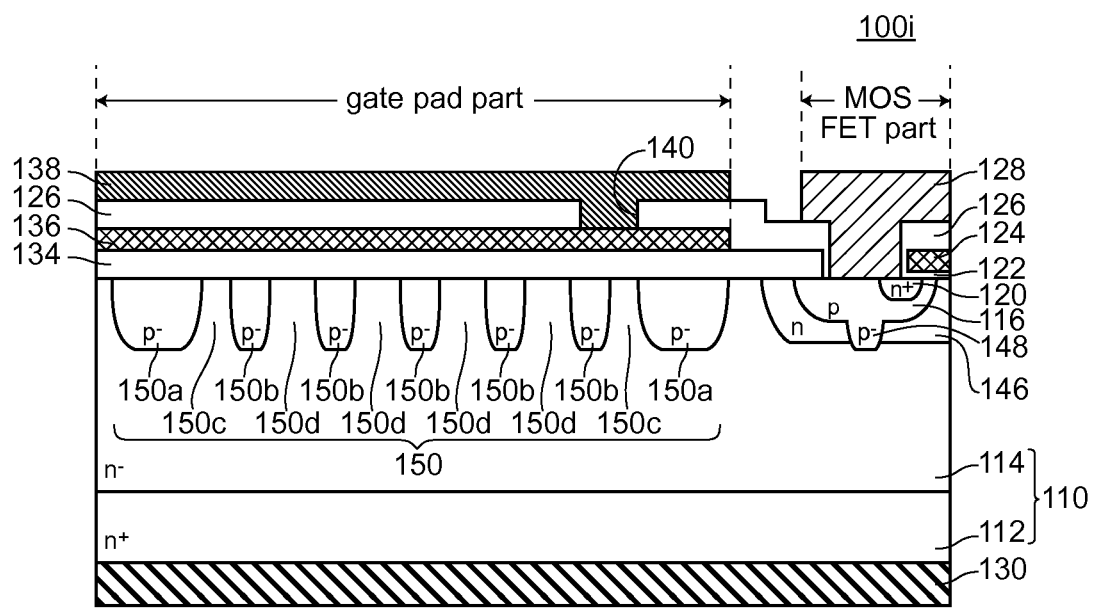
FIG. 19 is a cross-sectional view of a semiconductor device 100i according to a tenth embodiment.
Figure 20A:
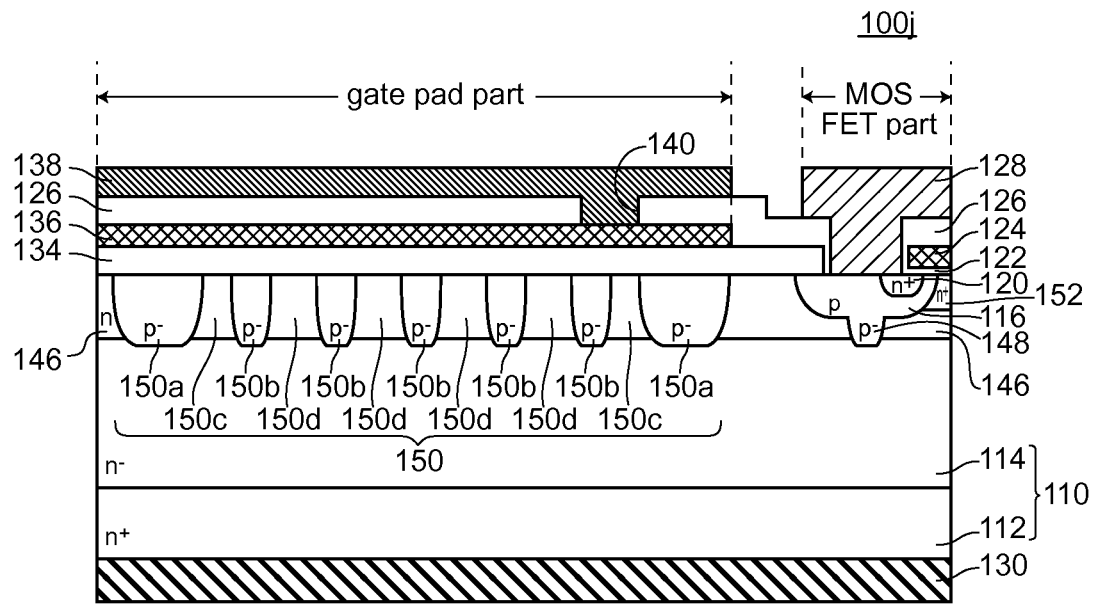
FIG. 20A and FIG. 20B are cross-sectional views of a semiconductor device 100j according to an eleventh embodiment.
Figure 20B:
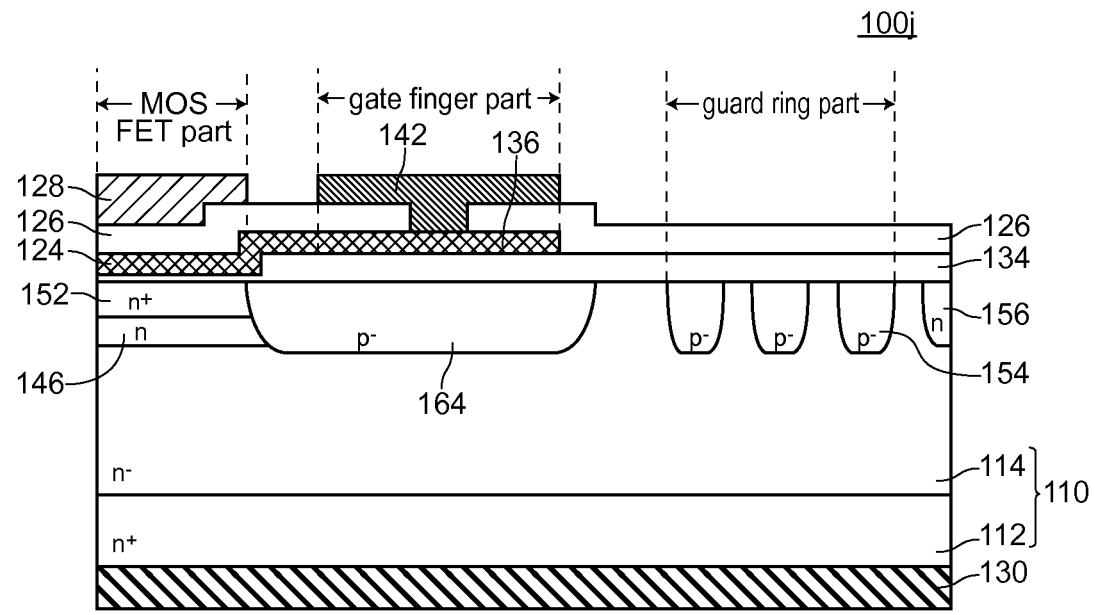

FIG. 18 is a cross-sectional view of a semiconductor device 100h according to an embodiment 9. FIG. 19 is a cross-sectional view of a semiconductor device 100i according to an embodiment 10. FIG. 20A and FIG. 20B are views for explaining a semiconductor device 100j according to an embodiment 11. FIG. 20A is a cross-sectional view of a gate pad part and a MOSFET part in the semiconductor device 100j, and FIG. 20B is a cross-sectional view of the MOSFET part, a gate finger part and a guard ring part in the semiconductor device 100j. In FIG. 18 to FIG. 20A, symbols 150c, 150d indicate p-type impurity non-diffusion regions (corresponding to the impurity non-diffusion region of a second conductive type in the present invention), and symbol 150 indicates a gate oscillation suppressing structure.

Although the semiconductor devices 100h to 100j according to the embodiments 9 to 11 basically have the substantially same constitution as the semiconductor device 100 according to the embodiment 1, the semiconductor device 100h to 100j according to the embodiments 9 to 11 differ from the semiconductor device 100 according to the embodiment 1 in a point that a p⁻-type diffusion region 150a which contains a p-type impurity having a lower concentration than base regions 116 is formed in place of a p⁺-type diffusion region 132a which contains a p-type impurity having a higher concentration than the base regions 116. That is, as shown in FIG. 18 to FIG. 20B, in the semiconductor devices 100h to 100j according to the embodiments 9 to 11, an n-type reference concentration semiconductor layer 146 is formed in the MOSFET part in a state where the n-type reference concentration semiconductor layer 146 which is shallower than the base region 116 is formed between the base regions 116 arranged adjacent to each other and the n-type reference concentration semiconductor layer 146 contains an n-type impurity having a higher concentration than a drift layer 114 and a lower concentration than source regions 120. p⁻-type projecting diffusion regions 148 which contain a p-type impurity having a lower concentration than the base regions 116 are formed in the MOSFET part in place of the p⁺-type projecting diffusion regions 118 which contain a p-type impurity having a higher concentration than the base regions 116. Further, the p⁻-type diffusion regions 150a, 150b which contain a p-type impurity having a lower concentration than the base regions 116 are formed in the gate pad part in place of the p⁺-type diffusion regions 132a, 132b which contain a p-type impurity having a higher concentration than the base regions 116. The technique for forming the n-type reference concentration semiconductor layers 146 and the p⁻-type projecting diffusion regions 148 in the MOSFET part is a technique developed by the applicant of the present invention, and this technique is disclosed in detail in JP-A-2011-228643.

Among the semiconductor devices 100h to 100j according to the embodiments 9 to 11, in the semiconductor device 100h according to the embodiment 9, the n-type reference concentration semiconductor layer 146 extends into the gate pad part (see FIG. 18). In the semiconductor device 100i according to the embodiment 10, the n-type reference concentration semiconductor layer 146 is formed only in the MOSFET part (see FIG. 19). In the semiconductor device 100j according to the embodiment 11, n⁺-type semiconductor layers 152 are formed in the MOSFET part in a state where the n⁺-type semiconductor layers 152 which are shallower than the n-type reference concentration semiconductor layer 146 are formed on a surface of the n-type reference concentration semiconductor layer 146, and the n⁺-type semiconductor layers 152 contain an n-type impurity having a higher concentration than the n-type reference concentration semiconductor layer 146 and a lower concentration than the source region 120 (see FIG. 20A and FIG. 20B).

In the semiconductor devices 100h to 100j according to the embodiments 9 to 11, the p⁻-type diffusion regions 150a, 150b of the gate pad part are formed in the same step for forming the p⁻-type projecting diffusion regions 148 in the MOSFET part. Further, the p⁻-type diffusion region 150a of the gate pad part is formed continuously with the p⁻-type projecting diffusion region 148 in the MOSFET part (see FIG. 18 to FIG. 20B). In the semiconductor device 100j according to the embodiment 11, the p⁻-type diffusion regions 150a, 150b in the gate pad part and the p⁻-type diffusion region 164 in the gate finger part are formed in the same step for forming a guard ring 154 in a guard ring part formed around the MOSFET part (see FIG. 20A and FIG. 20B).

Figure 21A:
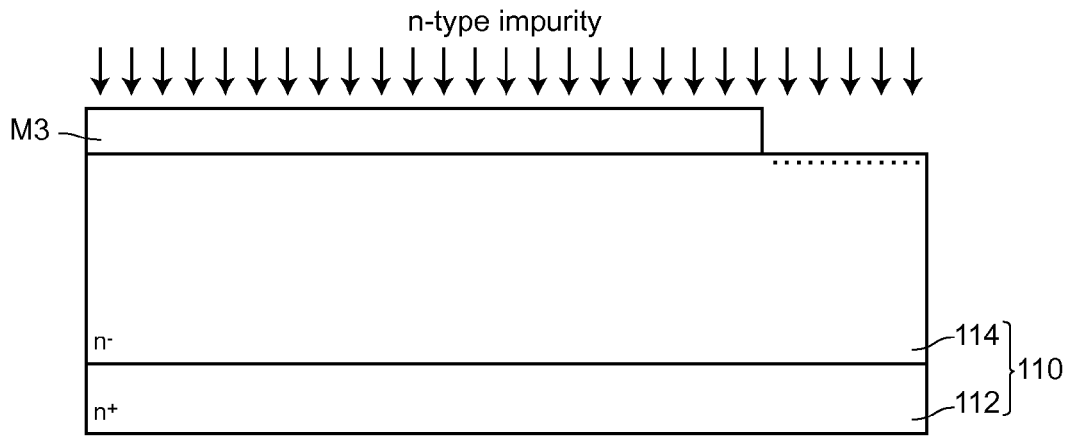
FIG. 21A to FIG. 21C are views for explaining a method of manufacturing the semiconductor device according to the eleventh embodiment.
Figure 21B:
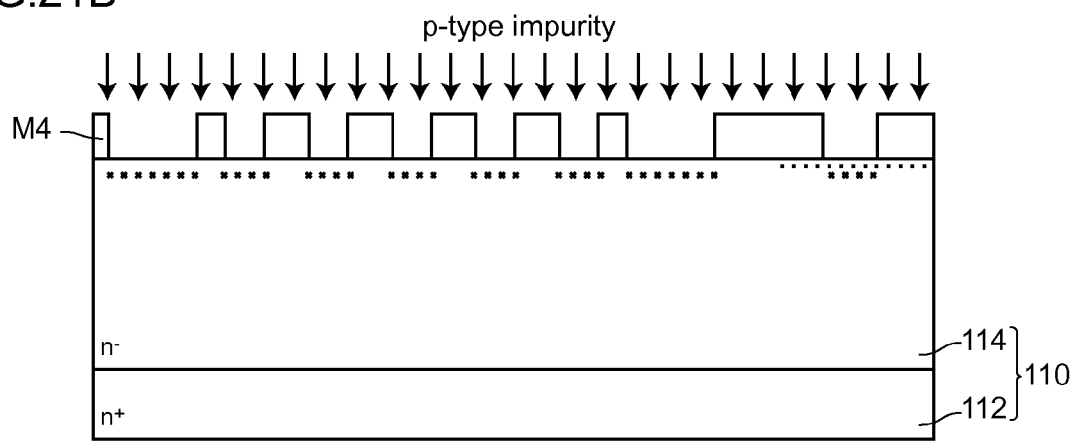
Figure 21C:
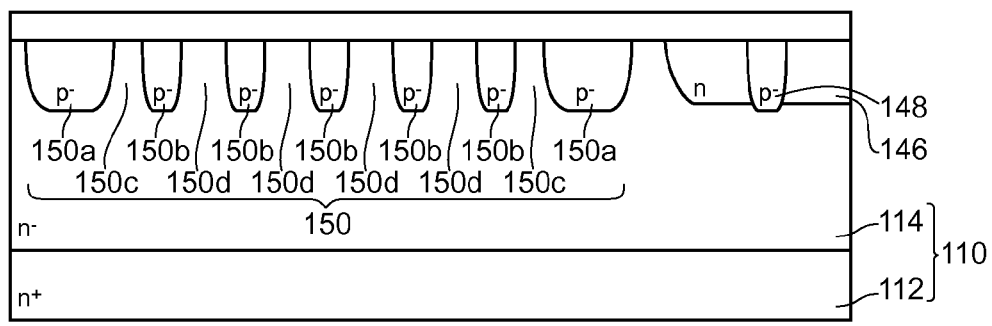

The semiconductor device 100i according to the embodiment can be manufactured by a method of manufacturing a semiconductor device described hereinafter. FIG. 21A to FIG. 21C are views for explaining a method of manufacturing a semiconductor device according to the embodiment 10. FIG. 21A to FIG. 21C are views showing respective steps.

Although the method of manufacturing the semiconductor device according to the embodiment 10 basically includes the substantially same steps as the method of manufacturing the semiconductor device according to the embodiment 1, the method of manufacturing the semiconductor device according to the embodiment 10 differs from the method of manufacturing the semiconductor device according to the embodiment 1 in the contents of steps of forming the n-type reference concentration semiconductor layer 146, the p⁻-type projecting diffusion regions 148 and the p-type impurity diffusion regions 150a, 150b. Accordingly, the method of manufacturing the semiconductor device according to the embodiment 10 is explained by mainly focusing on the steps for forming the n-type reference concentration semiconductor layer 146, the p⁻-type projecting diffusion regions 148 and the p-type impurity diffusion regions 150a, 150b.

(1) Formation of n-Type Reference Concentration Semiconductor Layer

After performing "preparation of semiconductor substrate (step)" in the same manner as the method of manufacturing the semiconductor device according to the embodiment 1, a silicon dioxide thin film M3 which has openings in regions corresponding to the n-type reference concentration semiconductor layer 146 is formed. An n-type impurity (phosphorous ion, for example) is introduced into the regions on a surface of a drift layer 114 corresponding to the n-type reference concentration semiconductor layer 146 by injecting an n-type impurity into the surface of the drift layer 114 through the silicon dioxide thin film M3 by an ion implantation method (see FIG. 21A).

(2) Formation of p⁻-Type Projecting Diffusion Region, p⁻-Type Diffusion Region and Field Insulation Layer The silicon dioxide thin film M3 is removed and, thereafter, a silicon dioxide thin film M4 which has openings in regions corresponding to the p⁻-type projecting diffusion regions 148 and the p⁻-type diffusion regions 150a, 150b is formed. A p-type impurity (boron ion, for example) is introduced into the regions on a surface of the drift layer 114 corresponding to the p⁻-type projecting diffusion regions 148 and the regions corresponding to the p⁻-type diffusion regions 150a, 150b by injecting a p-type impurity into the surface of the drift layer 114 through the silicon dioxide thin film M4 by an ion implantation method (see FIG. 21B).

Then, a heat treatment is applied to the semiconductor substrate 110 in an oxygen gas containing atmosphere thus forming the n-type reference concentration semiconductor layer 146, the p⁻-type projecting diffusion regions 148 and the p⁻-type diffusion regions 150a, 150b (see FIG. 21C). A forming depth of the p⁻-type projecting diffusion region 148 and a forming depth of the p⁻-type diffusion regions 150a, 150b are set to 6.0 μm to 8.0 μm, and an impurity concentration in the p⁻-type projecting diffusion region 148 and an impurity concentration in the p⁻-type diffusion regions 150a, 150b are set to $1 \times 10^{17}$ cm⁻³ to $3 \times 10^{18}$ cm³ respectively. At this stage of operation, a surface of the drift layer 114 is thermally oxidized so that a field insulation layer 134 is formed. A thickness of the field insulation layer 134 is set to 450 nm, for example.

Then, in the substantially same manner as the method of manufacturing the semiconductor device according to the embodiment 1, the respective succeeding steps, that is, "formation of gate insulation layer and gate electrode layer", "formation of base regions", "formation of source regions", "formation of source electrode layer, gate pad electrode layer and drain electrode layer" are performed. In accordance with such steps, the semiconductor device 100i according to the embodiment 11 can be manufactured.

In manufacturing the semiconductor device 100h according to the embodiment 9, at the time of performing the step "formation of n-type reference concentration semiconductor layer", an n-type impurity (phosphorous ion, for example) is injected into the surface of the drift layer 114 also in the gate pad part by an ion implantation method.

In manufacturing the semiconductor device 100j according to the embodiment 11, after performing the above-mentioned step "formation of p⁻-type projecting diffusion region, p⁻-type diffusion region and field insulation layer", an n-type impurity (phosphorous ion, for example) is introduced into the regions on a surface of the drift layer 114 where the n⁺-type semiconductor layer 152 is formed by injecting an n-type impurity into the surface of the drift layer 114 only in the region where the n⁺-type semiconductor layer 152 is to be formed by an ion implantation method. Then, an annealing treatment for activating an n-type impurity is performed by applying a heat treatment to the semiconductor substrate 110 thus forming the n⁺-type semiconductor layer 152.

Embodiment 12

Figure 22A:
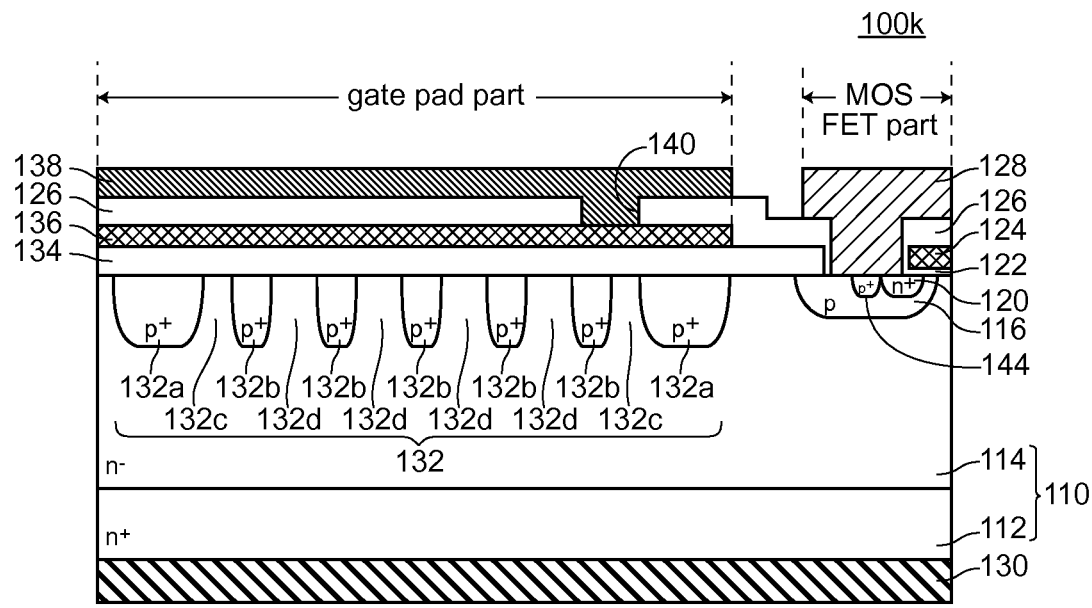
FIG. 22A and FIG. 22B are cross-sectional views of a semiconductor device 100k according to a twelfth embodiment.
Figure 22B:
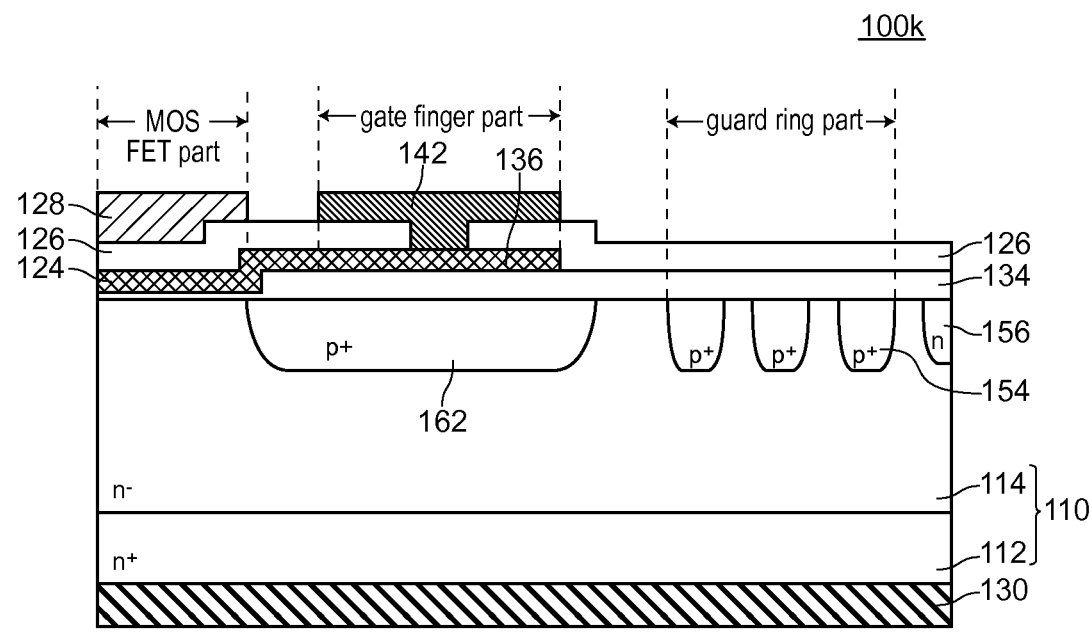

FIG. 22A and FIG. 22B are views for explaining a semiconductor device 100k according to an embodiment 12. FIG. 22A is a cross-sectional view of a gate pad part and a MOSFET part in the semiconductor device 100k, and FIG. 22B is a cross-sectional view of the MOSFET part, a gate finger part and a guard ring part in the semiconductor device 100k.

Although the semiconductor device 100k according to the embodiment 12 basically has the substantially same constitution as the semiconductor device 100 according to the embodiment 1, the semiconductor device 100k according to the embodiment 12 differs from the semiconductor device 100 according to the embodiment 1 in a step of forming p⁺-type diffusion regions. That is, in the semiconductor device 100k according to the embodiment 12, p⁺-type contact regions 144 are formed in a MOSFET part in place of the p⁺-type projecting diffusion regions 118, and p⁺-type diffusion regions 132a, 132b are formed in the same step for forming a p⁺-type diffusion region 162 and guard rings 154 which are formed around the MOSFET part (see FIG. 22A and FIG. 22B).

Embodiments 13 to 15

Figure 23:
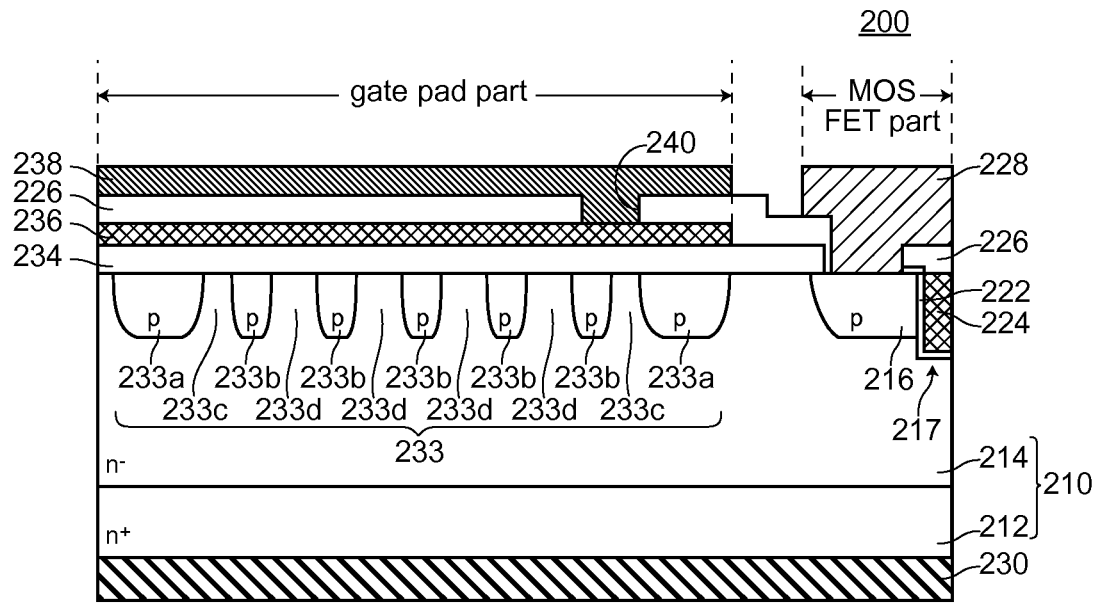
FIG. 23 is a cross-sectional view of a semiconductor device 200 according to a thirteenth embodiment.
Figure 24:
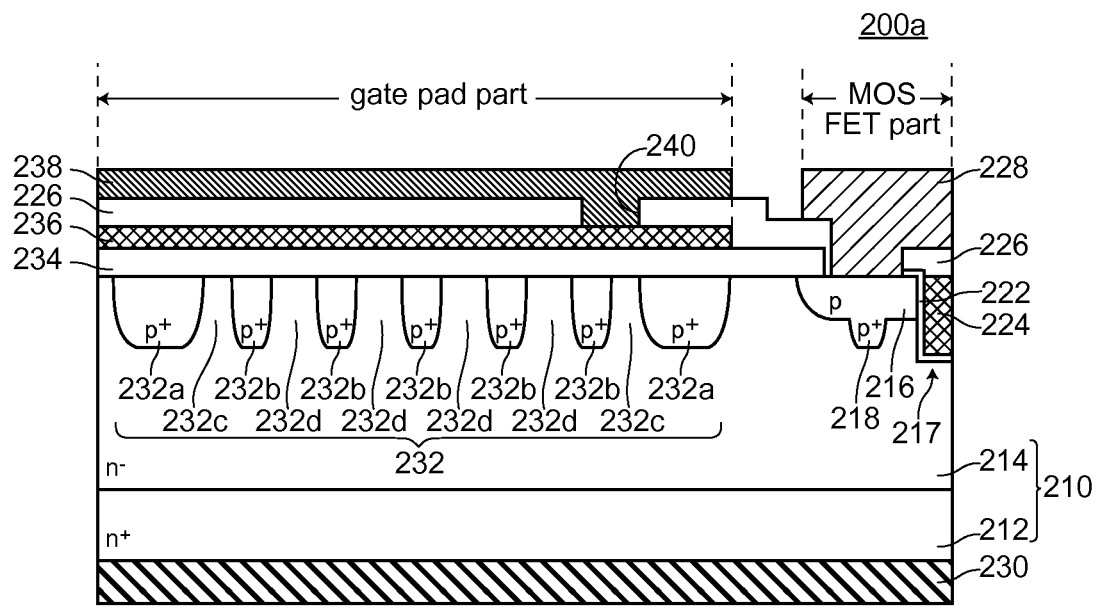
FIG. 24 is a cross-sectional view of a semiconductor device 200a according to a fourteenth embodiment.
Figure 25:
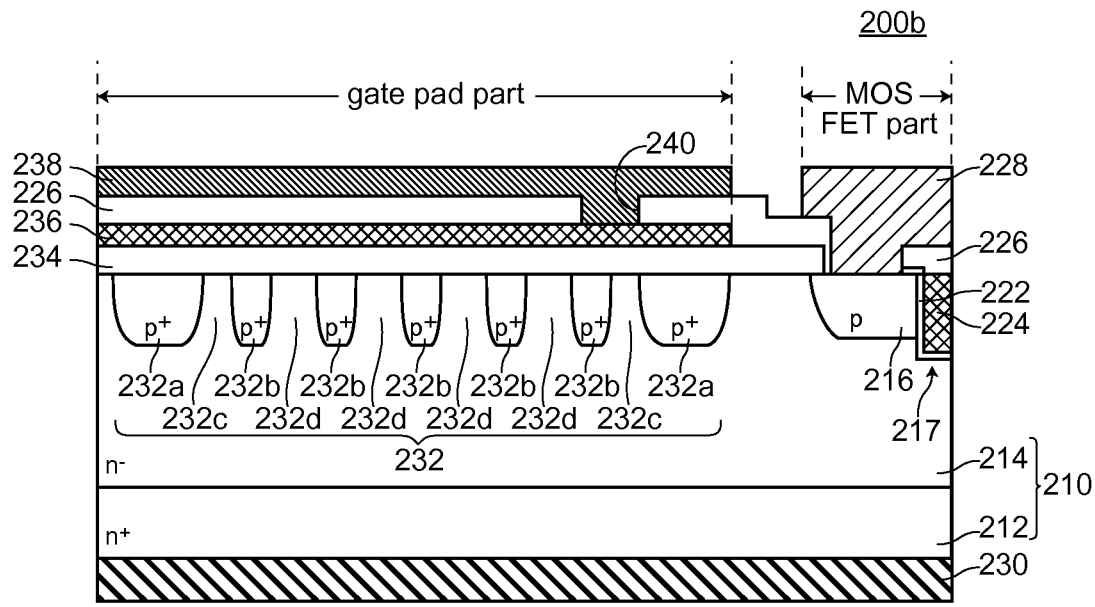
FIG. 25 is a cross-sectional view of a semiconductor device 200b according to a fifteenth embodiment.

FIG. 23 is a cross-sectional view of a semiconductor device 200 according to an embodiment 13. FIG. 24 is a cross-sectional view of a semiconductor device 200a according to an embodiment 14. FIG. 25 is a cross-sectional view of a semiconductor device 200b according to an embodiment 15.

Although the semiconductor devices 200 to 200b according to the embodiments 13 to 15 basically have the substantially same constitution as the semiconductor device 100 according to the embodiment 1, the semiconductor devices 200 to 200b according to the embodiments 13 to 15 differ from the semiconductor device 100 according to the embodiment 1 in a point that a MOSFET part does not have the planar structure but the trench structure.

That is, as shown in FIG. 23 and FIG. 25, the semiconductor devices 200 to 200b according to the embodiments 13 to 15 are semiconductor devices 200 provided with a MOSFET part and a gate pad part defined on a semiconductor substrate 210 which is formed by laminating an n⁺-type low resistance semiconductor layer 212 and an n⁻-type drift layer 214 to each other. The MOSFET part includes: the low resistance semiconductor layer 212; the drift layer 214 formed on the low resistance semiconductor layer 212; a p-type base region 216 formed on a surface of the drift layer 214; a plurality of trenches 217 formed in the base region 216 in a state where the trenches 217 reach the drift layer 214; n⁺-type source regions 220 formed such that the n⁺-type source region 220 is disposed in the inside of the base region 216 and at least a portion of the n⁺-type source region 220 is exposed on an inner peripheral surface of the trench 217; gate insulation layers 222 formed on the inner peripheral surface of the trenches 127; gate electrode layers 224 embedded in the inside of the trenches 217 with the gate insulation layers 222 interposed therebetween; and a source electrode layer 228 formed in contact with the surfaces of the source regions 220 and the base region 216 in a state where the source electrode layer 228 is insulated from the gate electrode layers 224 with an interlayer insulation film 226 interposed therebetween. The gate pad part includes: the low resistance semiconductor layer 212; the drift layer 214 formed on the low resistance semiconductor layer 212; a poly-silicon layer 236 constituting a conductor layer and formed above the drift layer 214 over the whole area of the gate pad part with a field insulation layer 234 interposed therebetween; and a gate oscillation suppressing structure (the gate oscillation suppressing structure 233 in the embodiment 13, and the gate oscillation suppressing structure 232 in the embodiments 14 and 15) formed on the surface of the drift layer 214.

The gate oscillation suppressing structure 233, 232 includes: a first diffusion region of a second conductive type (a p-type diffusion region 233a in the embodiment 13, a p⁺-type diffusion region 232a in the embodiments 14 and 15) which is disposed along an outer peripheral portion of the gate pad part in an annular manner and is electrically connected with the source electrode layer 228; and a first impurity diffusion region of a second conductive type (a p-type diffusion region 233b in the embodiment 13, a p⁺-type diffusion regions 232b in the embodiments 14 and 15) in a floating state and non-diffusion regions of a second conductive type (p-type impurity non-diffusion regions 233c, 233d in the embodiment 13, p-type impurity non-diffusion regions 232c, 232d in the embodiments 14, 15). The gate electrode layers 224 and the source regions 220 are insulated from each other with the gate insulation layer 222 interposed therebetween.

In the semiconductor device 200 according to the embodiment 13, the p-type diffusion regions 233a, 233b are formed in the same step for forming the base region 216. The p-type diffusion regions 233a are formed continuously with the base region 216 (see FIG. 23). In the semiconductor device 200a according to the embodiment 14, the p⁺-type diffusion regions 232a, 232b are formed in the same step for forming the p⁺-type projecting diffusion regions 218. The p⁺-type diffusion regions 232a are formed continuously with the p⁺-type projecting diffusion regions 218 (see FIG. 24). In the semiconductor device 200b according to the embodiment 15, the p⁺-type diffusion regions 232a, 232b are formed in the same step for forming a guard ring not shown in the drawing which is mounted at a position surrounding the MOSFET part (see FIG. 25).

Embodiment 16

Figure 26:
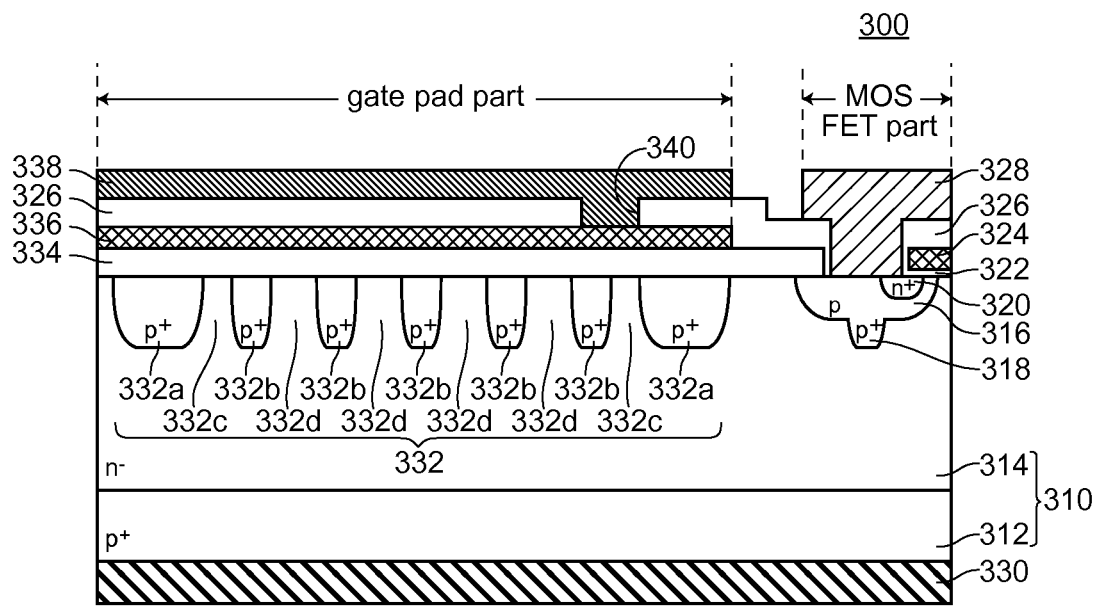
FIG. 26 is a cross-sectional view of a semiconductor device 300 according to a sixteenth embodiment.

FIG. 26 is a cross-sectional view of a semiconductor device 300 according to the embodiment 16.

Although the semiconductor device 300 according to the embodiment 16 basically has the substantially same constitution as the semiconductor device 100 according to the embodiment 1, the semiconductor device 300 according to the embodiment 16 differs from the semiconductor device 100 according to the embodiment 1 in a point that the semiconductor device is not a power MOSFET but an IGBT. That is, as shown in FIG. 26, the semiconductor device 300 according to the embodiment 16 is an IGBT, and includes a p$^+$-type low resistance semiconductor layer in place of the n$^+$-type low resistance semiconductor layer as a low resistance semiconductor layer.

Embodiment 17

Figure 27A:
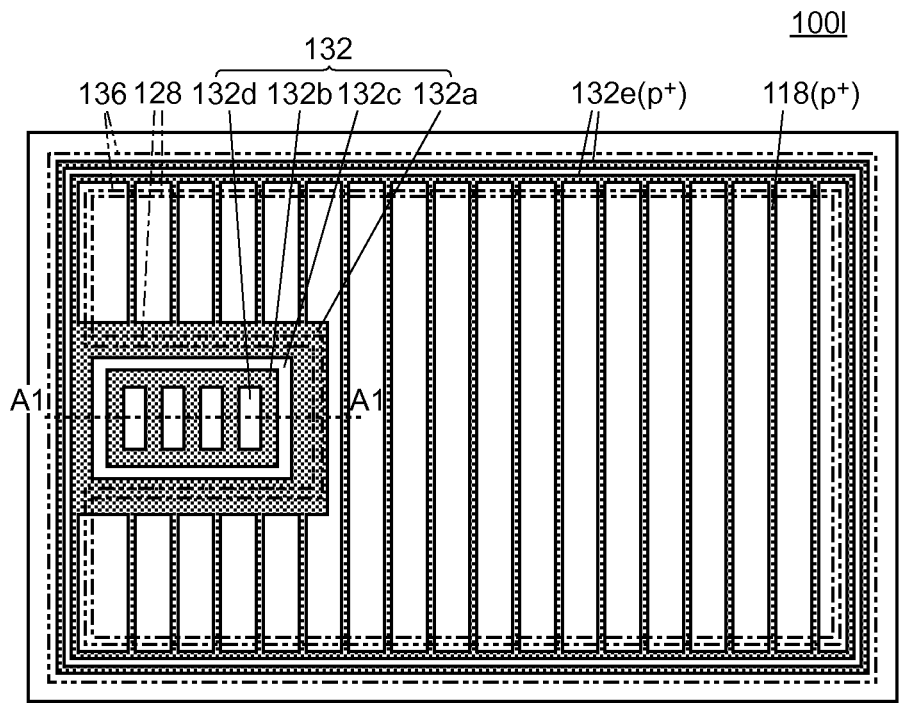
FIG. 27A and FIG. 27B are views for explaining a semiconductor device 100l according to a seventeenth embodiment.
Figure 27B:
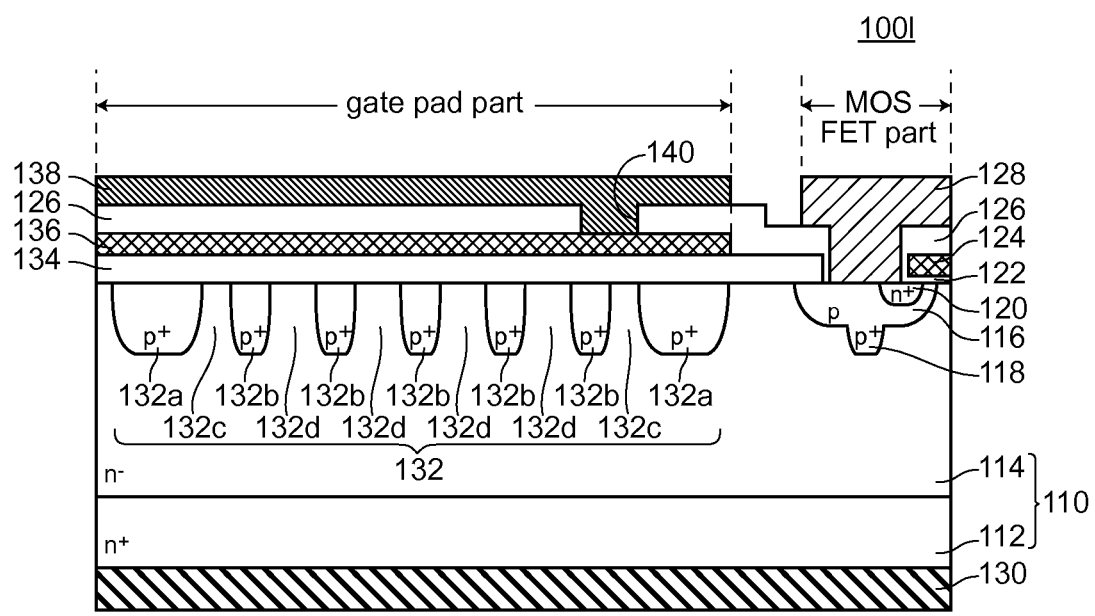

FIG. 27A and FIG. 27B are views for explaining a semiconductor device 100l according to an embodiment 17. FIG. 27A is a plan view of the semiconductor device 100l, and FIG. 27B is a cross-sectional view taken along a line A1-A1 in FIG. 27A. In FIG. 27B, symbol 130 indicates a drain electrode layer. In FIG. 27A, only a profile line (indicated by a chain line) is indicated with respect to p$^+$-type projecting diffusion regions 118, p$^+$-type diffusion regions 132a, 132b, a p-type impurity non-diffusion region 132c, 132d, a gate oscillation suppressing structure 132 and a source electrode layer 128. In FIG. 27A, the p$^+$-type projecting diffusion regions 118 and the p$^+$-type diffusion regions 132a, 132b are indicated by a dot pattern, and in FIG. 27B, the p$^+$-type projecting diffusion regions 118 and the p$^+$-type diffusion regions 132a, 132b are indicated by an outlined pattern.

Although the semiconductor device 100l according to the embodiment 17 basically has the substantially same constitution as the semiconductor device 100 according to the embodiment 1, the semiconductor device 100l according to the embodiment 17 differs from the semiconductor device 100 according to the embodiment 1 in a point that a plurality of p$^+$-type diffusion regions (corresponding to the third impurity diffusion region of a second conductive type of the present invention) are formed such that the p$^+$-type diffusion regions are formed in a spaced-apart manner from each other also in a gate finger part which connects a gate pad electrode layer 138 and a gate electrode layer 124 to each other. That is, as shown in FIG. 27A and FIG. 27B, in the semiconductor device 100l according to the embodiment 17, the plurality of p$^+$-type diffusion regions 132e are formed in a spaced-apart manner from each other on a surface of a drift layer 114 also in the gate finger part which connects the gate pad electrode layer 138 and the gate electrode layer 124 to each other. A field insulation layer 134 is formed on a surface of the drift layer 114 in the gate finger part, and a poly-silicon layer 136 is formed on the field insulation layer 134 such that the poly-silicon layer 136 extends from the poly-silicon layer 136 just below the gate pad electrode layer 138. As shown in FIG. 27A, the plurality of p$^+$-type diffusion regions 132e may be formed in a stripe shape along a long side of the gate finger part. The plurality of p$^+$-type diffusion regions 132e may be formed in a stripe shape along a short side of the gate finger part. The plurality of p$^+$-type diffusion regions 132e may be also formed in an island shape in a region of the gate finger part.

[Advantageous Effects According to the Embodiments 2 to 17]

As has been explained heretofore, the semiconductor devices 100a to 300 according to the embodiments 2 to 17 differ from the semiconductor device 100 according to the embodiment 1 in the above-mentioned respective points (the embodiments 2 to 5: the planar structure of the gate oscillation suppressing structure 132, the embodiments 6 and 7: the electrode lamination structure in the gate pad part, the embodiment 8: the step of forming impurity diffusion regions of a second conductive type, the embodiments 9 to 11: the provision of the p$^-$-type diffusion region in place of the p$^+$-type diffusion region, the embodiment 12: the step of forming the p$^+$-type diffusion region, the embodiments 13 to 15: the MOSFET part including the trench structure, the embodiment 16: the semiconductor device being an IGBT, the embodiment 17: a plurality of p$^+$-type diffusion regions being formed in a spaced-apart manner from each other also in the gate finger part). However, in the semiconductor devices 100a to 300, the gate pad part includes: the poly-silicon layer 136 which constitutes a conductor layer and is formed above a drift layer 114 over the whole area of a gate pad part with the field insulation layer 134 interposed therebetween; and the gate oscillation suppressing structure which includes a first impurity diffusion region of a second conductive type which is disposed along an outer peripheral portion of the gate pad part in an annular manner and is electrically connected with a first electrode layer (a source electrode layer or an emitter electrode layer), a second impurity diffusion region of a second conductive type in a floating state and an impurity non-diffusion region of a second conductive type which are alternately formed in the region surrounded by the first impurity diffusion region of a second conductive type. Accordingly, a gate-drain capacitance Crss in the semiconductor devices 100a to 300 according to the embodiments 2 to 17 becomes larger than the gate-drain capacitance Crss of the conventional semiconductor device.

A narrow region (impurity non-diffusion region of a second conductive type) sandwiched by the impurity diffusion regions of a second conductive type which are disposed adjacent to each other on the surface of the drift layer 114 (the first impurity diffusion region of a second conductive type and the second impurity diffusion region of a second conductive type) forms a current path. Further, in the current path, at the time of switching off the semiconductor device, a depletion layer spreads toward a drift layer side from the impurity diffusion regions of a second conductive type (the first impurity diffusion region of a second conductive type and the second impurity diffusion region of a second conductive type) and hence, a resistance having a relatively large resistance value is formed in the above-mentioned narrow region. As a result, in the substantially same manner as the semiconductor device 100 according to the embodiment 1, a large capacitance and a large resistance can be formed between the gate and the drain and hence, it is possible to suppress a gate oscillation phenomenon which occurs at the time of switching off the semiconductor device without externally connecting the capacitance and the resistance between the gate and the drain.

The semiconductor devices 100a to 300 according to the embodiments 2 to 17 are, in the gate pad part, provided with the gate oscillation suppressing structure which includes the first impurity diffusion region of a second conductive type which is disposed along an outer peripheral portion of the gate pad part and is electrically connected with the first electrode layer and the second impurity diffusion region of a second conductive type in a floating state and the impurity non-diffusion region of a second conductive type which are alternately formed in the region surrounded by the first impurity diffusion region of a second conductive type. Accordingly, a pn junction area is small and a carrier injection amount at the time of switching off the semiconductor device is also decreased. Accordingly, the semiconductor devices 100a to 300 according to the embodiments 2 to 17 have an advantage that a reverse recovery period trr becomes short and an advantage that a reverse recovery peak current IPR is decreased. Further, according to the semiconductor devices 100a to 300 according to the embodiments 2 to 17, the second impurity diffusion region of a second conductive type in the gate pad part is in a floating state and hence, compared to the case where the second impurity diffusion region of a second conductive type in the gate pad part is not in a floating state, an area of the second conductive type impurity diffusion region where the impurity diffusion region functions as a body diode is decreased, and a carrier injection amount at the time of switching off the semiconductor device is also decreased. As a result, a reverse recovery period trr becomes shorter and hence, a di/dt resistance can be increased.

In addition to the above-mentioned advantageous effects, the semiconductor devices 100h to 100j according to the embodiments 9 to 11 and the semiconductor device 100l according to the embodiment 17 have the following advantageous effects.

That is, in the semiconductor devices 100h to 100j according to the embodiments 9 to 11, the n-type reference concentration semiconductor layer 146 is formed in the MOSFET part in a state where the n-type reference concentration semiconductor layer 146 which is shallower than the base region 116 is disposed between the base regions 116 arranged adjacent to each other and contains an n-type impurity having a higher concentration than the drift layer 114 and a lower concentration than the source region 120. Accordingly, the semiconductor device can be micronized by making a distance between the base regions narrower than the conventional semiconductor device. Even when the distance between the base regions is made narrower than the conventional semiconductor device, there is no possibility that the ON resistance of the semiconductor device is increased. Accordingly, the semiconductor devices 100h to 100j according to the embodiments 9 to 11 become semiconductor devices which can be micronized without increasing an ON resistance of the semiconductor device and have a favorable high breakdown strength.

In the semiconductor device 100j according to the embodiment 11, the $n^+$-type semiconductor layer 152 is formed in the MOSFET part in a state where the $n^+$-type semiconductor layer 152 which is shallower than the n-type reference concentration semiconductor layers 146 is formed over a surface of the n-type reference concentration semiconductor layer 146 and contains an n-type impurity having a higher concentration than the n-type reference concentration semiconductor layers 146 and a lower concentration than the source region 120. Accordingly, an ON resistance of the semiconductor device can bee decreased, and a gate oscillation phenomenon at the time of switching off the semiconductor device can be suppressed more effectively.

In the semiconductor device 100i according to the embodiment 10, the n-type reference concentration semiconductor layer 146 is not formed in the gate pad part and hence, there is no possibility that a resistance value of a resistance of the $p^-$-type non-diffusion regions 150c, 150d is excessively decreased.

In the semiconductor device 100l according to the embodiment 17, also in the gate finger part which connects the gate pad electrode layer 138 and the gate electrode layer 124 to each other, the poly-silicon layer 136 which constitutes a conductor layer is formed above the drift layer 114 with the field insulation layer 134 interposed therebetween, and the plurality of $p^+$-type diffusion regions 132a which are formed in a spaced-apart manner from each other are formed on a surface of the drift layer 114. Accordingly, the semiconductor devices 100l according to the embodiment 17 can acquire an advantageous effect that a gate-drain capacitance Crss of the semiconductor device 100l according to the embodiment 17 becomes larger than the gate-drain capacitance Crss of the semiconductor device 100 according to the embodiment 1.

TEST EXAMPLES

In realizing the semiconductor devices 100 to 300 according to the embodiments 1 to 17 having the above-mentioned constitutions respectively, results obtained by following test examples 1 and 2 are used as references.

Test Example 1

The test example 1 is a test example which is performed so as to clarify that a large capacitance is formed between the gate and the drain in the semiconductor device of the present invention.

Figure 28A:
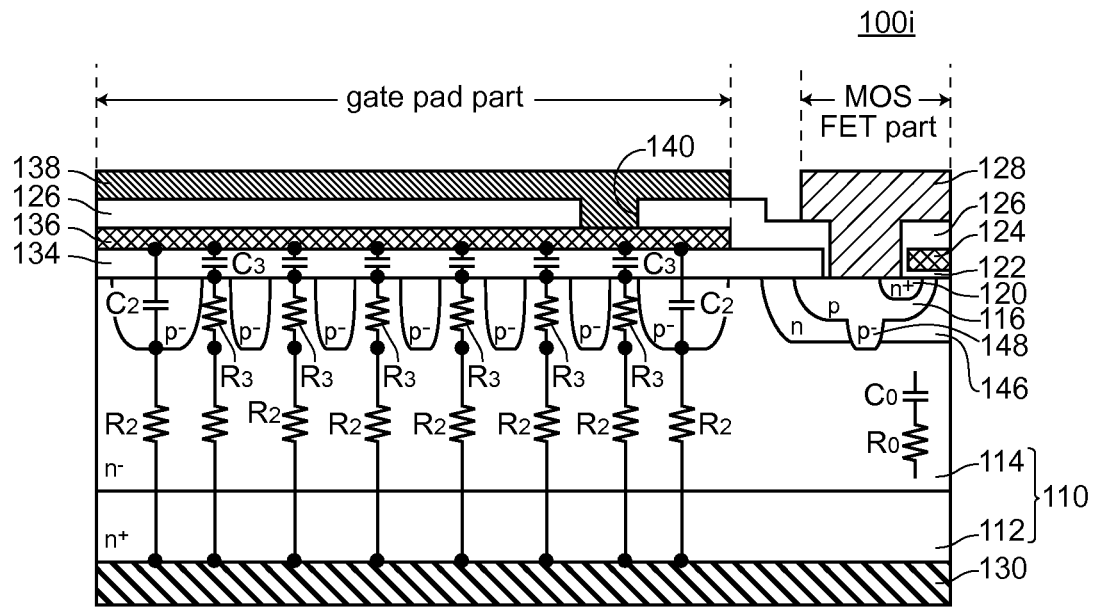
FIG. 28A and FIG. 28B are cross-sectional views of the semiconductor devices 100i, 100C used for test examples 1 and 2.
Figure 28B:
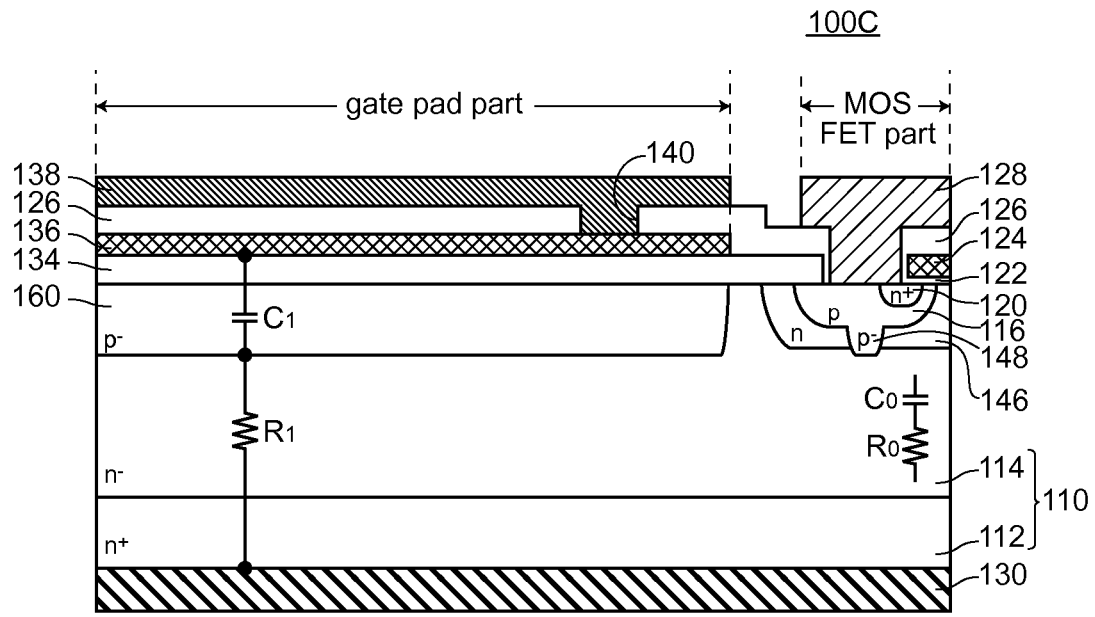
Figures 29A, 29B:
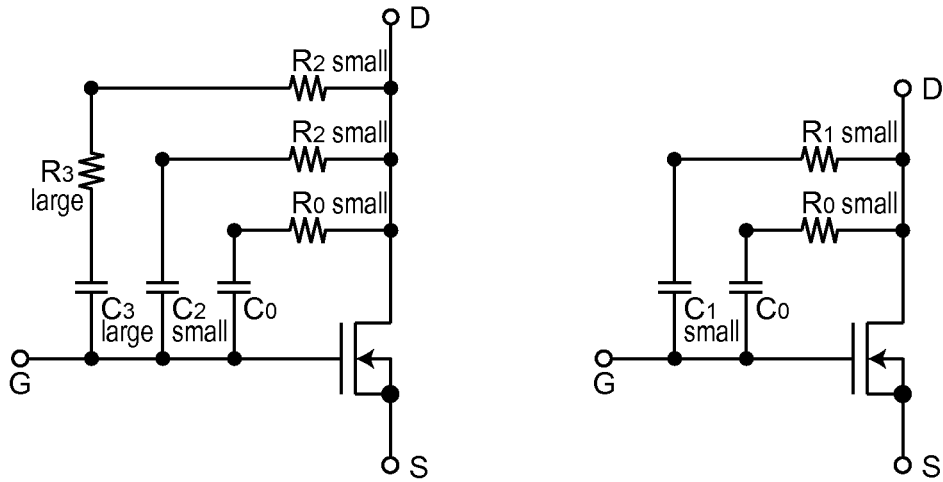
FIG. 29A to FIG. 29C are views for explaining an evaluation result in the test example 1.
Figure 29C:
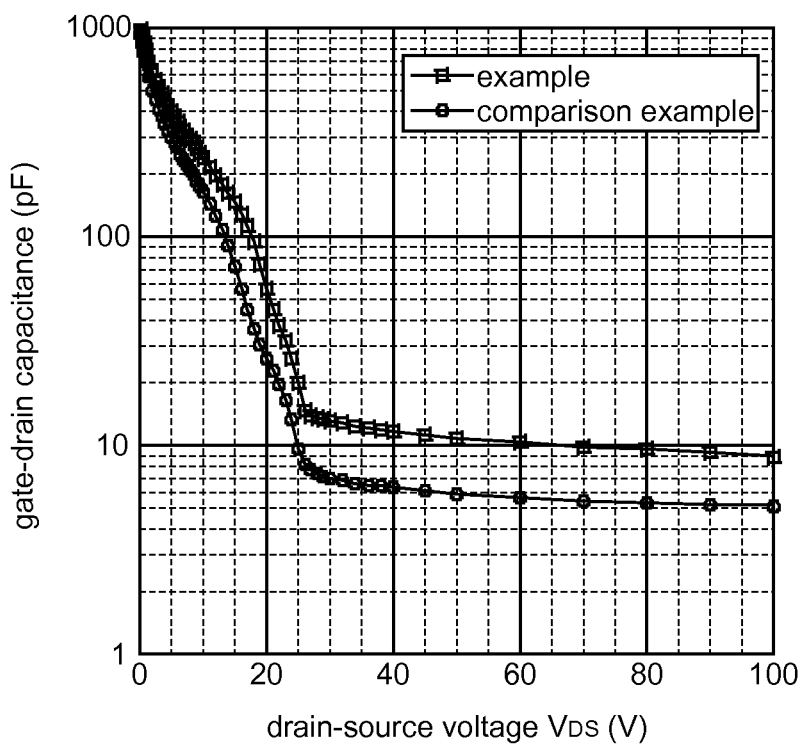

FIG. 28A and FIG. 28B are cross-sectional views of semiconductor devices 100i, 100C which are used in the test examples 1and 2. FIG. 29A to FIG. 29C are views for explaining an evaluation result of the test example 1. FIG. 29A is a view showing an equivalent circuit of the semiconductor device 100i. FIG. 29B is a view showing an equivalent circuit of the semiconductor device 100C. FIG. 29C is a view showing measurement results of the semiconductor device 100i and the semiconductor device 100C. Although the semiconductor devices 100i, 100C shown in FIG. 28A and FIG. 28B have the slightly different constitution from the constitution of the semiconductor device 100 shown in FIG. 2A and FIG. 2B or the semiconductor device 100A shown in FIG. 3A and FIG. 3B, corresponding resistances and capacitances are indicated by the same symbols ($C_0$, $C_1$, $C_2$, $C_3$, $R_0$, $R_1$, $R_2$, $R_3$) to facilitate the understanding of the test examples 1, 2.

1. Constitutional Conditions on Semiconductor Device
(1) Semiconductor Device According to Embodiment A semiconductor device having the substantially same constitution as the semiconductor device 100i according to the embodiment 10 is employed without modification as the semiconductor device 100i according to the embodiment (see FIG. 28A).

(2) Semiconductor Device According to Comparison Example

A semiconductor device which has the substantially same constitution as the semiconductor device 100i according to the embodiment 10 but includes a well-like $p^-$-type diffusion region 160 formed on a surface of the drift layer 114 over the whole area of the gate pad part in place of the above-mentioned gate oscillation suppressing structure 150 is employed as the semiconductor device 100C of a comparison example 3 (see FIG. 28B).

2. Method of Test

A test is performed with respect to the above-mentioned semiconductor device 100i according to the above-mentioned embodiment and the semiconductor device 100C according to the comparison example 3 by measuring a gate-drain capacitance Crss using a capacitance measurement device while changing a drain-source voltage $V_{DS}$.

3. Result of Test

The measurement result is shown in FIG. 29C. It is clearly understood from FIG. 29C that a larger gate-drain capacitance Crss is formed in the semiconductor device of the present invention (the semiconductor device 100*i* according to the embodiment) than the conventional semiconductor device (semiconductor device 100C according to the comparison example 3).

Test Example 2

The test example 2 is a test example which is performed so as to clarify that a gate oscillation phenomenon at the time of switching off the semiconductor device can be suppressed more efficiently in the semiconductor device of the present invention than in the conventional semiconductor device.

1. Constitutional Condition of Semiconductor Device (1) Semiconductor Device According to Embodiment "the semiconductor device 100*i* according to embodiment" which is used in the test example 1 is also used as the semiconductor device 100*i* according to embodiment in the test example 2 as it is.

(2) Semiconductor Device According to Comparison Example

"the semiconductor device 100C according to the comparison example 3" which is used in the test example 1 is also used as "the semiconductor device 100C according to the comparison example 3" in the test example 2 as it is.

2. Method of Test

Figure 30A:
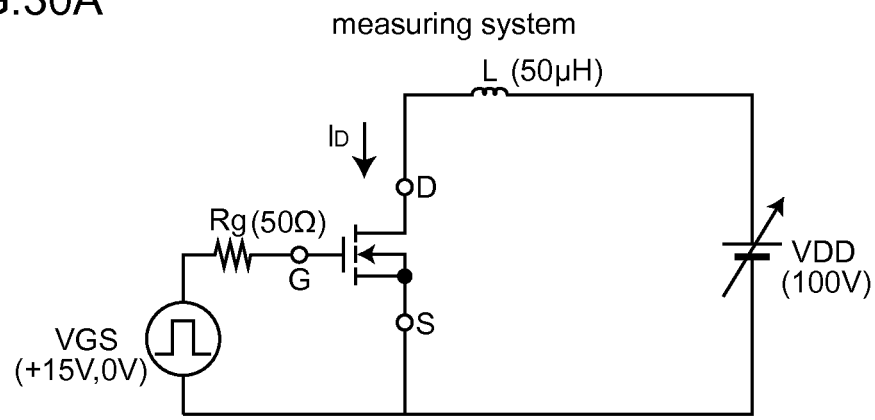
FIG. 30A to FIG. 30C are views for explaining an evaluation method and an evaluation result in the test example 2.
Figure 30B:
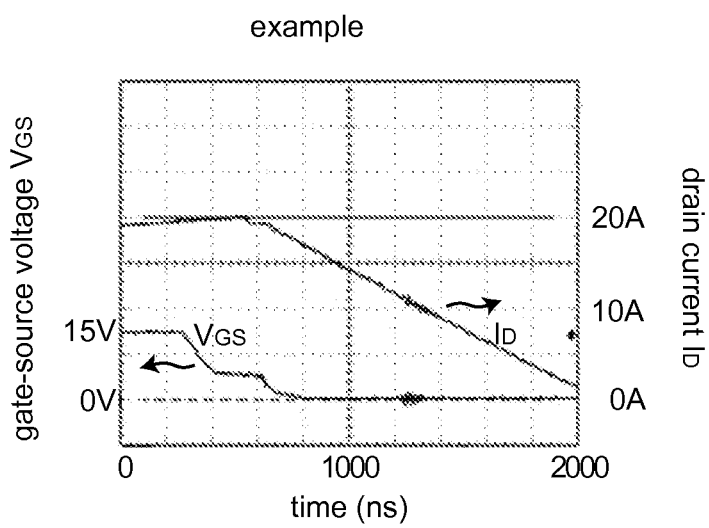
Figure 30C:
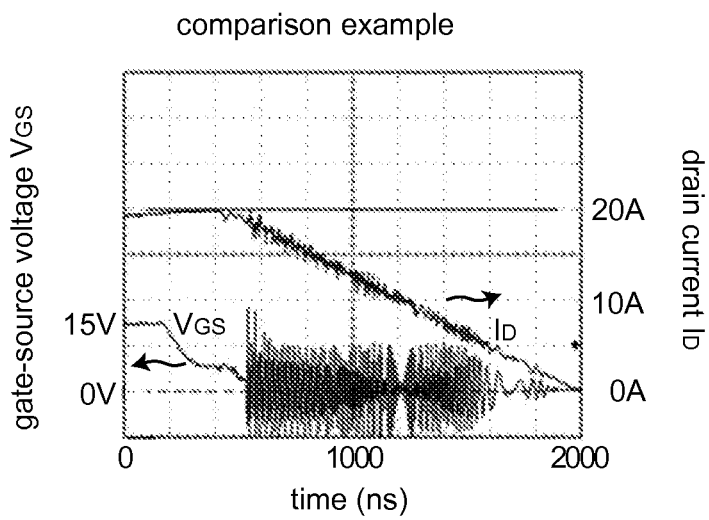

FIG. 30A to FIG. 30C are views for explaining an evaluation method and an evaluation result in the test example 2. FIG. 30A is a view showing a measurement system used in the test example 2, FIG. 30B is a view showing a response waveform at the time of switching off the semiconductor device in the semiconductor device 100*i* according to the embodiment, and FIG. 30C is a view showing a response waveform at the time of switching off the semiconductor device in the semiconductor device 100C according to the comparison example 3.

The test is performed by measuring a gate-source voltage $V_{GS}$ and a drain current $I_D$ at the time of switching off the semiconductor device using the measurement system shown in FIG. 30A.

3. Result of Test

The result of the test is shown in FIG. 30B and FIG. 30C. It is clearly understood from FIG. 30B and FIG. 30C that a gate oscillation phenomenon at the time of switching off the semiconductor device can be suppressed more efficiently in the semiconductor device of the present invention (semiconductor device 100*i* according to the embodiment) than in the third conventional semiconductor device 900 (semiconductor device 100C according to the comparison example 3).

Although the present invention has been explained based on the above-mentioned embodiments heretofore, the present invention is not limited to the above-mentioned embodiments. The present invention can be carried out in various modes without departing from the gist of the present invention, and the following modifications are conceivable, for example.

(1) In the above-mentioned respective embodiments, the present invention is explained by taking the case where the n type is the first conductive type and the p type is the second conductive type. However, the present invention is not limited to such a case. For example, the present invention is also applicable to the case where the p type is the first conductive type and the n type is the second conductive type.

Figure 31:
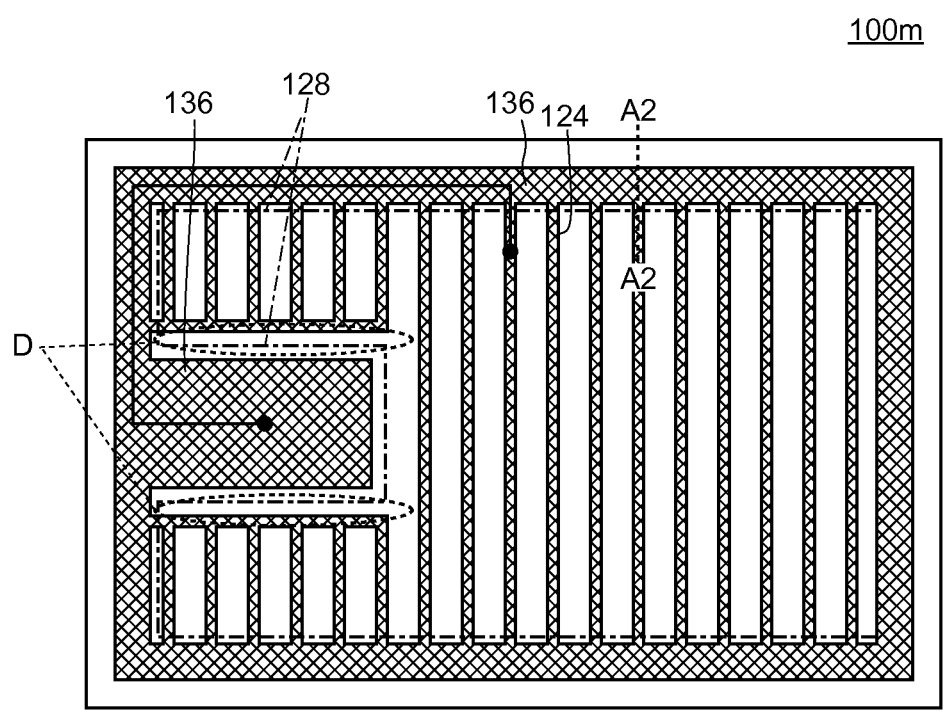
FIG. 31 is a plan view of a semiconductor device 100m according to a modification.

(2) The present invention is not limited to the layout or the arrangement of the parts shown in FIG. 2A provided that the conductor layer (the poly-silicon layer 136) is electrically connected with the gate electrode layer 124 via the gate finger part and no portion of the conductor layer is directly connected with the gate electrode layer 124 without interposing the gate finger part. FIG. 31 is a plan view of a semiconductor device 100*m* according to a modification. In FIG. 31, in the same manner as in the FIG. 2A, only a profile line (indicated by a chain line) is indicated with respect to a poly-silicon layer 136 and a source electrode layer 128. The conductor layer (the poly-silicon layer 136) may be arranged as shown in FIG. 31, for example.

What is claimed is:

1. A semiconductor device provided with an active element part and a gate pad part defined on a semiconductor substrate which is formed by laminating a low resistance semiconductor layer of a first conductive type or a second conductive type and a drift layer of the first conductive type to each other, wherein the active element part includes:

the low resistance semiconductor layer;

the drift layer formed on the low resistance semiconductor layer;

a base region of the second conductive type formed on a surface of the drift layer;

a high concentration impurity diffusion region of the first conductive type formed on a surface of the base region;

a gate electrode layer formed on the base region sandwiched between the high concentration impurity diffusion region and the drift layer with a gate insulation layer interposed therebetween; and a first electrode layer formed in contact with a surface of the high concentration impurity diffusion region and the surface of the base region in a state where the first electrode layer is insulated from the gate electrode layer with an interlayer insulation layer interposed therebetween, and the gate pad part includes:

the low resistance semiconductor layer;

the drift layer formed on the low resistance semiconductor layer;

a conductor layer formed above the drift layer over a whole area of the gate pad part with a field insulation layer interposed therebetween; and a gate oscillation suppressing structure formed on the surface of the drift layer, wherein the gate oscillation suppressing structure includes:

a first impurity diffusion region of the second conductive type which is disposed along an outer peripheral portion of the gate pad part and is electrically connected with the first electrode layer, and a second impurity diffusion region of the second conductive type in a floating state and an impurity non-diffusion region of the second conductive type which are alternately formed in a region surrounded by the first impurity diffusion region of the second conductive type.

2. The semiconductor device according to claim 1, wherein the field insulation layer has a larger thickness than the gate insulation layer.

3. The semiconductor device according to claim 1, wherein the conductor layer is formed of a poly-silicon layer formed between the field insulation layer and a gate pad electrode layer formed over the field insulation layer.

4. The semiconductor device according to claim 1, wherein the conductor layer is a gate pad electrode layer formed over the field insulation layer.

5. The semiconductor device according to claim 3, wherein the conductor layer is electrically connected with the gate electrode layer via a gate finger part which connects the gate pad electrode layer and the gate electrode layer to each other, and no portion of the conductor layer is directly connected with the gate electrode layer without interposing the gate finger part therebetween.

6. The semiconductor device according to claim 1, wherein a cell arranged adjacent to the gate pad part has a structure where the high concentration impurity diffusion region on a gate pad part side is eliminated.

7. The semiconductor device according to claim 1, wherein the active element part further includes a high concentration projecting diffusion region of the second conductive type which is formed in a downwardly projecting manner from the base region, and
the first impurity diffusion region of the second conductive type and the second impurity diffusion region of the second conductive type are formed in a same step for forming the high concentration projecting diffusion region, and the first impurity diffusion region of the second conductive type is formed continuously with the high concentration projecting diffusion region.

8. The semiconductor device according to claim 1, wherein the first impurity diffusion region of the second conductive type and the second impurity diffusion region of the second conductive type are formed in a same step for forming the base region, and the first impurity diffusion region of the second conductive type is formed continuously with the base region.

9. The semiconductor device according to claim 1, wherein the active element part further includes a low concentration projecting diffusion region of the second conductive type which is formed in a downwardly projecting manner from the base region, and
the first impurity diffusion region of the second conductive type and the second impurity diffusion region of the second conductive type are formed in a same step for forming the low concentration projecting diffusion region, and the first impurity diffusion region of the second conductive type is formed continuously with the low concentration projecting diffusion region.

10. The semiconductor device according to claim 1, wherein the first impurity diffusion region of the second conductive type and the second impurity diffusion region of the second conductive type are formed in a same step for forming a guard ring which is formed around the active element part.

11. The semiconductor device according to claim 1, wherein the second impurity diffusion region of the second conductive type is formed in a region surrounded by the first impurity diffusion region of the second conductive type, and
the impurity non-diffusion region of the second conductive type is formed in a stripe shape or an island shape inside the second impurity diffusion region of the second conductive type.

12. The semiconductor device according to claim 1, wherein the impurity non-diffusion region of the second conductive type is formed in a region surrounded by the first impurity diffusion region of the second conductive type, and
the second impurity diffusion region of the second conductive type is formed in a stripe shape or an island shape inside the impurity non-diffusion region of the second conductive type.

13. The semiconductor device according to claim 1, wherein the first impurity diffusion region of the second conductive type and the second impurity diffusion region of the second conductive type do not have a semiconductor region of the first conductive type therein.

14. The semiconductor device according to claim 3, wherein a gate finger part which connects the gate pad electrode layer and the gate electrode layer also has a gate oscillation suppressing structure where a third impurity diffusion region of the second conductive type electrically connected with the first electrode layer and a second impurity non-diffusion region of the second conductive type are alternately formed on the surface of the drift layer.

15. A semiconductor device provided with an active element part and a gate pad part defined on a semiconductor substrate which is formed by laminating a low resistance semiconductor layer of a first conductive type or a second conductive type and a drift layer of the first conductive type to each other, wherein
the active element part includes:
the low resistance semiconductor layer;
the drift layer formed on the low resistance semiconductor layer;
a base region of the second conductive type formed on a surface of the drift layer;
a plurality of trenches formed such that the trenches open at the base region and reach the drift layer;
a high concentration impurity diffusion region of the first conductive type arranged within the base region, exposing at least a portion thereof on inner peripheral surfaces of the trenches; a gate insulation layer formed on the inner peripheral surfaces of the trenches;
a gate electrode layer embedded into the inside of the trenches with the gate insulation layer interposed therebetween; and
a first electrode layer formed in contact with a surface of the high concentration impurity diffusion region and a surface of the base region in a state where the first electrode layer is insulated from the gate electrode layer with an interlayer insulation layer interposed therebetween, and
the gate pad part includes:
the low resistance semiconductor layer; the drift layer formed on the low resistance semiconductor layer;
a conductor layer formed above the drift layer over a whole area of the gate pad part with a field insulation layer interposed therebetween; and
a gate oscillation suppressing structure formed on the surface of the drift layer, wherein
the gate oscillation suppressing structure includes:
a first impurity diffusion region of the second conductive type which is disposed along an outer peripheral portion of the gate pad part and is electrically connected with the first electrode layer and a second impurity diffusion region of the second conductive type in a floating state and an impurity non-diffusion region of the second conductive type which are alternately formed in a region surrounded by the first impurity diffusion region of the second conductive type.

16. The semiconductor device according to claim 15, wherein a trench arranged adjacent to the gate pad part has a structure where the high concentration impurity diffusion region on a gate pad part side is eliminated.

17. The semiconductor device according to claim 15, wherein the first impurity diffusion region of the second conductive type and the second impurity diffusion region of the second conductive type are formed in a same step for forming the base region, and the first impurity diffusion region of the second conductive type is formed continuously with the base region.

18. The semiconductor device according to claim 15, wherein the active element part further includes a high concentration projecting diffusion region of the second conductive type which is formed in a downwardly projecting manner from the base region, and the first impurity diffusion region of the second conductive type and the second impurity diffusion region of the second conductive type are formed in a same step for forming the high concentration projecting diffusion region, and the first impurity diffusion region of the second conductive type is formed continuously with the high concentration projecting diffusion region.

* * * * *